(12) United States Patent
Hanawa et al.

(10) Patent No.: US 7,767,561 B2
(45) Date of Patent: *Aug. 3, 2010

(54) PLASMA IMMERSION ION IMPLANTATION REACTOR HAVING AN ION SHOWER GRID

(75) Inventors: Hiroji Hanawa, Sunnyvale, CA (US); Tsutomu Tanaka, Santa Clara, CA (US); Kenneth S. Collins, San Jose, CA (US); Amir Al-Bayati, San Jose, CA (US); Kartik Ramaswamy, Santa Clara, CA (US); Andrew Nguyen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1230 days.

This patent is subject to a terminal disclaimer.

(21) Appl. No.: 10/896,113

(22) Filed: Jul. 20, 2004

(65) Prior Publication Data

US 2006/0019477 A1    Jan. 26, 2006

(51) Int. Cl.
*H01L 21/425* (2006.01)
(52) U.S. Cl. ............... 438/514; 438/516; 257/E21.057
(58) Field of Classification Search ................... None
See application file for complete search history.

(56) References Cited

U.S. PATENT DOCUMENTS

| | | | |
|---|---|---|---|
| 2,344,138 A | 3/1944 | Drummond | 117/107 |
| 3,109,100 A | 10/1963 | Gecewicz | 250/219 |
| 3,576,685 A | 4/1971 | Swann et al. | 148/187 |
| 3,904,505 A * | 9/1975 | Aisenberg | 204/298.04 |
| 3,907,616 A | 9/1975 | Wiemer | 148/188 |
| 3,970,892 A | 7/1976 | Wakalopulos | 315/111.31 |
| 4,116,791 A | 9/1978 | Zega | 204/192 |
| 4,119,881 A | 10/1978 | Calderon | 313/360.1 |
| 4,157,471 A | 6/1979 | Mlekodaj | 250/432 R |
| 4,158,589 A | 6/1979 | Keller et al. | 156/345.46 |
| 4,351,712 A | 9/1982 | Cuomo et al. | 204/192.34 |
| 4,382,099 A | 5/1983 | Legge et al. | 427/34 |

(Continued)

FOREIGN PATENT DOCUMENTS

EP    0 546 852 A1    6/1993

(Continued)

OTHER PUBLICATIONS

Hu, C.-K., et al., "A process for improved Al(cu) reactive ion etching", Journal of Vacuum Science and Technology, May 1, 1989, pp. 682-685, vol. 7, No. 3, American Institute of Physics, New York, U.S.

(Continued)

*Primary Examiner*—Jarrett J Stark
(74) *Attorney, Agent, or Firm*—Law Office of Robert M. Wallace

(57) ABSTRACT

A plasma immersion ion implantation process for implanting a selected species at a desired ion implantation depth profile in a workpiece is carried out in a reactor chamber with an ion shower grid that divides the chamber into an upper ion generation region and a lower process region, the ion shower grid having plural elongate orifices oriented in a non-parallel direction relative to a surface plane of the ion shower grid.

67 Claims, 35 Drawing Sheets

U.S. PATENT DOCUMENTS

| | | | |
|---|---|---|---|
| 4,385,946 A | 5/1983 | Finegan et al. | 148/175 |
| 4,431,946 A | 2/1984 | O'Laughlin | 315/150 |
| 4,434,036 A | 2/1984 | Hoerschelmann et al. | 204/164 |
| 4,439,684 A | 3/1984 | Hemmerich et al. | 250/396 R |
| 4,443,488 A | 4/1984 | Little et al. | 204/157.44 |
| 4,450,031 A * | 5/1984 | Ono et al. | 156/345.39 |
| 4,465,529 A | 8/1984 | Arima et al. | 148/188 |
| 4,478,677 A | 10/1984 | Chen et al. | 156/635 |
| 4,481,229 A | 11/1984 | Suzuki et al. | 427/38 |
| 4,490,210 A | 12/1984 | Chen et al. | 156/643 |
| 4,490,211 A | 12/1984 | Chen et al. | 156/643 |
| 4,493,745 A | 1/1985 | Chen et al. | 156/626 |
| 4,500,563 A | 2/1985 | Ellenberger et al. | 427/38 |
| 4,511,430 A | 4/1985 | Chen et al. | 156/643 |
| 4,521,441 A | 6/1985 | Flowers | 427/38 |
| 4,523,971 A | 6/1985 | Cuomo et al. | 156/345.39 |
| 4,526,673 A | 7/1985 | Little et al. | 204/192.35 |
| 4,534,816 A | 8/1985 | Chen et al. | 156/345 |
| 4,539,217 A | 9/1985 | Farley | 427/10 |
| 4,565,588 A | 1/1986 | Seki et al. | 148/186 |
| 4,584,026 A | 4/1986 | Wu et al. | 148/1.5 |
| 4,587,430 A * | 5/1986 | Adler | 250/423 R |
| 4,602,981 A | 7/1986 | Chen et al. | 156/627 |
| 4,671,849 A | 6/1987 | Chen et al. | 438/713 |
| 4,698,104 A | 10/1987 | Barker et al. | 437/141 |
| 4,716,491 A | 12/1987 | Ohno et al. | 361/230 |
| 4,741,799 A | 5/1988 | Chen et al. | 438/695 |
| 4,749,911 A | 6/1988 | Wakalopulos et al. | 315/111.21 |
| 4,755,722 A | 7/1988 | Wakalopulos | 315/111.31 |
| 4,756,794 A | 7/1988 | Yoder | 216/62 |
| 4,764,394 A | 8/1988 | Conrad | 427/38 |
| 4,771,230 A | 9/1988 | Zeh | 324/459 |
| 4,778,561 A | 10/1988 | Ghanbari | 156/643 |
| 4,786,844 A | 11/1988 | Farrell et al. | 315/111.21 |
| 4,792,378 A | 12/1988 | Rose et al. | 438/706 |
| 4,824,544 A | 4/1989 | Mikalesen et al. | 204/298.06 |
| 4,853,102 A | 8/1989 | Tateishi et al. | 204/298.06 |
| 4,867,859 A | 9/1989 | Harada et al. | 304/298 |
| 4,871,421 A | 10/1989 | Ogle et al. | 156/643 |
| 4,877,479 A | 10/1989 | McNeil et al. | 216/60 |
| 4,892,753 A | 1/1990 | Wang et al. | 427/38 |
| 4,901,667 A | 2/1990 | Suzuki et al. | 118/719 |
| 4,912,065 A | 3/1990 | Mizuno et al. | 437/141 |
| 4,931,158 A | 6/1990 | Bunshah et al. | 204/192.29 |
| 4,937,205 A | 6/1990 | Nakayama et al. | 437/165 |
| 4,948,458 A | 8/1990 | Ogle | 156/643 |
| 5,015,331 A | 5/1991 | Powell | 438/723 |
| 5,040,046 A | 8/1991 | Chhabra et al. | 357/54 |
| 5,047,131 A | 9/1991 | Wolfe et al. | 204/192.23 |
| 5,061,838 A | 10/1991 | Lane et al. | 219/121.59 |
| 5,074,456 A | 12/1991 | Degner et al. | 228/121 |
| 5,106,827 A | 4/1992 | Borden et al. | 505/1 |
| 5,107,201 A | 4/1992 | Ogle | 324/72.5 |
| 5,134,301 A * | 7/1992 | Kamata et al. | 250/492.2 |
| 5,270,250 A | 12/1993 | Murai et al. | 437/165 |
| 5,277,751 A | 1/1994 | Ogle | 156/643 |
| 5,279,669 A | 1/1994 | Lee | 118/723 |
| 5,284,544 A | 2/1994 | Mizutani et al. | 156/345.38 |
| 5,286,331 A | 2/1994 | Chen et al. | 156/345 |
| 5,288,650 A | 2/1994 | Sandow | 437/24 |
| 5,290,358 A | 3/1994 | Rubloff et al. | 118/715 |
| 5,290,382 A | 3/1994 | Zarowin et al. | 156/345 |
| 5,312,778 A | 5/1994 | Collins et al. | 437/225 |
| 5,344,352 A | 9/1994 | Horne et al. | 445/24 |
| 5,354,381 A | 10/1994 | Sheng | 118/723 |
| 5,403,459 A | 4/1995 | Guo | 204/192.32 |
| 5,423,940 A | 6/1995 | Chen et al. | 216/66 |
| 5,423,945 A | 6/1995 | Marks et al. | 156/662.1 |
| 5,431,799 A | 7/1995 | Mosley et al. | 204/298.06 |
| 5,435,881 A | 7/1995 | Ogle | 156/345 |
| 5,468,955 A | 11/1995 | Chen et al. | 250/251 |
| 5,505,780 A | 4/1996 | Dalvie et al. | 118/723 |
| 5,508,368 A * | 4/1996 | Knapp et al. | 427/534 |
| 5,510,011 A | 4/1996 | Okamura et al. | 204/192.3 |
| 5,514,603 A | 5/1996 | Sato | 437/16 |
| 5,520,209 A | 5/1996 | Goins et al. | 137/246 |
| 5,529,670 A | 6/1996 | Ryan et al. | 204/192.15 |
| 5,542,559 A | 8/1996 | Kawakami et al. | 216/67 |
| 5,561,072 A | 10/1996 | Saito | 437/24 |
| 5,562,947 A | 10/1996 | White et al. | 427/255.5 |
| 5,569,363 A | 10/1996 | Bayer et al. | 204/192.32 |
| 5,572,038 A | 11/1996 | Sheng et al. | 250/492.21 |
| 5,572,398 A | 11/1996 | Federlin et al. | 361/234 |
| 5,587,038 A | 12/1996 | Cecchi et al. | 156/345 |
| 5,627,435 A | 5/1997 | Jansen et al. | 315/111.21 |
| 5,643,428 A | 7/1997 | Krivokapic et al. | 204/298.11 |
| 5,643,838 A | 7/1997 | Dean et al. | 437/238 |
| 5,648,701 A | 7/1997 | Hooke et al. | 315/111.21 |
| 5,653,811 A | 8/1997 | Chan | 118/723 |
| 5,654,043 A | 8/1997 | Shao et al. | 427/527 |
| 5,660,895 A | 8/1997 | Lee et al. | 427/579 |
| 5,665,640 A | 9/1997 | Foster et al. | 438/680 |
| 5,674,321 A | 10/1997 | Pu et al. | 118/723 |
| 5,683,517 A | 11/1997 | Shan | 118/723 |
| 5,711,812 A | 1/1998 | Chapek et al. | 118/723 |
| 5,718,798 A | 2/1998 | Deregibus | 156/429 |
| 5,728,276 A | 3/1998 | Katsuki et al. | 204/298.11 |
| 5,756,400 A * | 5/1998 | Ye et al. | 438/710 |
| 5,763,020 A | 6/1998 | Yang | 427/569 |
| 5,770,982 A | 6/1998 | Moore | 333/32 |
| 5,782,276 A | 7/1998 | Kilgore | 141/332 |
| 5,888,413 A | 3/1999 | Okumura et al. | 216/68 |
| 5,897,752 A | 4/1999 | Hong et al. | 204/192.12 |
| 5,911,832 A | 6/1999 | Denholm et al. | 118/723 |
| 5,935,077 A | 8/1999 | Ogle | 600/504 |
| 5,944,942 A | 8/1999 | Ogle | 156/345 |
| 5,948,168 A | 9/1999 | Shan et al. | 118/723 |
| 5,959,305 A | 9/1999 | Mack et al. | 250/492.21 |
| 5,985,742 A | 11/1999 | Henley et al. | 438/515 |
| 5,994,207 A | 11/1999 | Henley et al. | 438/515 |
| 5,994,236 A | 11/1999 | Ogle | 438/728 |
| 5,998,933 A | 12/1999 | Shun'ko | 315/11.51 |
| 6,000,360 A | 12/1999 | Koshimizu | 118/723 |
| 6,013,567 A | 1/2000 | Henley et al. | 438/515 |
| 6,020,592 A | 2/2000 | Liebert et al. | 250/492.21 |
| 6,036,821 A | 3/2000 | Warren | 204/192.12 |
| 6,041,735 A | 3/2000 | Murzin et al. | 118/723 |
| 6,050,218 A | 4/2000 | Chen et al. | 118/723 |
| 6,071,573 A | 6/2000 | Koemtzopoulos et al. | 427/578 |
| 6,076,483 A | 6/2000 | Shintani et al. | 118/723 |
| 6,083,363 A | 7/2000 | Ashtiani et al. | 204/298.01 |
| 6,096,661 A | 8/2000 | Ngo et al. | 438/788 |
| 6,100,536 A | 8/2000 | Ito et al. | 250/492.21 |
| 6,101,971 A | 8/2000 | Denholm et al. | 118/723 E |
| 6,103,599 A | 8/2000 | Henley et al. | 438/459 |
| 6,132,552 A | 10/2000 | Donohoe et al. | 156/345 |
| 6,139,697 A | 10/2000 | Chen et al. | 204/192.15 |
| 6,143,140 A | 11/2000 | Wang et al. | 204/192.12 |
| 6,150,628 A | 11/2000 | Smith et al. | 219/121.54 |
| 6,153,524 A | 11/2000 | Henley et al. | 438/691 |
| 6,155,090 A | 12/2000 | Rubenson | 70/367 |
| 6,164,241 A | 12/2000 | Chen et al. | 118/723 |
| 6,165,376 A | 12/2000 | Miyake et al. | 216/67 |
| 6,174,450 B1 | 1/2001 | Patrick et al. | 216/61 |
| 6,174,743 B1 | 1/2001 | Pangrle et al. | 438/14 |
| 6,182,604 B1 | 2/2001 | Goeckner et al. | 118/723 |
| 6,187,110 B1 | 2/2001 | Henley et al. | 148/33.2 |
| 6,207,005 B1 | 3/2001 | Henley et al. | 156/345 |
| 6,207,536 B1 | 3/2001 | Matsumoto et al. | 438/478 |
| 6,237,527 B1 | 5/2001 | Kellerman et al. | 118/723 |
| 6,239,553 B1 | 5/2001 | Barnes et al. | 315/111.51 |
| 6,248,642 B1 | 6/2001 | Dolan et al. | 438/407 |
| 6,265,328 B1 | 7/2001 | Henley et al. | 438/782 |
| 6,267,852 B1 | 7/2001 | Givens et al. | 204/192.12 |

| | | | |
|---|---|---|---|
| 6,291,313 B1 | 9/2001 | Henley et al. | 438/458 |
| 6,291,939 B1 | 9/2001 | Nishida | 438/407 |
| 6,300,643 B1 | 10/2001 | Fang et al. | 250/492.21 |
| 6,303,519 B1 | 10/2001 | Hsiao et al. | 438/758 |
| 6,305,316 B1 | 10/2001 | DiVergilio et al. | 118/723 |
| 6,331,701 B1 | 12/2001 | Chen et al. | 250/251 |
| 6,335,536 B1 | 1/2002 | Goeckner et al. | 250/492.3 |
| 6,339,297 B1 | 1/2002 | Sugai et al. | 315/111.21 |
| 6,341,574 B1 | 1/2002 | Bailey, III et al. | 118/723 |
| 6,348,126 B1 | 2/2002 | Hanwa et al. | 156/345 |
| 6,350,697 B1 | 2/2002 | Richardson et al. | 438/710 |
| 6,352,049 B1 | 3/2002 | Yin et al. | 118/723 |
| 6,392,351 B1 | 5/2002 | Shun'ko | 315/111.51 |
| 6,395,150 B1 | 5/2002 | Van Cleemput et al. | 204/192.37 |
| 6,403,453 B1 | 6/2002 | Ono et al. | 438/513 |
| 6,410,449 B1 | 6/2002 | Hanawa et al. | 438/706 |
| 6,413,321 B1 | 7/2002 | Kim et al. | 118/725 |
| 6,417,078 B1 | 7/2002 | Dolan et al. | 438/480 |
| 6,418,874 B1 | 7/2002 | Cox et al. | 118/723 |
| 6,426,015 B1 | 7/2002 | Xia et al. | 216/62 |
| 6,432,256 B1 * | 8/2002 | Raoux | 156/345.1 |
| 6,433,553 B1 | 8/2002 | Goeckner et al. | 324/464 |
| 6,451,184 B1 | 9/2002 | Sone | 204/298.11 |
| 6,453,842 B1 | 9/2002 | Hanawa et al. | 118/723 |
| 6,461,972 B1 | 10/2002 | Kabansky | 438/710 |
| 6,468,388 B1 | 10/2002 | Hanawa et al. | 156/345.48 |
| 6,494,986 B1 | 12/2002 | Hanawa et al. | 156/345.35 |
| 6,511,899 B1 | 1/2003 | Henley et al. | 438/515 |
| 6,512,333 B2 | 1/2003 | Chen | 315/111.21 |
| 6,513,538 B2 | 2/2003 | Chung et al. | 134/1.2 |
| 6,514,838 B2 | 2/2003 | Chan | 438/513 |
| 6,521,897 B1 | 2/2003 | Lindquist et al. | 250/423 |
| 6,528,391 B1 | 3/2003 | Henley et al. | 438/459 |
| 6,551,446 B1 | 4/2003 | Hanwa et al. | 156/345.48 |
| 6,559,408 B2 | 5/2003 | Smith et al. | 219/121.57 |
| 6,579,805 B1 | 6/2003 | Bar-Gadda | 438/710 |
| 6,582,999 B2 | 6/2003 | Henley et al. | 438/623 |
| 6,593,173 B1 | 6/2003 | Anc et al. | 438/149 |
| 6,602,800 B2 | 8/2003 | Matsuki | 438/778 |
| 6,679,981 B1 | 1/2004 | Pan et al. | 204/298.06 |
| 6,800,559 B2 | 10/2004 | Bar-Gadda | 438/710 |
| 6,811,448 B1 | 11/2004 | Paton et al. | 439/706 |
| 6,838,695 B2 | 1/2005 | Doris et al. | 257/55 |
| 6,863,019 B2 | 3/2005 | Shamouilian et al. | 118/723 R |
| 6,892,669 B2 | 5/2005 | Xu et al. | 118/723 E |
| 2001/0042827 A1 | 11/2001 | Fang et al. | |
| 2002/0006478 A1 | 1/2002 | Yuda et al. | 427/579 |
| 2002/0023831 A1 | 2/2002 | Iwase et al. | 204/192.12 |
| 2002/0047543 A1 | 4/2002 | Sugai et al. | 315/111.21 |
| 2002/0113206 A1 | 8/2002 | Chen | 250/251 |
| 2002/0189938 A1 | 12/2002 | Baldwin et al. | 204/298.03 |
| 2003/0013260 A1 | 1/2003 | Gossman et al. | 438/301 |
| 2003/0013314 A1 | 1/2003 | Ying et al. | 438/710 |
| 2003/0085205 A1 | 5/2003 | Lai et al. | 219/121.43 |
| 2003/0141831 A1 | 7/2003 | Chen | 315/500 |
| 2005/0110147 A1 | 5/2005 | Wu et al. | 257/758 |
| 2005/0211170 A1 | 9/2005 | Hanawa et al. | 118/723 R |
| 2005/0211171 A1 | 9/2005 | Hanawa et al. | 118/723 R |
| 2005/0211546 A1 | 9/2005 | Hanawa et al. | 204/192.12 |
| 2005/0211547 A1 | 9/2005 | Hanawa et al. | 204/192.12 |
| 2005/0214477 A1 | 9/2005 | Hanawa et al. | 427/569 |
| 2005/0214478 A1 | 9/2005 | Hanawa et al. | 427/569 |
| 2006/0019039 A1 | 1/2006 | Hanawa et al. | 427/523 |
| 2006/0019477 A1 | 1/2006 | Hanawa et al. | 438/514 |

FOREIGN PATENT DOCUMENTS

| | | | |
|---|---|---|---|
| EP | 0 552 490 A1 | 7/1993 | |
| EP | 0 552 491 A1 | 7/1993 | |
| EP | 0 836 218 A2 | 4/1998 | |
| EP | 0 964 074 A2 | 12/1999 | |
| EP | 1 111 084 A1 | 6/2001 | |
| EP | 1 158 071 A2 | 11/2001 | |
| EP | 1 191 121 A1 | 3/2002 | |
| JP | 59-86214 | 5/1984 | |
| JP | 59-218728 | 12/1984 | |
| JP | 62-120041 | 6/1987 | |
| JP | 05188182 A | 7/1993 | |
| JP | 070455542 | 2/1995 | |
| JP | 2000-144404 | 5/2000 | |
| JP | 2000150908 | 5/2000 | |
| WO | WO 99/00832 | 1/1999 | |
| WO | WO 99/01888 | 1/1999 | |
| WO | WO 01/11650 A1 | 2/2001 | |
| WO | WO 01/86697 | 11/2001 | |
| WO | WO 02/25694 A2 | 3/2002 | |
| WO | WO 93/18201 | 9/2003 | |

OTHER PUBLICATIONS

Wolf, Stanley and Taubner, Richard, "Silicon Processing for the VLSI Era", 2000, Lattice Press, vol. 1, pp. 303-308.

Sobie, Walter, R., "Ion Beam Technology for Thin Film Applications", *Vacuum and Thinfilm*, HIS Publishing Group, Libertyville, IL, Apr. 1999.

Van de Ven, Evert P., Connick, I-Wen, and Harrus, Alain S., "Advantages of Dual Frequency PECVD for Deposition of ILD and Passivation Films", *IEEE*, Proceedings of VMIC Conference, Jun. 12-13, 1990, pp. 194-201.

Zhnag, B.C., and Cross, R.C., "A high power radio frequency transformer for plasma production," *Rev. Sci. Instrum.*, vol. 69, No. 1, pp. 101-108, Jan. 1998.

U.S. Appl. No. 09/638,075, filed Aug. 11, 2000, entitled, "Externally Excited Torroidal Plasma Source," by Hanawa, et al.

Official Action Dated Mar. 6, 2008, U.S. Appl. No. 10/873,602.
Official Action Dated Sep. 2, 2008, U.S. Appl. No. 10/873,602.
Official Action Dated Jun. 26, 2009, U.S. Appl. No. 10/873,602.
Official Action Dated Mar. 12, 2008, U.S. Appl. No. 10/873,609.
Official Action Dated Aug. 29, 2008, U.S. Appl. No. 10/873,609.
Official Action Dated Jun. 23, 2009, U.S. Appl. No. 10/873,609.
Official Action Dated Dec. 19, 2006, U.S. Appl. No. 10/873,474.
Official Action Dated Jun. 14, 2007, U.S. Appl. No. 10/873,474.
Official Action Dated Feb. 5, 2008, U.S. Appl. No. 10/873,474.
Official Action Dated Jul. 24, 2008, U.S. Appl. No. 10/873,474.
Official Action Dated Feb. 25, 2009, U.S. Appl. No. 10/873,474.
Official Action Dated Sep. 29, 2009, U.S. Appl. No. 10/873,474.
Official Action Dated Oct. 2, 2006, U.S. Appl. No. 10/896,113.
Official Action Dated Oct. 2, 2006, U.S. Appl. No. 10/895,784.
Official Action Dated Jan. 11, 2007, U.S. Appl. No. 10/895,784.
Official Action Dated Jul. 16, 2007, U.S. Appl. No. 10/895,784.
Official Action Dated Mar. 6, 2008, U.S. Appl. No. 10/895,784.
Official Action Dated Jun. 26, 2008, U.S. Appl. No. 10/895,784.
Official Action Dated May 15, 2009, U.S. Appl. No. 10/895,784.
Official Action Dated Apr. 20, 2007, U.S. Appl. No. 10/873,600.
Official Action Dated Nov. 14, 2006, U.S. Appl. No. 10/873,600.
Official Action Dated Jul. 31, 2007, U.S. Appl. No. 10/873,600.
Official Action Dated Dec. 14, 2006, U.S. Appl. No. 10/873,463.
Official Action Dated Jun. 15, 2007, U.S. Appl. No. 10/873,463.
Official Action Dated Feb. 5, 2008, U.S. Appl. No. 10/873,463.
Official Action Dated Jul. 23, 2008, U.S. Appl. No. 10/873,463.
Official Action Dated May 13, 2009, U.S. Appl. No. 10/873,463.
Official Action Dated Nov. 6, 2009, U.S. Appl. No. 10/873,463.

* cited by examiner

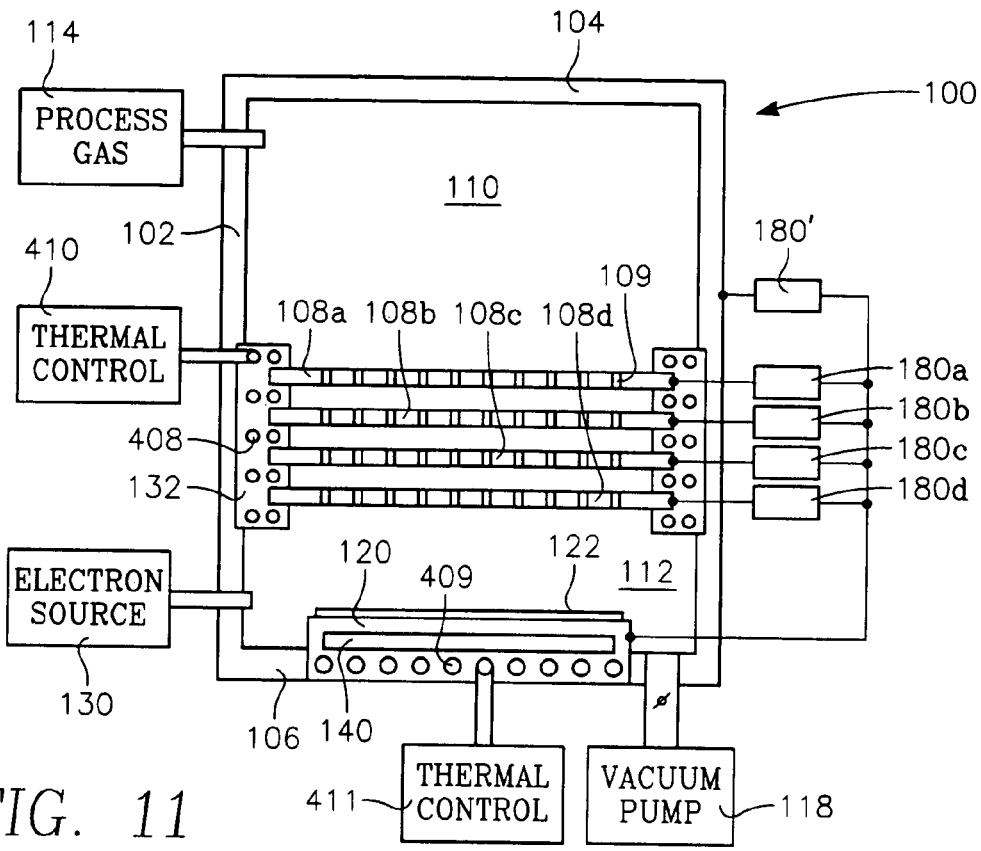
FIG. 11
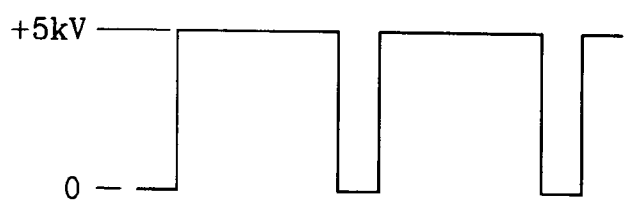
FIG. 12A
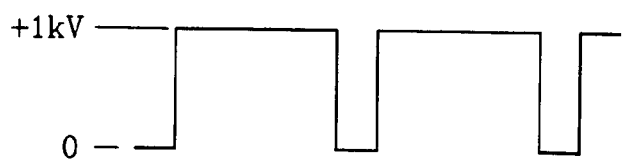
FIG. 12B
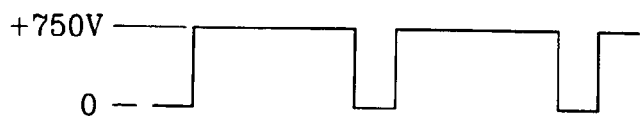
FIG. 12C
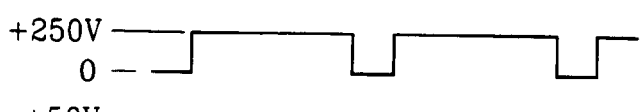
FIG. 12D
FIG. 12E

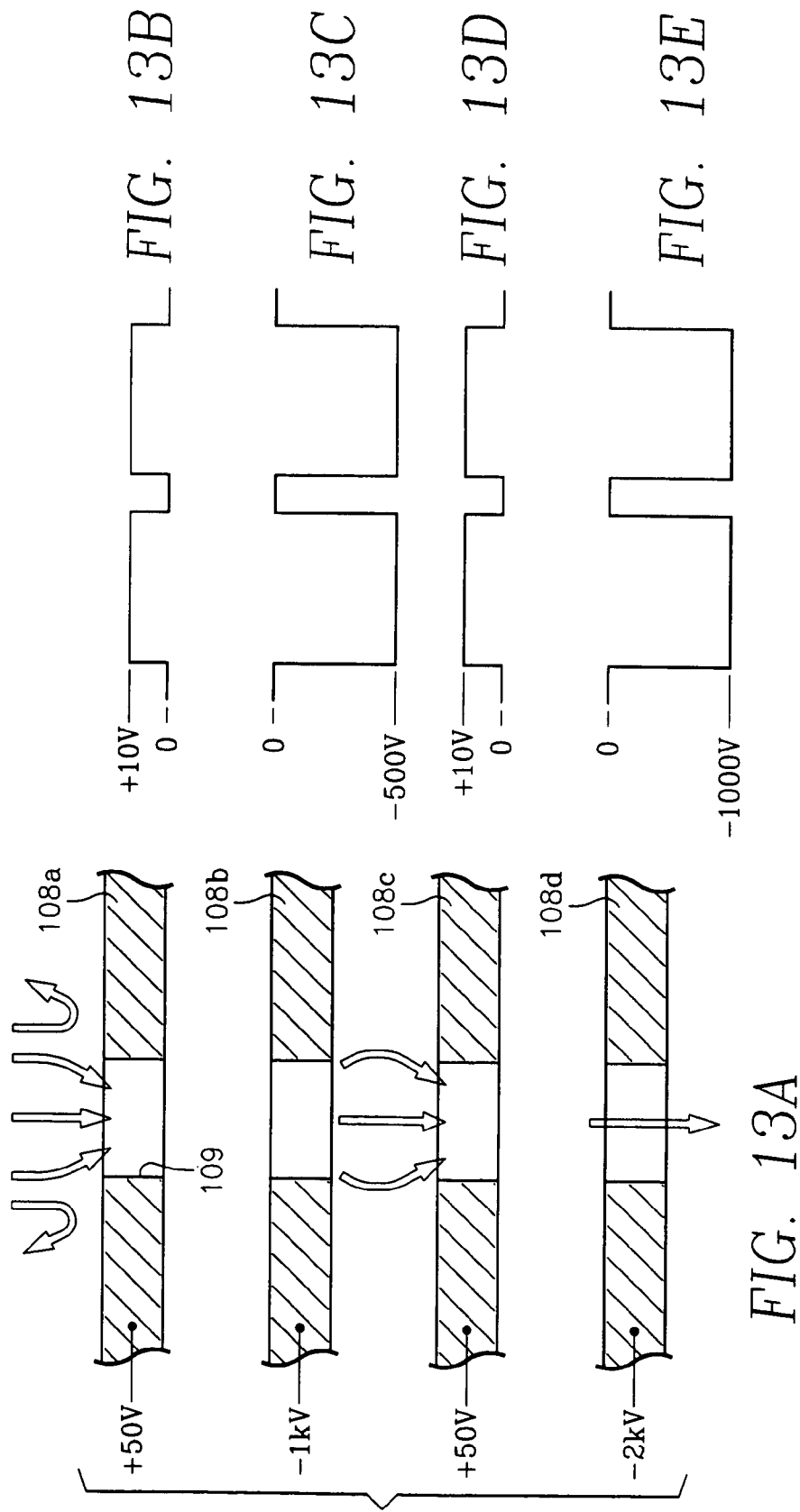

PUSH PULL

PUSH PULL

IN SYNC

IN SYNC

SYMMETRIC

SYMMETRIC

NON-SYMMETRIC

NON-SYMMETRIC

PLASMA IMMERSION ION IMPLANTATION REACTOR HAVING AN ION SHOWER GRID

CROSS-REFERENCE TO RELATED APPLICATIONS

This application contains subject matter related to U.S. application Ser. No. 10/873,600 filed Jun. 22, 2004 entitled CHEMICAL VAPOR DEPOSITION PLASMA PROCESS USING PLURAL ION SHOWER GRIDS by Hanawa, et al.; U.S. application Ser. No. 10/873,485 filed Jun. 22, 2004 entitled CHEMICAL VAPOR DEPOSITION PLASMA PROCESS USING AN ION SHOWER GRID by Hiroji Hanawa, et al.; U.S. application Ser. No. 10/873,602 filed Jun. 22, 2004 entitled REACTIVE SPUTTER DEPOSITION PLASMA PROCESS USING AN ION SHOWER GRID by Hiroji Hanawa, et al.; U.S. application Ser. No. 10/873,609 filed Jun. 22, 2004 entitled REACTIVE SPUTTER DEPOSITION PLASMA REACTOR AND PROCESS USING PLURAL ION SHOWER GRIDS by Hiroji Hanawa et al.; U.S. patent application Ser. No. 10/873,474 filed Jun. 22, 2004 entitled CHEMICAL VAPOR DEPOSITION PLASMA REACTOR HAVING AN ION SHOWER GRID by Hiroji Hanawa et al.; U.S. patent application Ser. No. 10/873,463 filed Jun. 22, 2004 entitled CHEMICAL VAPOR DEPOSITION PLASMA REACTOR HAVING PLURAL ION SHOWER GRIDS by Hiroji Hanawa et al.; and U.S. patent application Ser. No. 10/895,784 filed Jul. 20, 2004 entitled PLASMA IMMERSION ION IMPLANTATION REACTOR HAVING MULTIPLE ION SHOWER GRIDS by Hiroji Hanawa et al., all of which applications are assigned to the present assignee.

BACKGROUND OF THE INVENTION

The present invention is related to semiconductor microelectronic circuit fabrication, and particularly to ion implantation using plasma immersion.

The formation of semiconductor junctions on the surface of a semiconductor crystal (such as silicon wafer) is generally carried out by implantation of ions of either acceptor or donor impurity species (e.g., Boron or Arsenic) into the surface. Currently, ion implantation is efficiently carried out by ion beam accelerators. An ion beam accelerator raster-scans a beam of donor or acceptor ions across the semiconductor wafer surface. The implanted semiconductor wafer surface is then annealed at elevated temperatures in excess of 600° C. in order to cause the implanted species to be substituted for silicon atoms within the crystal lattice. This process is defined as dopant activation. The depth of the implanted species below the surface, in conjunction with a subsequent anneal process, determines the junction depth, which is determined by the kinetic energy of the ion beam and subsequent annealing thermal budget. The conductance of the implanted region of the semiconductor is determined by the junction depth and the volume concentration of the thermally activated implanted dopant species. The implanted dopant species concentration is controlled by the rate at which the ion beam is scanned across the semiconductor surface and the beam current. The activated implanted dopant species concentration is controlled by the above, and the subsequent anneal process (temperature and time characteristics). For current semiconductor fabrication processes, in which semiconductor circuit feature size is about 130 nm, ion beam accelerators are suitable for ion implantation because the junction depth is fairly deep (over 330 Angstroms) and the required dopant dose is fairly modest (about $2 \times 10^{14}$ to about $2 \times 10^{15}$ ions/cm$^2$). Such a modest dopant concentration is fulfilled by an ion beam accelerator with an implant operation lasting only minutes. Because of the deep junction depth, the abruptness of the junction need be no smaller than 6 nm/dec (i.e., nanometers per decade of concentration). Therefore, ion energy distribution is not critical, and some ions may have a kinetic energy that carries them somewhat beyond the desired junction depth without degrading the abruptness beyond the 4.1 nm/dec level. Therefore, techniques for enhancing the ion beam flux that compromise ion energy distribution can be used. These techniques include using an ion beam that has a few times the kinetic energy corresponding to the desired junction depth, or about 2 keV, (and therefore several times the ion flux density), and then electrically decelerating the ion beam down to the correct kinetic energy (e.g., 500 eV) just before it impacts the semiconductor wafer surface. The deceleration process is not precise and leaves a fraction of implanted particles (neutrals) above the correct energy level, which is sometimes referred to as a high energy tail or energy contamination. The high energy tail arises from the natural occurrence of neutrals in the ion beam and the immunity of such neutrals from the electrostatic deceleration process. Such neutrals therefore impact the wafer at the original energy (e.g., 2 keV), so that they are implanted below the desired junction depth, due to the high energy tail, causing a loss of junction abruptness. But this is not harmful because of the relatively relaxed requirement for junction abruptness (6 nm/dec). Moreover, rapid thermal annealing by halogen lamps, for example, tends to "wash out" the effect of the high energy tail due to diffusion.

However, as semiconductor circuit feature size decreases with progress in device speed, ion beam accelerators become less efficient. For example, at a feature size of 65 nm, the junction depth is only about 170 Angstroms and the abruptness is much steeper, at 2.8 nm/dec. With such a shallow junction, the required dopant dose is greater (to avoid an increased resistance), or about $10^{15}$ to about $2 \times 10^{16}$ ions/cm$^2$. In order to activate such higher dopant concentrations in the silicon crystal, and in order to avoid increasing junction depth during annealing, dynamic surface annealing is advantageously employed, in which the wafer surface (e.g., down to depth of order 1000 Angstroms) is laser-heated to near melting (e.g., 1300 deg. C.) for a period of a nanosecond to tens of milliseconds. Dynamic surface annealing activates a higher concentration of dopant and increases junction depth by less than 20 Å compared with rapid thermal annealing. (By comparison, rapid thermal annealing can add over 100 Å to the junction depth, which would double the junction depth in some cases.) However, dynamic surface annealing does not reduce the high energy tail. Therefore, in order to stay within the more stringent junction abruptness requirement and in order to avoid a high energy tail, the ion beam accelerator must be operated in drift mode, in which the ions are accelerated up to but not beyond the kinetic energy corresponding to the desired junction depth (e.g., only 500 eV), so that no ions will be implanted below the desired depth, and no deceleration process is required. For example, a junction depth of 10-20 nm may translate to an ion beam energy of only 500 eV. Unfortunately, the lower ion energy in drift mode limits the ion beam flux (and current), so that the time required to reach the desired high dopant concentration can be as long as a half hour or one hour. This problem arises particularly in shallow junction implant of light species such as Boron, in which the beam voltage must be reduced to avoid high velocity Boron ions being implanted below the desired junction depth. The problem arises basically because the space charge effects in the ion beam produce repulsive forces between the ions in the beam in a radial direction, generally, limiting the beam density and therefore the beam current. Such effects become more important as the beam energy is reduced (as it must be for implanting the lighter elements such as Boron), resulting in lower beam currents and longer implant times. Such long implant times greatly limit productivity and increase production costs. For example, in order to avoid a decrease in wafer through-put, the number of ion beam implant machines must be increased. In the future, feature sizes will decrease further, down to 45 nm, so that such problems will worsen in proportion as the technology advances.

These problems pertain particularly to cases in which the species to be implanted has a low atomic weight (such as Boron), so that the acceleration voltage must be small, which translates into a small ion beam flux and a long implant time. For higher atomic weight species (such as Arsenic), the acceleration voltages are much higher and the ion beam flux is therefore sufficiently high to keep implantation times down to an acceptable level. One way of permitting an increased beam acceleration voltage for lighter implant species such as Boron, in order to improve ion flux and reduce implant time, is to implant molecular ions consisting of one Boron atom or more and another volatile species such as Fluorine, Hydrogen, or other species. Examples of such molecular ions are $BF_2$, $B_{10}H_{14}$. Thus, implanting $BF_2$ permits the use of a much higher beam energy and therefore a higher and more acceptable ion beam flux. However, while much of the implanted fluorine tends to diffuse out of the silicon crystal during annealing, a significant amount does not, leaving some crystal lattice sites that contain neither a semiconductor atom (Si) nor a dopant impurity atom (B), thus (for some applications) reducing the overall quality of the semiconductor material. Therefore, this technique is not desirable universally for all applications.

In summary, advances in technology dictate a more shallow junction depth, a greater junction abruptness and a higher dopant concentration in the semiconductor surface. Such advances in technology (where features size decreases to 65 nm and ultimately to 45 nm) render ion beam implantation of lighter dopants such as Boron impractical. This is because the traditional ion beam implanter provides too little ion beam flux in such applications.

In order to find an ion source having much higher ion flux for low atomic weight species such as Boron, the field has turned to an ion source whose flux at a given implant depth is less affected by the space charge effect or (indirectly) atomic weight, namely a plasma ion source. Specifically, the semiconductor wafer is immersed in a plasma consisting of dopant ions (such as Boron ions). However, such plasma ion immersion implantation has been plagued by various difficulties.

One type of plasma immersion ion implantation reactor employs a pulsed D.C. voltage applied to a pedestal supporting the semiconductor wafer in a vacuum chamber filled with a dopant-containing gas such as BF3. The D.C. voltage creates a plasma discharge in the chamber in which Boron ions and other ions dissociated from the BF3 ions are accelerated into the wafer surface. The D.C. voltage maintains the plasma by creation of secondary electrons from collisions with the chamber surfaces or wafer surface. The rate at which such collisions produce secondary electrons depends upon the condition of the chamber surfaces. Accordingly, such a reactor is unacceptably sensitive to changes in the condition of the chamber surfaces due, for example, to contamination of the chamber surfaces. As a result, such a plasma ion immersion implantation reactor cannot maintain a target junction depth or abruptness, for example, and is plagued by contamination problems.

This type of reactor tends to produce a relatively low density plasma and must be operated at relatively high chamber pressure in order to maintain the plasma density. The high chamber pressure and the lower plasma density dictate a thicker plasma sheath with more collisions in the sheath that spread out ion energy distribution. This spreading can result in a larger lateral junction distribution and may reduce junction abruptness. Furthermore, the reactor is sensitive to conditions on the wafer backside because the plasma discharge depends upon ohmic contact between the wafer backside and the wafer support pedestal.

One problem inherent with D.C. voltage applied to the wafer support is that its pulse width must be such that the dopant ions (e.g., Boron) are accelerated across the plasma sheath near the wafer surface with sufficient energy to reach the desired junction depth below the surface, while the pulse width must be limited to avoid (discharge) any charge build-up on the wafer surface that would cause device damage (charging damage). The limited pulse width is problematic in that the periodic decrease in ion energy can result in deposition on the semiconductor surface rather than implantation, the deposition accumulating in a new layer that can block implantation during the pulse on times. Another problem arises because ions must impact the wafer surface with at least a certain target energy in order to penetrate the surface up to a desirable depth (the as-implanted junction depth) and become substitutional below the surface and up to the desired annealed junction depth during the annealing process. Below this energy, they do not penetrate the surface up to the as-implanted junction depth and do not become substitutional at the desired junction depth upon annealing. Moreover, the ions below the target energy may simply be deposited on the wafer surface, rather than being implanted, to produce a film that can impede implantation. Unfortunately, due to resistive and capacitive charging effects (RC time constant) on dielectric films on the wafer that tend to accompany a D.C. discharge, the ions reach the target energy during only a fraction of each pulse period (e.g., during the first microsecond), so that there is an inherent inefficiency. Moreover, the resulting spread in ion energy reduces the abruptness of the P-N junction. This problem cannot be solved by simply increasing the bias voltage, since this would increase the junction depth beyond the desired junction depth.

Another type of plasma immersion ion implantation reactor employs inductive coupling to generate the plasma, in addition to the pulsed D.C. voltage on the wafer. This type of reactor reduces the problems associated with plasma maintenance from secondary electrons, but still suffers from the problems associated with pulsed D.C. voltages on the wafer discussed immediately above.

Another type of plasma ion immersion implantation reactor employs an RF voltage applied to the wafer support pedestal that both controls ion energy and maintains the plasma. As in the pulsed D.C. voltage discussed above, the RF voltage on the wafer support creates a plasma discharge in the chamber in which Boron ions and other ions dissociated from the $BF_3$ ions are accelerated into the wafer surface. The RF voltage generates and maintains the plasma mainly by capacitively coupling RF energy from the electrode across the sheath to electrons in the plasma just above the sheath (low pressure case) or electrons in the bulk plasma volume (high pressure case). While such a reactor has reduced sensitivity to chamber surface conditions as compared to reactors employing a pulsed DC bias, it is still quite sensitive. Also, ion energy and flux cannot be independently selected with a single RF power source. Ion flux may still be unacceptably low for high throughput applications with a single RF power source. Contamination due to wall sputtering or etching may also be high due to elevated plasma potential.

Another type of plasma ion immersion implantation reactor employs a microwave power applicator for generating the plasma. This reactor has a microwave waveguide pointed axially downward to a magnetic field centered about the axis. Electron cyclotron resonance (ECR) occurs in a particular surface of the field to produce the plasma (for a microwave frequency of 2.45 GHz, this surface is where the magnetic field is about 875 gauss). The magnetic field is divergent, with a field gradient creating a drift current towards the substrate being processed. This drift current consists of both electrons (directly acted on by the interaction of microwave induced electric field and divergent DC magnetic field) and positively-charged ions (indirectly acted on by the deficit in negative charge formed due to the out-flux of electrons) and corresponding to a voltage of 10 to 100 eV. One problem is that the magnetic field gradient is non-uniform, so that the radial distribution of plasma ion energy is non-uniform, causing non-uniform junction depths across the wafer. Another problem is the relatively high ion energy directed at the wafer, limiting the degree to which junction depths can be minimized. One way of addressing the non-uniformity issue is to place the microwave ECR source far above the wafer. The problem with such an approach is that the ion density and flux is at least proportionately decreased, thus reducing the productivity of the reactor. A related problem is that, because the plasma ion density at the wafer surface is reduced by the increased source-to-wafer distance, the chamber pressure must be reduced in order to reduce recombination losses. This rules out some applications that would be advantageously carried out at high pressure (applications which benefit from wide angular ion energy distribution) such as conformal doping of polysilicon lines and three dimensional devices. Another way of addressing the non-uniformity issue is to place another magnet array between the source and the wafer, in an effort to straighten the magnetic field. However, the additional magnetic field would increase magnetic flux at the wafer surface, increasing the risk of charge damage to semiconductor structures on the wafer.

In summary, plasma immersion ion implantation reactors have various limitations, depending upon the type of reactor: plasma reactors in which a pulsed D.C. voltage is applied to the wafer pedestal are too sensitive to chamber conditions and are inefficient; and plasma reactors with microwave ECR sources tend to produce non-uniform results. Thus, there is a need for a plasma immersion ion implantation reactor that is free of the foregoing limitations.

SUMMARY OF THE INVENTION

A plasma immersion ion implantation process for implanting a selected species at a desired ion implantation depth profile in a workpiece is carried out in a reactor chamber with an ion shower grid that divides the chamber into an upper ion generation region and a lower process region, the ion shower grid having plural elongate orifices oriented in a non-parallel direction relative to a surface plane of the ion shower grid. The process includes placing a workpiece in the process region, the workpiece having a workpiece surface generally facing the surface plane of the ion shower grid, and furnishing the selected species into the ion generation region in gaseous, molecular or atomic form and evacuating the process region at an evacuation rate sufficient to create a pressure drop across the ion shower grid from the ion generation region to the process region of about a factor of at least four. The process further includes applying plasma source power to generate a plasma of the selected species in the ion generation region, and applying a grid potential to the ion shower grid to create a flux of ions from the plasma through the grid and into the process region. The process also includes applying a sufficient bias power or voltage to at least one of: (a) the workpiece, (b) the grid, relative to at least one of: (a) the workpiece, (b) a plasma in the ion generation region, (c) a surface of the chamber, to accelerate the flux of ions to a kinetic energy distribution generally corresponding to the desired ion implantation depth profile in the workpiece.

BRIEF DESCRIPTION OF THE DRAWINGS

FIG. 11 illustrates a CVD reactor having multiple parallel ion shower grids and multiple grid voltage sources.

FIGS. 12A, 12B, 12C, 12D and 12E illustrate contemporaneous time domain waveforms of grid voltages applied to successive ones of the multiple grids of FIG. 11.

FIG. 13A illustrates one mode in which the multiple grids of FIG. 11 are driven in such a way as to focus ion flux through the grid orifices.

FIGS. 13B, 13C, 13D and 13E illustrate contemporaneous time domain waveforms of the individual voltages applied to the individual multiple grids in the mode of FIG. 13A.

DETAILED DESCRIPTION OF THE INVENTION

Figure 1:
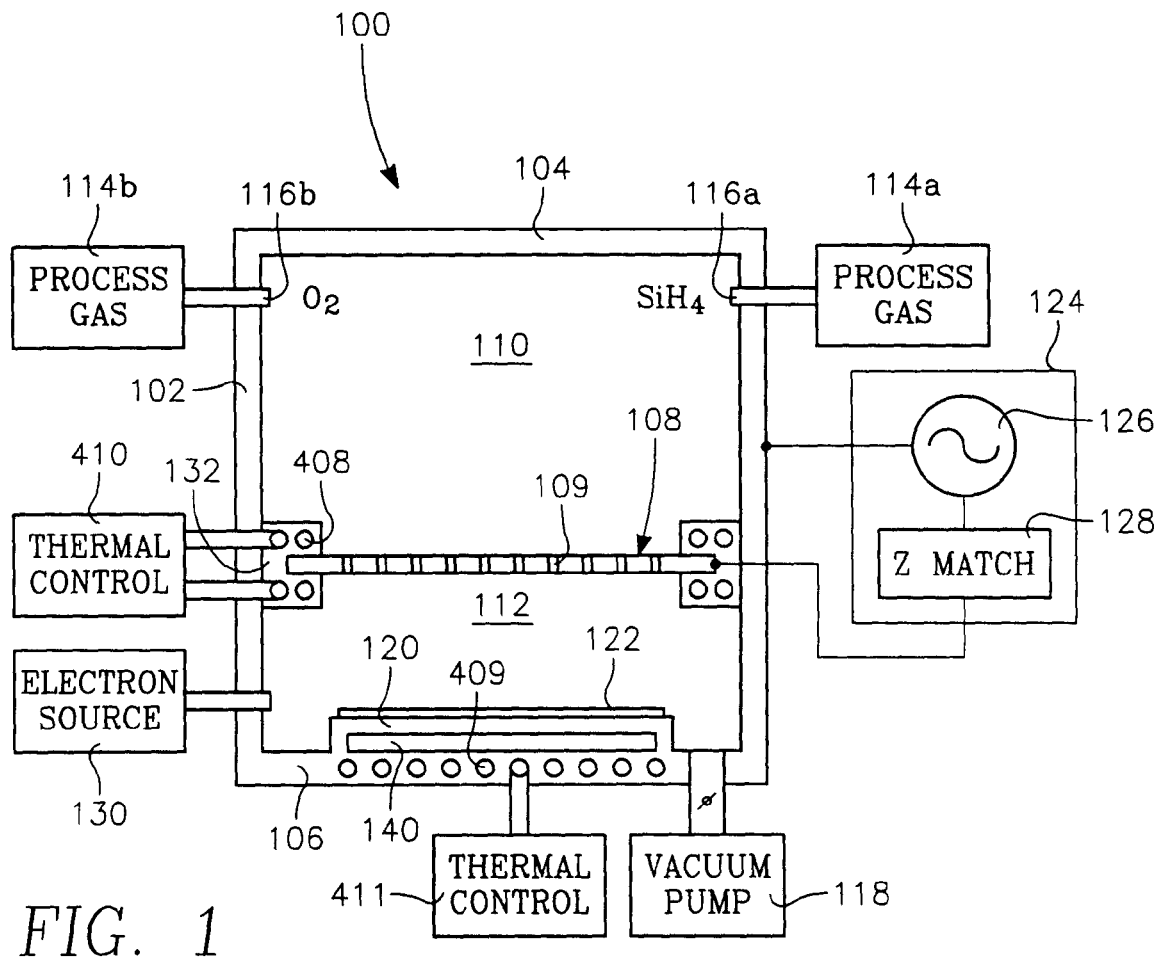
FIG. 1 illustrates a CVD reactor having a single ion shower grid and a single power source furnishing both a grid potential and plasma source power.

Reactors Employing an Ion Shower Grid:

Referring now to FIG. 1, a plasma reactor includes a vacuum reactor chamber 100 defined by a side wall 102, a ceiling 104 and a floor 106. An ion shower grid 108 having plural vertically extending grid orifices 109 separates the chamber 100 into upper and lower sub-chambers 110, 112. Process gas supplies 114a, 114b introduce process gases into the upper chamber 110 through gas injection orifices 116a, 116b. A vacuum pump 118 evacuates the chamber 100 through the floor 106. A wafer pedestal 120 supported on the floor 106 holds a semiconductor wafer 122 in the lower sub-chamber 112. The wafer pedestal 120 may be an electrostatic chuck of the type well-known in the art that holds the wafer 122 by applying a static voltage through an insulator within the chuck and releases the wafer upon termination of the static voltage. An electrical power source 124 is coupled to the chamber 100 so as to apply plasma source power to ionize process gases in the upper chamber 110 and to apply an ion acceleration potential to the grid 108. Thus, in the reactor of FIG. 1, the single power source 124 doubles as both a plasma source power supply and a grid voltage supply. The power supply may generate a pulse D.C. voltage waveform (e.g., +5 kV pulses), or an RF voltage or a combination of both. The power supply 124 may include a pulse generator and/or an RF power generator 126 and an impedance match device 128. The positive side of the power supply 124 is coupled to a conductive or semiconductive wall of the upper ion generation sub-chamber 110 (such as the side wall 102 or ceiling 104). The return side or terminal of the power supply 124 is coupled to the grid 108. Either the wafer support pedestal 120 or the grid 108 (or both) may be grounded or either or both may be ungrounded. A bias voltage source may be coupled to the wafer support pedestal 122 as will be described below in this specification with reference to subsequent embodiments. For this purpose, the wafer support pedestal 122 may be electrically insulated from other conductive components of the reactor, such as the grid 108, the side wall 102 and the ceiling 104.

A source of electrons 130 provides negative charge to the wafer 122 to control or reduce charge accumulation on the wafer 122.

The electrical supply 124 applies a positive voltage to the upper chamber through either the conductive side wall 102 or the conductive ceiling 104, while its return (ground) side is connected to the conductive grid 108. For this purpose, an insulator ring 132 supports the grid 108 on the side wall 102 while electrically insulating the grid 108 from the side wall 102. The voltage applied to the side wall 102 by the supply 124 controls the plasma potential in the upper sub-chamber 110 relative to the grid 108, so as to create an attractive potential at the grid 108 for plasma ions in the upper sub-chamber 110.

Figure 2:
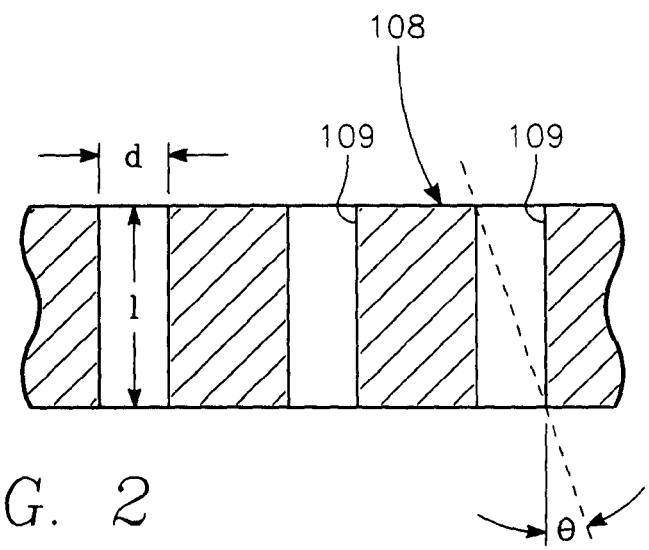
FIG. 2 is a detailed cross-sectional view of an ion shower grid illustrating the orifice structure.

Referring to FIG. 2, each orifice 109 in the grid 108 may be a cylindrical hole on the order of 0.025 to 2.5 millimeter in diameter (d), the length (l) being the thickness of the grid 108, which may be on the order of 0.25 millimeter up to 2.5 centimeter, for example. The dimensions d and l are selected for optimal transmission of ions through the grid 108. The ratio d/l determines the maximum divergence in the ion trajectory from the (desired) vertical direction (i.e., perpendicular relative to the surface of the wafer 120). The angular distribution of ions passing through the grid 108 is influenced not only by d/l, but also by the acceleration potential voltage on the grid 108. The higher the grid voltage, the more rapidly ions are pulled out of the plasma generation region (110) with near vertical trajectories, and therefore the narrower will be the angular distribution of the ions reaching the wafer 122. The divergence of the ion trajectory from true vertical (i.e., the angular distribution) determines the deposition rate on vertical side walls. By minimizing the divergence, the side wall deposition rate is minimized. By minimizing the side wall deposition rate, the tendency to pinch off HAR openings before they are filled is prevented.

In a CVD process for depositing a dielectric film such as silicon dioxide, the process gas supply 114a may furnish a silicon-containing gas such as silane or TEOS while the process gas supply 114b may furnish oxygen. The RF power of RF generator 126 is applied between two capacitive electrodes, namely the side wall 102 and the grid 108 in the example of FIG. 1, so that RF power is capacitively coupled to the process gases in the upper sub-chamber 110 to generate a plasma. The plasma in the upper sub-chamber 110 has many times more neutrals than ions. The attractive potential on the grid 108 attracts only ions in a vertical direction toward the grid 108, where many of them pass through the grid orifices 109, so that the ion content of plasma in the lower sub-chamber is greatly enriched. The gap or distance between the wafer 122 and the grid 108 is selected to be smaller than the ion-to-neutral mean collision distance in the lower chamber, to minimize scattering of the ions from their vertical trajectory. In this example, the plasma ions include silicon and oxygen ions, and possibly $SiH_x$ ions or other molecular ions, which combine on the surface of the wafer 122 for form a silicon dioxide film.

The aspect ratio d/l and diameter d of the grid orifices 109 are selected so that the gas conductance through the grid 108 is sufficiently limited to impose a significant pressure drop across the grid 108. For example, with a proper selection of the evacuation rate of the pump 118, the upper sub-chamber 110 may have a relatively high pressure conducive to efficient plasma ion generation (e.g., about 50 mT) while the lower sub-chamber 112 may have a relatively low pressure (e.g., from about 0.1 to about 1 mT) for a very large ion/neutral mean collision distance. This reduces scattering of the ions in the lower sub-chamber to minimize scattering-induced divergence of ion trajectory from the vertical direction, and also reduces ion losses due to recombination. At this lower pressure (0.1 mT), the wafer-to-grid gap may be in a range from about a fraction of a centimeter to ten's of centimeters and still be less than one-tenth of the ion/neutral mean collision distance. The result is that a very high proportion of particles incident on the wafer 122 are ions with trajectories that are sufficiently vertical to avoid collisions with side walls of HAR openings in the thin film structure on the wafer 122, and thereby avoid accumulation of deposited material on those sidewalls before the HAR openings are filled from the bottom. While the pressure drop in the foregoing example was between a factor of about five and ten may be less (factor of four) or greater (factor of 20).

A CVD process for filling HAR openings in small geometry (e.g., 65 nm) devices avoids the problem of pinch off using the reactor of FIG. 1 by increasing the proportion in the lower sub-chamber 112 of ions or particles having a vertical trajectory (i.e., perpendicular to the surface of the wafer 122). This proportion is increased so that the deposition rate of ions or particles in the bottom of an HAR opening is sufficiently greater than the deposition rate on the side wall to prevent pinch-off at the top of the opening prior to the HAR opening being completely filled from the bottom. The proportion of ions having a vertical trajectory in the lower sub-chamber 112 is affected not only by the aspect ratio of the grid orifices 109 but also by the grid voltage applied by the source 124. As the grid voltage is increased, the flux of vertically travelling ions through the grid 108 increases due to the increasing acceleration potential. As this flux increases, the population in the lower sub-chamber 112 of vertically travelling ions increases relative to all other particles including ions or neutrals having non-vertical trajectories. Depending upon the device geometry and the HAR opening aspect ratio, the population of vertically travelling ions reaches a threshold at which pinch-off is prevented.

Therefore, in one aspect, a CVD process for filling HAR openings (aspect ratio >8) in small geometry thin film structures (65 nm or less) is carried out by increasing the attractive voltage on the grid 108 at least up to a threshold level at which pinch-off is prevented. This threshold lies between two extremes. At a lower extreme the grid voltage is zero, so that there is no attraction ions and there is a high proportion of ions and neutrals in the lower sub-chamber 112 having non-vertical trajectories, and therefore the greatest tendency to deposit on side walls and cause pinch-off. At the upper extreme, the grid voltage is so great that, in the lower sub-chamber 112, the ion trajectory angular distribution is extremely narrow (centered about the vertical direction) and the ion energy is so great that the ion density at the wafer surface can have a non-uniformity corresponding to the hole pattern in the grid 108. This latter extreme depends upon the spacing between adjacent orifices 109 in the grid 108.

The ion energy can be modified by changing the frequency of the grid voltage supply 124. For this purpose, the grid voltage supply 124 should produce an RF (sinusoidal) voltage waveform. As the frequency changes, the ability of the ions to follow the oscillations of the applied RF voltage changes. Specifically, as the frequency decreases, the ions are better able to follow the oscillations, so that at a sufficiently low frequency the ion energy distribution extends from zero to an energy corresponding to the peak-to-peak voltage of the grid voltage supply 124. As the frequency increases, however, the ability of ions to follow the oscillating RF voltage decreases until, at a sufficiently high frequency, the ions cannot follow the oscillations, and the ion energy distribution is narrowly confined to an energy corresponding to half the peak-to-peak voltage of the grid voltage supply.

In order to avoid excessive build-up of positive charge on the wafer 122, a source of negative charge neutralizes the surface of the wafer 122. This neutralizing source may be an electron source 130, such as an electron flood gun or a plasma source, or a source of an electron donor gas such as Zenon gas. Another source of electrons is the electrons scattered from the wafer surface by ion bombardment. These scattered electrons may be trapped and returned to the wafer surface by a magnet 140 underneath or inside of the wafer support pedestal 120. Since electrons are lighter than ions, the magnet 140 traps electrons nearer the wafer 122 than ions, and therefore provides a charge neutralizing effect. Another way of providing charge neutralization is to employ RF source power, such as the RF generator 126. Every half cycle, some electrons are attracted through the grid 108, contributing to charge neutralization.

The grid 108 is formed of a conductive material such as a metal (e.g., aluminum) or of a process-compatible material such as a semiconductor (e.g., silicon or silicon carbide, undoped or doped). Alternatively, the grid 108 may be formed of a metal (aluminum) and coated with a thin layer of a process compatible material (e.g., silicon or silicon carbide).

Internal coolant passages 408 may be provided in the grid 108 and/or in the insulator ring 132 supporting the grid 108. A temperature controller 410 pumps fluid through the coolant passages 408 and either cools the fluid or heats the fluid as needed. One purpose of the temperature controller 410 is to avoid excessive heating of the grid 108 which may otherwise cause the grid to distort or bend.

Internal coolant passages 409 may be provided in the wafer support pedestal 120. A temperature controller 411 pumps fluid through the coolant passages 409 and either cools the fluid or heats the fluid as needed. One purpose of the temperature controller 411 is to avoid excessive heating of the wafer 122.

The CVD processes performed by the reactor of FIG. 1 have been described with reference to deposition of silicon dioxide. However, the deposited layer may be another suitable material such as silicon nitride (using silane and nitrogen and/or ammonia process gases), silicon nitride hydride (using silane, nitrogen and hydrogen and/or ammonia process gases), fluoro-silicate glass (using silane, oxygen and fluorine-containing gases such as CF4, SiF4, or NF3), phosphorous silicate glass (using silane, oxygen and phosphorus-containing gases such as PH3 or PF3), boron silicate glass (using silane, oxygen and a boron-containing gas such as B2H6 or BF3), silicon carbide-like material (using silane and a carbon-containing gas such as CF4 or CH4) or silicon hydride (using silane and optionally hydrogen). In the above examples, other sources of silicon, such as TEOS, may be used.

Figure 3:
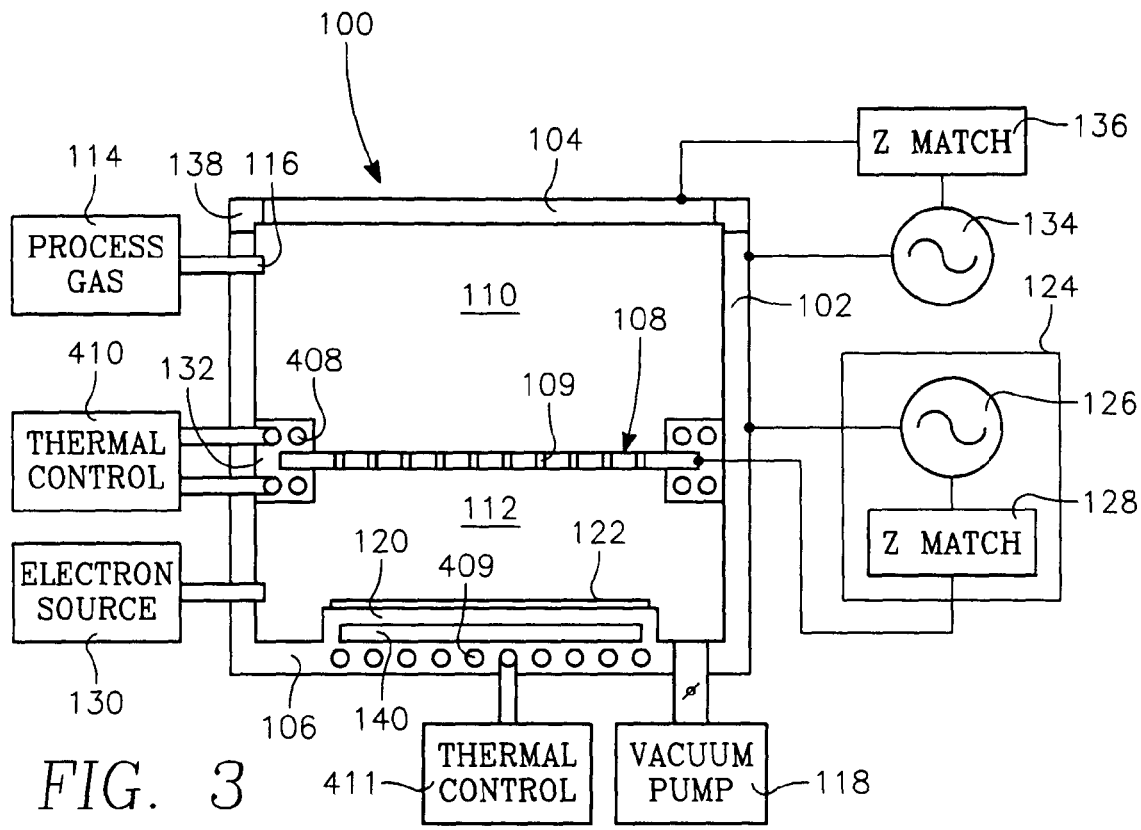
FIG. 3 illustrates a CVD reactor having a single ion shower grid and a capacitively coupled plasma source power applicator separate from the grid potential source.

Control of the grid voltage and the plasma source power may be decoupled by providing a plasma source power applicator separate from the voltage source 124 that drives the grid 108. For example, the plasma source power applicator may be a capacitively coupled one. As shown in FIG. 3, the capacitively coupled plasma source power applicator consists of an electrode (the ceiling 104) driven by an RF plasma source power generator 134 through an impedance match circuit 136, and a counter electrode (the side wall 102) coupled to the return terminal of the generator 134. The ceiling 104 and side wall 102 are insulated from one another by a dielectric ring 138. RF power from the source power generator 134 is capacitively coupled to the process gases in the upper sub-chamber 110. The source power generator 134 may produce either a pulsed output or a sinusoidal output or a combination of both, as will be discussed below, and may provide very high power, such as 5 kWatts, for example. Alternatively, the grid voltage supply 124 and the source power generator 134 may both deliver RF power but at different frequencies. As one example, the source power generator 134 may have an HF or VHF frequency, while the grid voltage supply 124 may have a low frequency (LF) output. As another possibility, the grid voltage supply 124 may simply set the grid potential at ground.

An attractive potential drop extending from the plasma in the upper sub-chamber 110 through the grid 108 all the way to the wafer 122 may be established by applying progressive voltages from the voltage source 124 to the side wall 102, the grid 108 and the wafer support pedestal 120, so that the side wall 102 is at the most positive potential, the grid is at a less positive potential and the wafer is at the ground of the voltage source 124. For this purpose, a voltage divider 141 shown in FIG. 4 may be employed. FIG. 5 illustrates an implementation of the voltage divider 141 as an inductive circuit. The output of the generator/impedance match 134, 136 is connected across an inductor 142. The inductor has a high voltage tap 144 connected to the side wall 102 or to the ceiling 104, an intermediate voltage tap 146 connected to the grid 108 and a bottom tap 148 connected to the wafer support 120 or ground. FIG. 6 illustrates an alternative implementation of the voltage divider 141 as a resistive circuit. In FIG. 6, the output of the generator/impedance match 134, 136 is connected across a resistor 152. The resistor has a high voltage tap 154 connected to the side wall 102, an intermediate voltage tap 156 connected to the grid 108 and a bottom tap 158 connected to the wafer support 120 or ground. Alternatively, three separate voltage generators could be connected, respectively, to the side wall 102, the grid 108 and the wafer support 120, their respective voltages being arranged to provide attractive potential differences from the plasma to the grid 108 and from the grid 108 to the wafer 122.

Figure 7A:
FIG. 7A illustrates the time domain waveform of a voltage applied to the ion shower grid.
Figure 7B:
FIG. 7B illustrates the time domain waveform of an RF voltage applied to the plasma source power applicator in a reactor such as the reactor of FIG. 3, for example.
Figure 7C:
FIG. 7C illustrates the plasma potential corresponding to the grid potential and the plasma source power potential of FIGS. 7A and 7B.

FIG. 7A depicts the time domain waveform of a 5 kV pulsed D.C. voltage that can be applied to the grid 108 by the voltage source 124. FIG. 7B illustrates the time domain waveform of an RF voltage (e.g., about 100 Volt peak) furnished by the plasma source power generator 134 to generate plasma in the upper sub-chamber 110. FIG. 7C illustrates the combined effect of the voltages from the grid voltage source 124 and the RF plasma source power generator 134 on the plasma potential in the upper chamber, the plasma potential being the sum of the two voltage waveforms.

Figure 8:
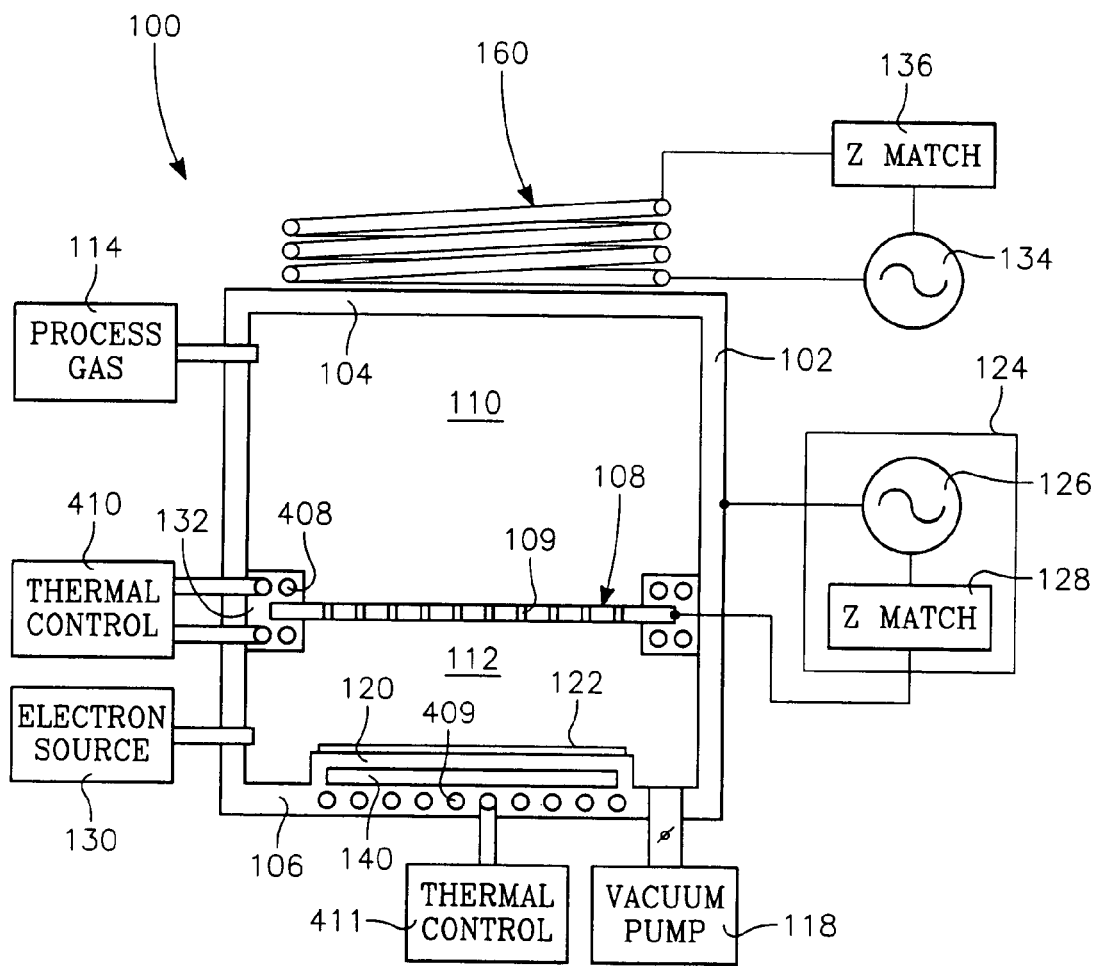
FIG. 8 illustrates a CVD reactor having a single ion shower grid and an inductively coupled plasma source power applicator separate from the grid potential source.

FIG. 8 illustrates the use of an inductively coupled plasma source power applicator to generate a plasma independently of the grid voltage supply 124. The inductively coupled plasma source power applicator is a coil antenna 160 driven by the RF source power generator 134 through the impedance match circuit 136. One advantage of the inductively coupled source power applicator is that it is capable of producing higher plasma ion density than the capacitively coupled version of FIG. 4, so that the interaction of the grid with the plasma will produce a greater proportion of particles that have a vertical trajectory and which are therefore better adapted for filling HAR openings of small geometry (65 nm) devices.

Figure 9A:
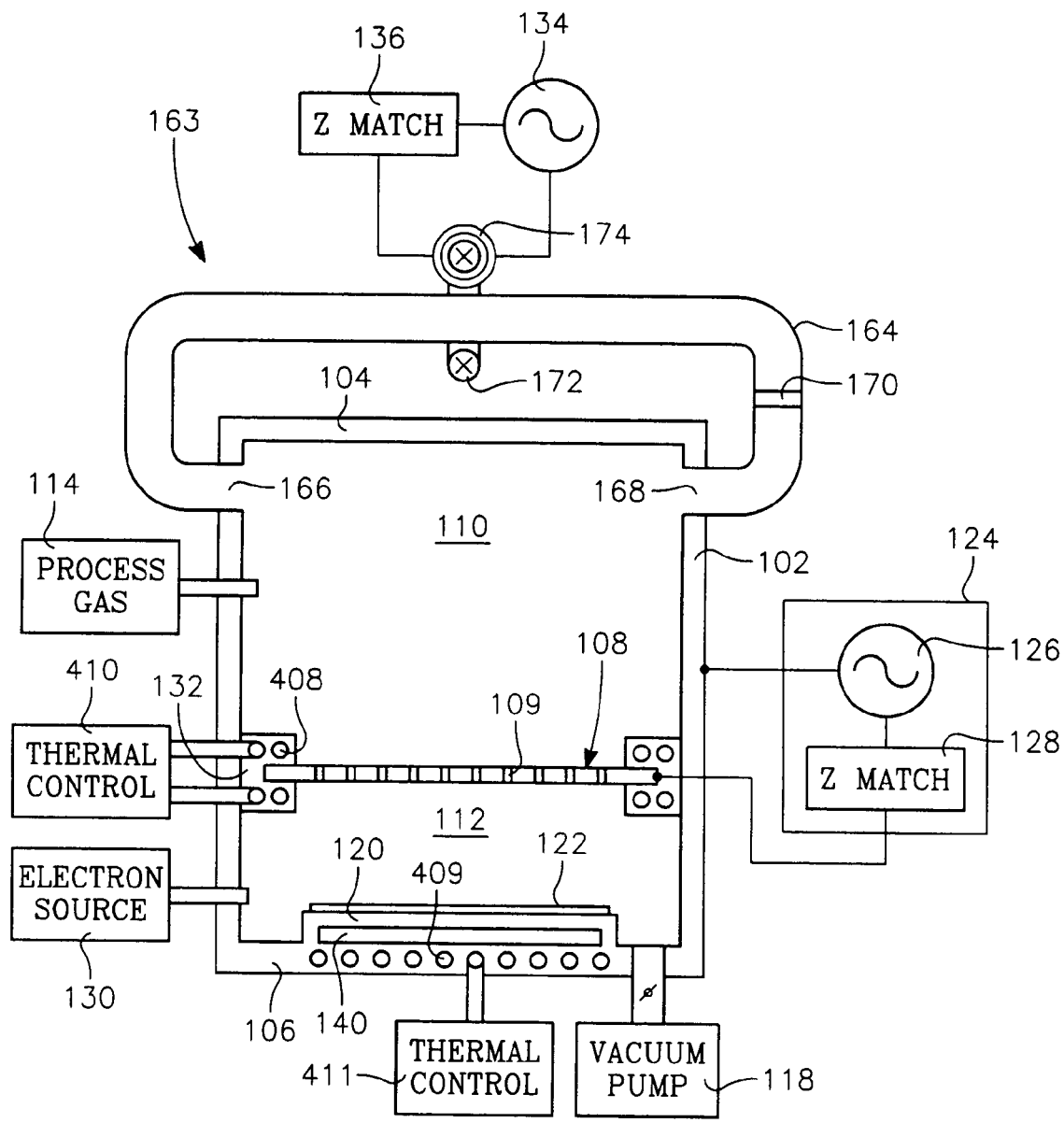
FIG. 9A illustrates a CVD reactor having a single ion shower grid and a torroidal plasma source power applicator independent of the grid voltage source.

FIG. 9A illustrates the use of a torroidal plasma source power applicator 163 to generate plasma independently of the grid voltage supply 124. The torroidal plasma source power applicator 163 may be of the type disclosed in U.S. Pat. No. 6,494,986 B1, issued Dec. 17, 2002 entitled EXTERNALLY EXCITED MULTIPLE TORROIDAL PLASMA SOURCE by Hiroji Hanawa et al. and assigned to the present assignee. The torroidal plasma source power applicator 163 consists of at least one reentrant hollow external conduit 164 connected to opposite sides of the upper chamber 110 at opposing openings or ports 166, 168. The conduit 164 can be conductive and includes a D.C. break 170 filled by an insulating ring. The torroidal plasma source power applicator further includes apparatus for coupling RF power from the generator 134 into the external conduit. This RF coupling apparatus may be implemented, for example, as a ring-shaped magnetically permeable core 172 surrounding a small section of the conduit 164. A coil 174 wrapped around the core 172 is driven by the RF source power generator 134 through the impedance match circuit 136. The RF power coupled by the magnetic core 172 and the RF-driven coil 174 generates an oscillating plasma current circulating in a reentrant path that extends through the external conduit 164 and across the upper sub-chamber between the two ports 166, 168.

The torroidal plasma source of FIG. 9A can maintain a plasma using very low source power (e.g., about 100 watts) and induces a much smaller plasma potential than other source power applicators. This characteristic is exploited to great advantage in embodiments described later in this specification.

Figure 9B:
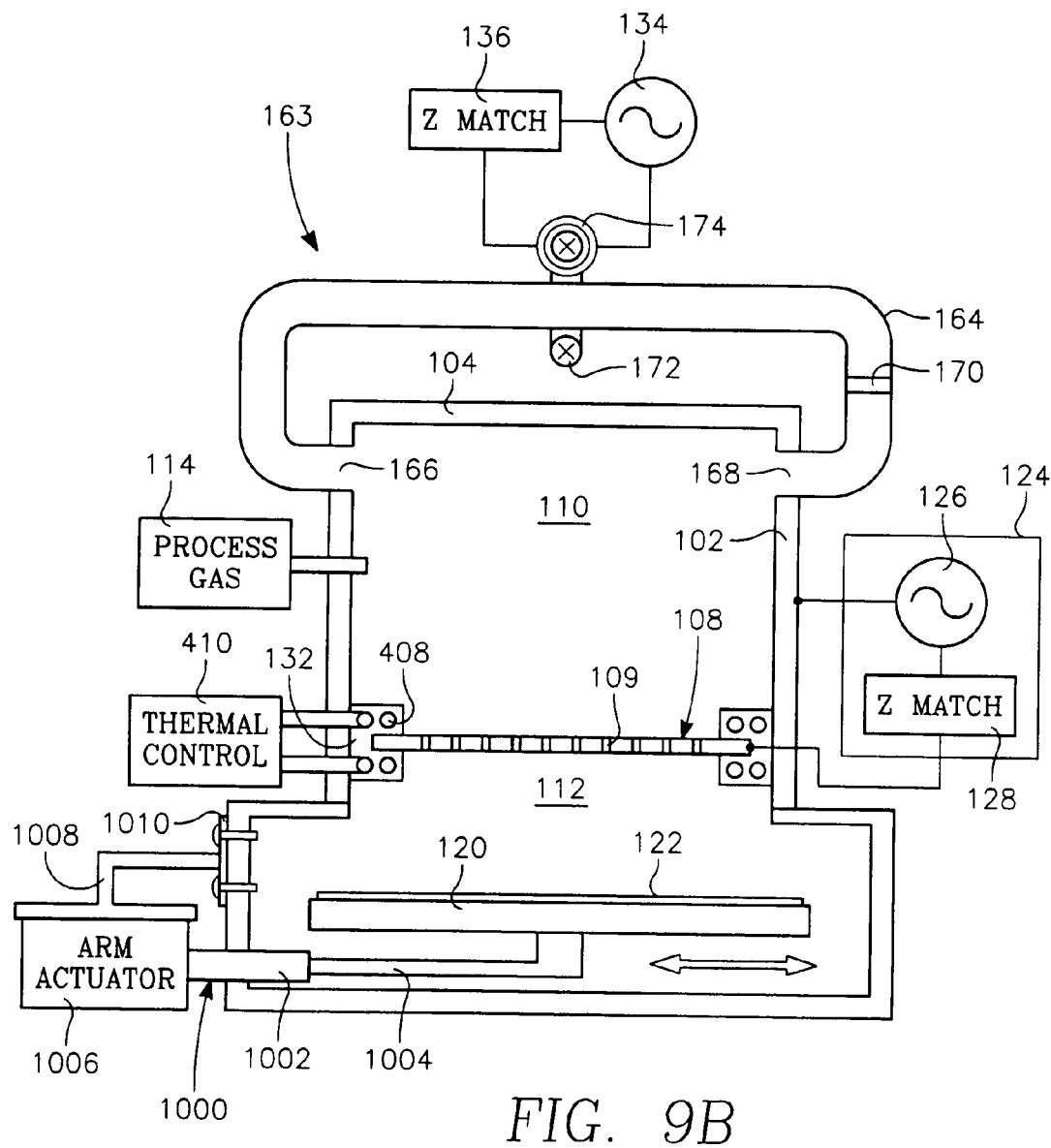
FIG. 9B illustrates a modification that enables the beam or wafer to be scanned relative to one another.

FIG. 9B illustrates a modification which may be made to any of the plasma reactors described in this specification. In the modification of FIG. 9B, the process sub-chamber 112 has a diameter greater than that of the ion generation sub-chamber 110 and greater than that of the ion shower grid 108. The wafer support pedestal 120 has a correspondingly greater diameter so that it can accommodate a larger wafer 122. In order to achieve uniform distribution of ion flux from the ion shower grid 108 across the surface of the wafer 122, the wafer support pedestal 120 and the ion generation region 110 translate relative to one another. In one implementation, the wafer support pedestal 120 is mounted on a movable telescoping arm 1000 having an outer sleeve 1002 and a sliding rod 1004 within the sleeve 1002 for movement for left/right movement in the view of FIG. 9B. A second movable telescoping arm (not shown) can be provided to lateral movement in the same plane but transverse to the left/right movement direction of the telescoping arm 1000. The movement and telescoping of the arm 1000 is controlled by an arm actuator 1006. The actuator 1006 may be mounted to the chamber housing by a fixed rack 1008 and base 1010 bolted to the sidewall of the reactor, for example. This feature permits wafers of any size to be processed in the reactor without regard to the diameter of the ion shower grid 108. For example, the drawing of FIG. 9B illustrates an over sized wafer 122 in an oversize process sub-chamber 112. This feature may be added to any of the embodiments described herein.

Another feature which may be implemented using the actuated arm 1000 is to tilt the wafer support pedestal so that different angles of incidence may be obtained for the ion beam relative to the top surface of the wafer 122. For this purpose, the arm 1000 may have sufficient articulation to tilt the wafer support pedestal 120 in any direction as desired. Or, it may tilt it in one direction and then rotate it about the axis of symmetry of the chamber. This feature may be carried out in any of the embodiments described herein.

Figure 10:
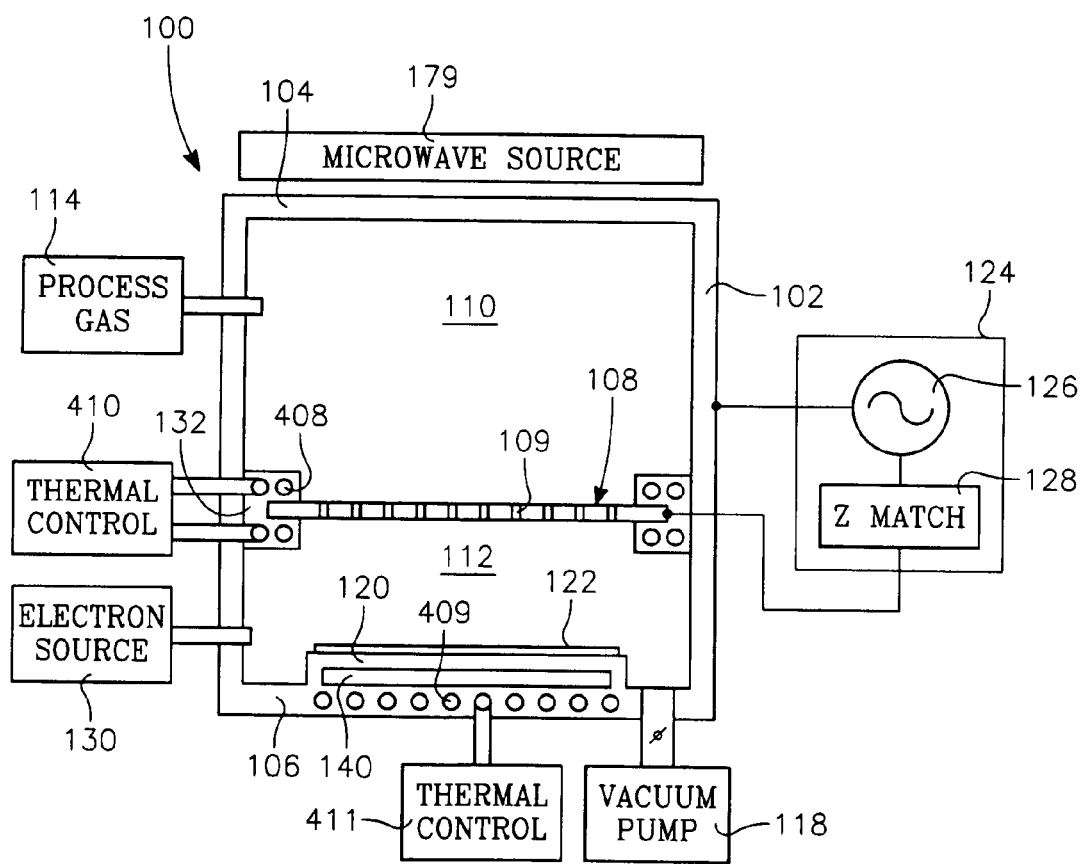
FIG. 10 illustrates a CVD reactor having a single ion shower grid and a microwave plasma source power applicator separate from the grid voltage source.

FIG. 10 illustrates the use of a microwave plasma source power applicator 179 to generate plasma in the upper sub-chamber 110 independently of the grid voltage supply 124.

Referring to FIG. 11, the single grid 108 may be replaced by multiple conductive grids 108a, 108b, 108c, 108d, each having the same structure as the grid 108 of FIG. 1 and stacked in parallel fashion. While FIG. 11 illustrates an embodiment having four parallel stacked ion shower grids 108a-108d, any other suitable number of multiple grids may be chosen, such as two or three or more than four. The openings 109 of successive grids 108a-d are in registration to promote a vertical ion trajectory profile through the multiple grids 180a-d. The multiple grids 108a-d may be driven by a single power source through a multiple tap voltage divider network (like the voltage divider network of 141 of FIG. 5). However, rather than a single voltage source, FIG. 11 illustrates an implementation employing multiple voltage sources: the plasma is driven by a voltage source 180' coupled to an interior conductive surface (102 or 104) of the upper sub-chamber 110; the multiple grids 108a, 108b, 108c, 108d are driven by separately controlled voltage sources 180a, 180b, 180c, 180d, respectively. The upper portion of the side wall 102 facing the upper sub-chamber 110 may be electrically insulated from the portion of the side wall 102 facing the lower sub-chamber 112.

As in the embodiment of FIG. 1, the voltage difference between the upper chamber surface (102 or 104) and the grid 108a produces an attractive grid potential to plasma ions as well as plasma source power for the upper sub-chamber 110. For this purpose, the top grid 108a and the upper chamber surface (102 or 104) act as counter electrodes to one another, and serve to capacitively couple power into the upper sub-chamber 110. The grid voltage sources 180a, 180b, 180c, 180d are connected to respective ones of the grids 108a, 108b, 108c, 108d. While FIG. 11 illustrates an example employing four conductive grids, the number may vary from two grids to more than four grids. As in the single grid 108 of FIG. 1, each of the multiple grids 180a-d of FIG. 11 may be formed of a metal (e.g., aluminum) or of a process-compatible material (e.g., silicon carbide) or may be a metal coated with a thin layer of a process-compatible material.

The drawing of FIG. 11 shows that the voltage sources 180', 180a-180d are referenced to the wafer support pedestal 120. However, they may be referenced in a different manner. The wafer support pedestal may be grounded or it may have a floating potential.

FIGS. 12A through 12E illustrate one way of operating the multiple grids 108a-d so as to distribute the total potential difference between the plasma and the grid voltage among the multiple grids 108a-d. FIGS. 12A through 12E represent the time domain pulsed positive voltages of, respectively, the voltage sources 180', 180a, 180b, 180c, 180d. In FIG. 12A, ions are presented with ever-increasing attractive potentials (relative to the plasma potential of FIG. 12A) starting with the top grid 180a (with the greatest positive voltage) and progressing down to the bottom grid 180d (having the least positive voltage). The voltage sources may generate pulsed D.C. voltages or RF voltages or a combination of both.

FIGS. 13A through 13E illustrates a mode of operating the multiple grids 108a-d in which different grid voltages are employed to focus ion trajectories toward the center of each grid orifice 109 in selected ones of the multiple grids 108a-d, so as to minimize or prevent ion collisions with grid surfaces. In the illustrated example, voltages of alternating polarities are applied to the succession of multiple grids 108a-d shown in FIG. 13A. FIGS. 13B through 13E illustrate the contemporaneous time domain voltage waveforms applied to the individual grids 108a through 108d respectively. The voltage waveforms depicted in FIGS. 13B through 13E are relative to the plasma potential and are peak values, and are provided as tutorial examples only. The top grid 108a is given a small positive (repulsive) voltage (e.g., 10 Volts), while the next grid 180b is given a large negative (attractive) voltage (e.g., −500 Volts). The third grid 108c is given a small positive (repulsive) voltage and the bottom grid 108d is given a large negative (attractive) voltage. The electric fields formed between the grids tend to focus ion trajectories toward the centers of the grid orifices 109. The resulting ion paths are indicated in simplified fashion in FIG. 13A.

An alternative mode of operating the multiple grids 108a-108d is to use the upper grids 108a-108c to accelerate ions from the ion generation sub-chamber 110 through the grid structure as described above, but use the bottom grid 108d as a neutralizer grid to at least partially (if not fully) neutralize the ion beam to create a beam of neutrals incident on the wafer 120. For this purpose, the bottom "neutralizer" grid 108d would have it orifices with exceptionally large aspect ratios and narrow diameters. Furthermore, a suitable neutralizing potential (e.g., ground) could be applied to the grid 108d.

While the number of multiple grids in the illustrated implementation is four, any suitable number of plural grids may be employed.

Figure 14:
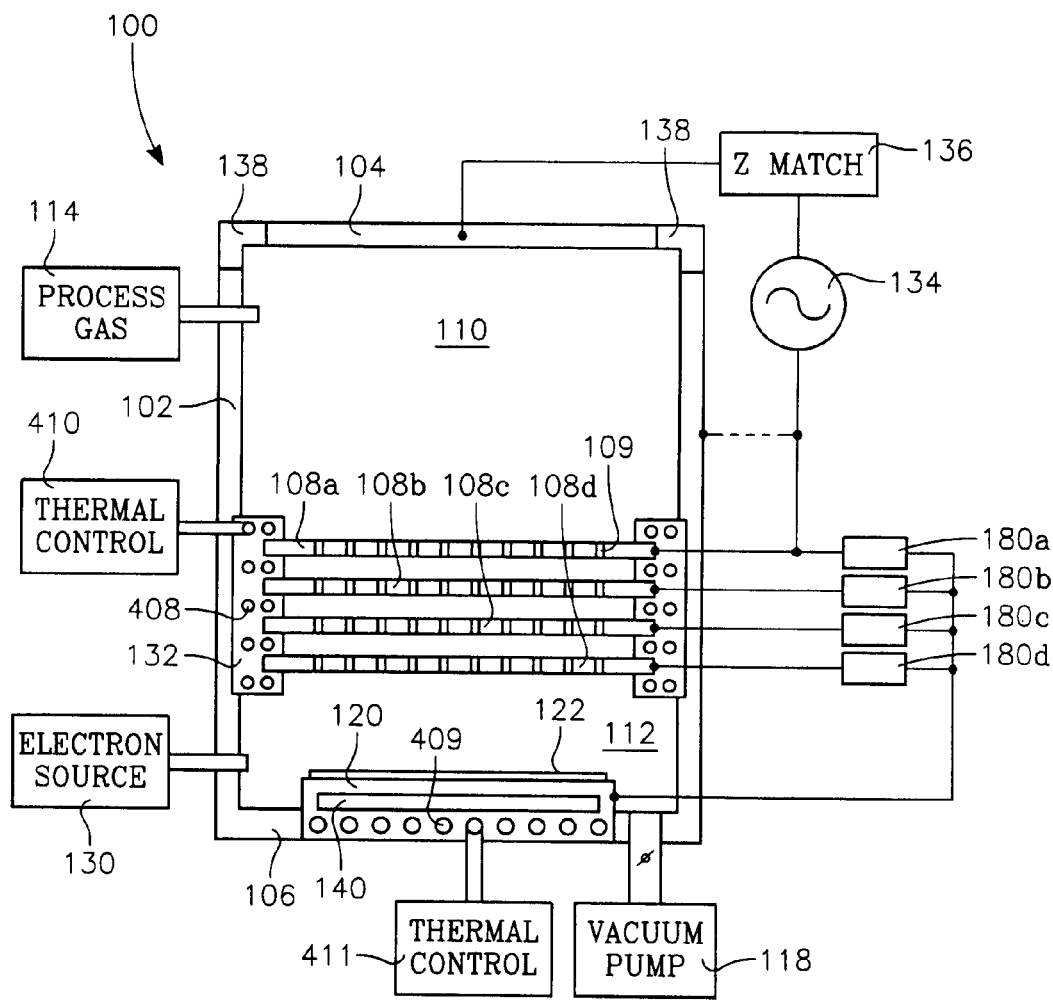
FIG. 14 illustrates a CVD reactor having multiple parallel ion shower grids and multiple grid potential sources and a capacitively coupled plasma source power applicator separate from the grid potential sources.

FIG. 14 illustrates a reactor including the multiple grids 108a through 108d and their voltage sources 180a through 180d, in combination with a capacitively coupled plasma source power applicator that is independent of the grid voltage sources 180a-180d. The capacitively coupled plasma source power applicator includes the top grid 108a and the ceiling 104 as counter electrodes and an RF plasma source power generator 134 connected across the counter electrodes (i.e., the ceiling 104 and the top grid 108a) through an impedance match circuit 136. The top grid 108a is in contact with the plasma in the upper sub-chamber 110, and the plasma potential in the reactor of FIG. 14 is controlled by the voltage on the top grid 108a. The plasma potential is the sum of the grid voltage from the first grid voltage source 180a plus the voltage coupled to the plasma from the RF plasma source power generator 134. In one example, the grid voltage on the first grid 108a was about 5 kV pulsed D.C. and the plasma source power generator produced an RF voltage of about 1000 Volts. Alternatively, as indicated in dashed line, the source power generator 134 may be connected through the impedance match circuit across the ceiling 104 and side wall 102 instead of the top grid 108a.

Figure 15:
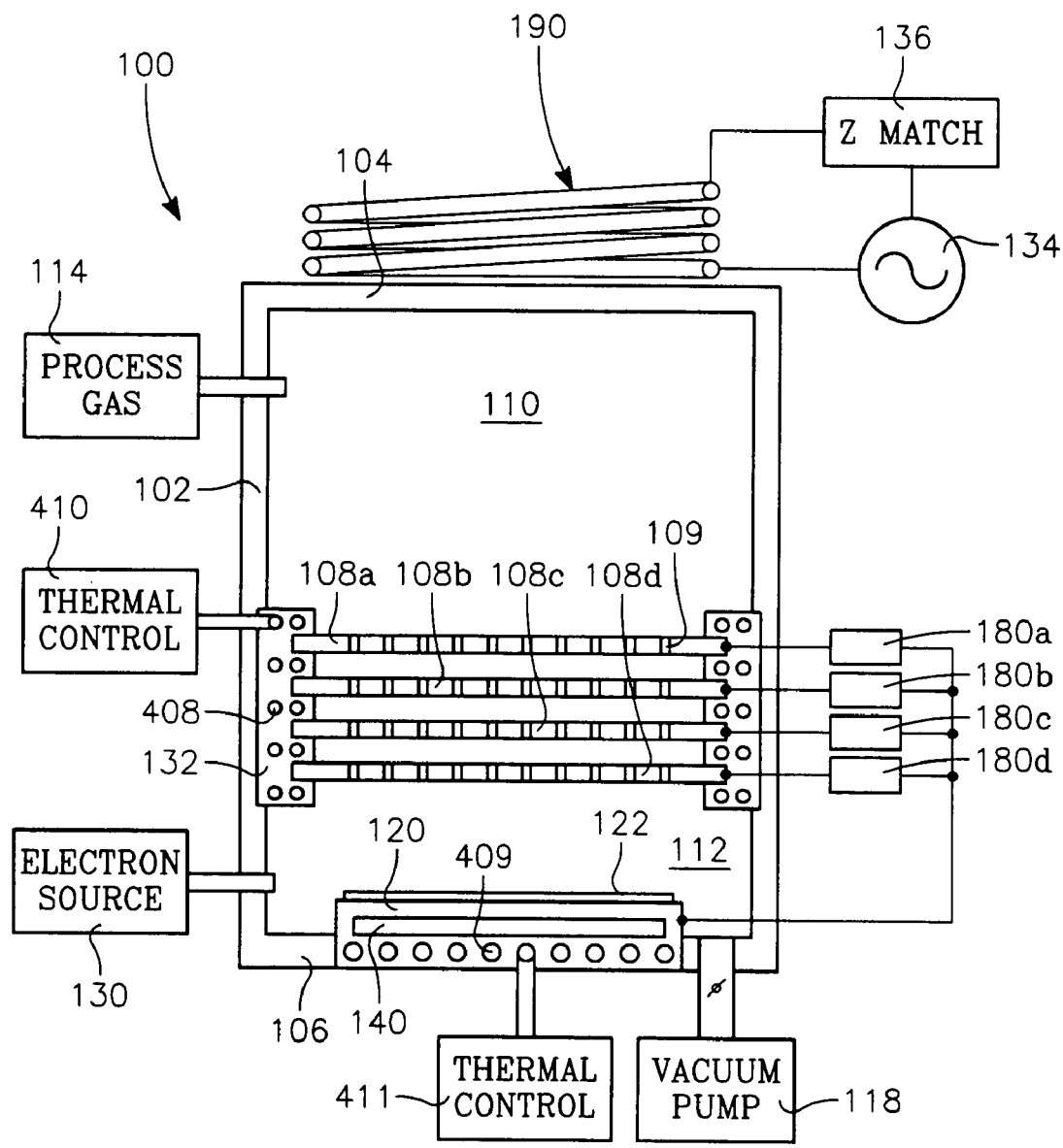
FIG. 15 illustrates a CVD reactor having multiple parallel ion shower grids and multiple grid potential sources and an inductively coupled plasma source power applicator separate from the grid potential sources.

FIG. 15 illustrates a reactor including the multiple grids 108a through 108d in combination with an inductively coupled plasma source power applicator that is independent of the grid voltage sources 180a-180d. The inductively coupled plasma source power applicator includes a coil antenna 190 overlying the ceiling 104, and an RF plasma source power generator 134 connected across the coil antenna 190 through an impedance match circuit 136.

Figure 16:
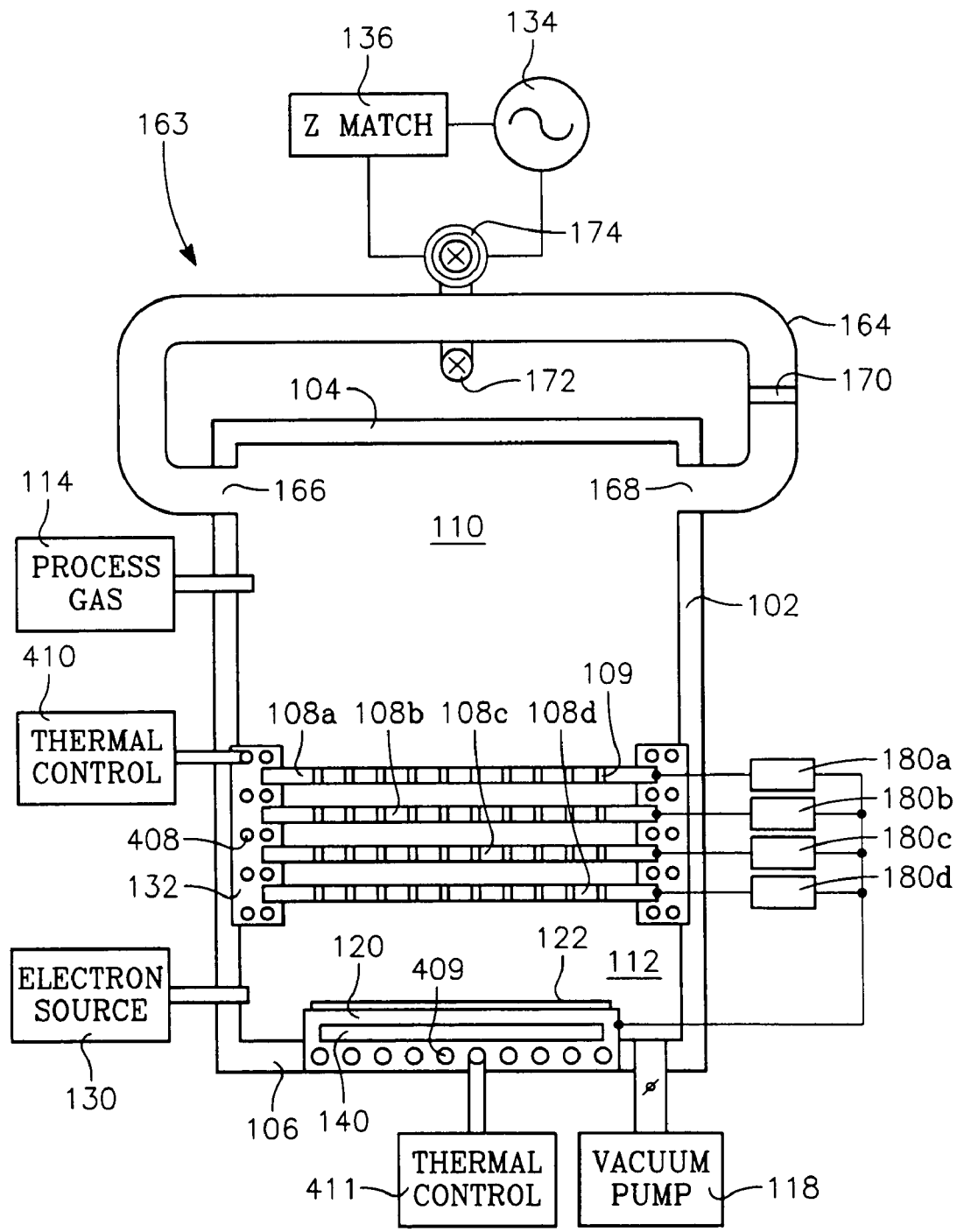
FIG. 16 illustrates a CVD reactor having multiple parallel ion shower grids and multiple grid potential sources and a torroidal plasma source power applicator separate from the grid potential sources.

FIG. 16 illustrates a reactor including the multiple grids 108a through 108d and their voltage sources 180a-180d in combination with a torroidal plasma source power applicator 163 that is independent of the grid voltage sources 180a-180d. The torroidal plasma source power applicator 163 consists of at least one reentrant hollow external conduit 164 connected to opposite sides of the upper chamber 110 at opposing openings or ports 166, 168. The conduit 164 can be conductive and includes a D.C. break 170 filled by an insulating ring. The torroidal plasma source power applicator further includes apparatus for coupling RF power from the generator 134 into the external conduit. This RF coupling apparatus may be implemented, for example, as a ring-shaped magnetically permeable core 172 surrounding a small section of the conduit 164. A coil 174 wrapped around the core 172 is driven by the RF source power generator 134 through the impedance match circuit 136. The RF power coupled by the magnetic core 172 and the RF-driven coil 174 generates an oscillating plasma current circulating in a reentrant path that extends through the external conduit 164 and across the upper sub-chamber between the two ports 166, 168.

Figure 17:
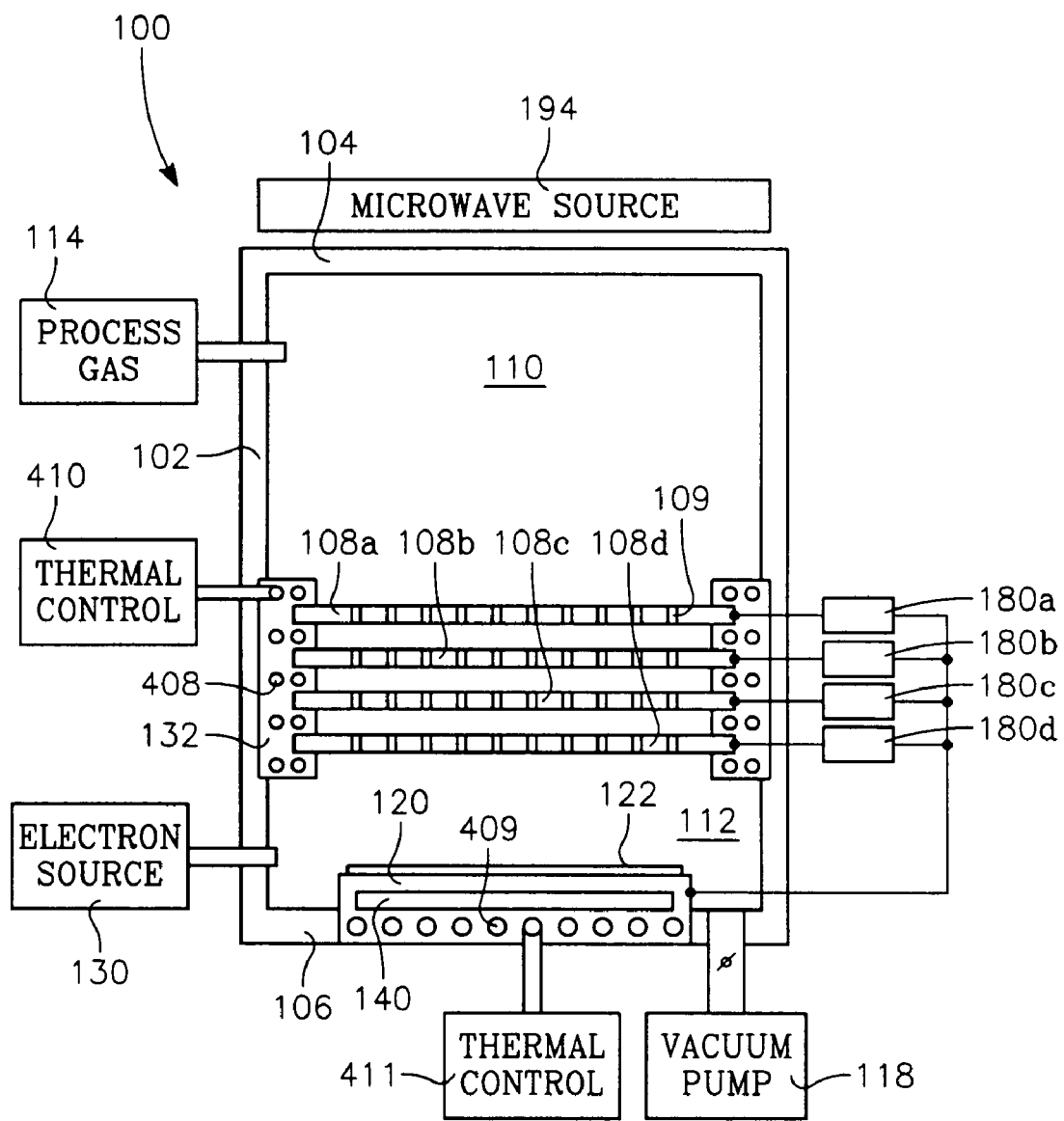
FIG. 17 illustrates a CVD reactor having multiple parallel ion shower grids and multiple grid potential sources and a microwave plasma source power applicator separate from the grid potential sources.

FIG. 17 illustrates a reactor including the multiple grids 108a through 108d in combination with a microwave plasma source power applicator 194 that is independent of the grid voltage sources 180a-180d.

Figure 18:
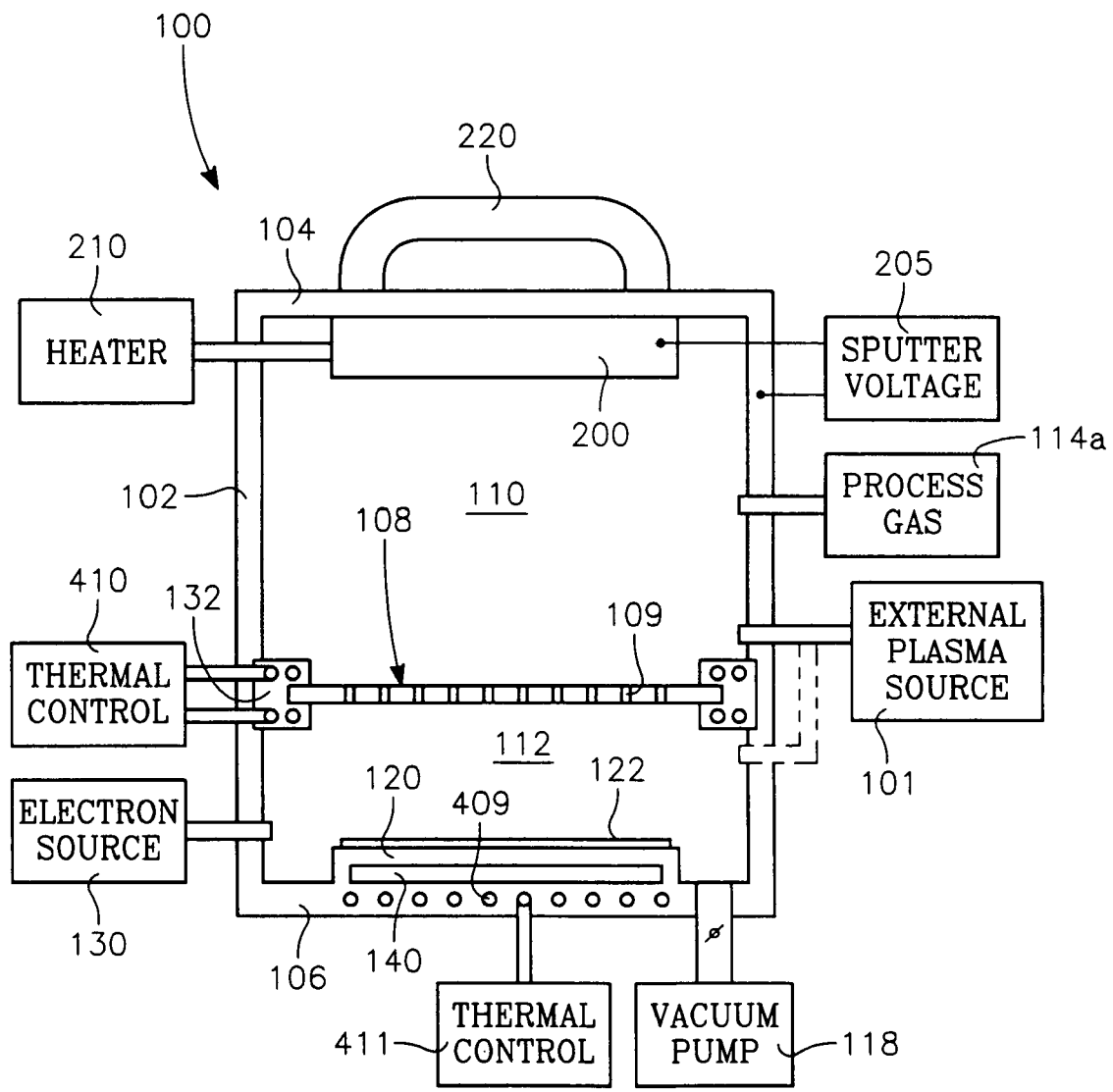
FIG. 18 illustrates a reactive ion sputter deposition reactor having a single ion shower grid.

FIG. 18 illustrates a reactor corresponding to that of FIG. 1, except that the deposition species are not obtained by ionization, but rather by sputtering in the upper sub-chamber 110. The deposition precursor species are therefore provided mostly as neutral atoms. The grid 108 does not attract ions but rather collimates the neutral atoms as they pass from the higher pressure upper sub-chamber 110 to the lower pressure sub-chamber 112. In the example of FIG. 18, the sputtering target is a wafer or block 200 near the chamber ceiling 104, sputtering of the target furnishing a deposition precursor species in atomic form. The target, wafer or block 200 is comprised of the deposition precursor species, which may be a semiconductor material such as silicon or silicon carbide, for example, or other compounds of silicon. Sputtering is produced by a sputter voltage source 205 connected across the sputter target 200 and the chamber side wall. The sputter voltage source 205 may generate a relatively high voltage (e.g., 5000 Volts), and may be a D.C. or pulsed or RF source. In the case of a silicon target, if the sputter voltage source 205 generates an RF voltage, then the frequency can be made to be sufficiently great to ensure capacitive coupling of power throughout the silicon block or wafer 200 so that it is more uniformly sputtered. A sputtering gas (such as an inert species like Argon) is introduced from the gas supply 114a. A heater 210 can maintain the temperature of the silicon target 200 at a suitably elevated temperature. The sputtering process is enhanced by including a magnet 220 overlying the ceiling directly above the silicon target 200. The magnet 220 promotes bombardment of the target by ions generated by the electric filed imposed by the high voltage source 205.

In order to deposit silicon dioxide, oxygen must be introduced into the reactor chamber 100. In one case, a gas supply 215 and an inlet 217 provides the oxygen gas into the lower sub-chamber 112 near the wafer 120. In another case, the gas supply 215 furnishes oxygen instead of Argon, so that the oxygen gas is the sputtering gas as well as a deposition precursor species. Alternatively, ozone may be employed instead of or in addition to the oxygen gas. The oxygen or ozone ions dissociate to oxygen atoms and the oxygen and silicon atoms combine on the surface of the wafer 122 to form silicon dioxide.

The grid 108 collimates the silicon atoms (and oxygen atoms) as they drift from the upper sub-chamber 110 into the lower sub-chamber 112 so that their trajectories have a narrow angular distribution centered about the vertical direction. This enables the silicon and oxygen atoms to reach the bottom of HAR openings in small geometry devices instead of being deposited on the vertical side walls of the openings. As a result, HAR openings are filled from the bottom with CVD-deposited silicon dioxide before pinch-off can occur. This process may be referred to as reactive physical vapor deposition (PVD). Since the collimated particles are mostly neutral, the grid 108 in the embodiment of FIG. 18 is not connected to any electrical source.

One advantage the reactive PVD process performed by the reactor of FIG. 18 is that the source is pure. There is a minimal amount of extraneous species, such as hydrogen. For example, in CVD processes employing silane and oxygen gases, for every atom of silicon that is deposited on the wafer, four atoms of hydrogen are dissociated into the plasma. This increases the gas pressure for a given amount of silicon in the plasma. In the reactive PVD process, however, there are no extraneous species, the only species present being silicon and oxygen, both of which are constituents in the deposited layer. This opens the process window with respect to chamber pressure and furthermore reduces unproductive reactions with extraneous species. In order to provide another source of oxygen, the target 200 may be silicon dioxide rather than silicon.

While the example of silicon dioxide deposition is discussed with reference to the reactor of FIG. 18, other materials may be deposited. For example, silicon nitride may be deposited, in which case the target 200 is a silicon wafer while the gas is nitrogen instead of oxygen. Or, a hydride of silicon nitride may be deposited, using a silicon target 200, nitrogen gas and hydrogen gas. In all of the foregoing examples, no extraneous species are introduced into the plasma, with the exception of Argon atoms in the case in which Argon is employed as the sputtering species.

Figure 19:
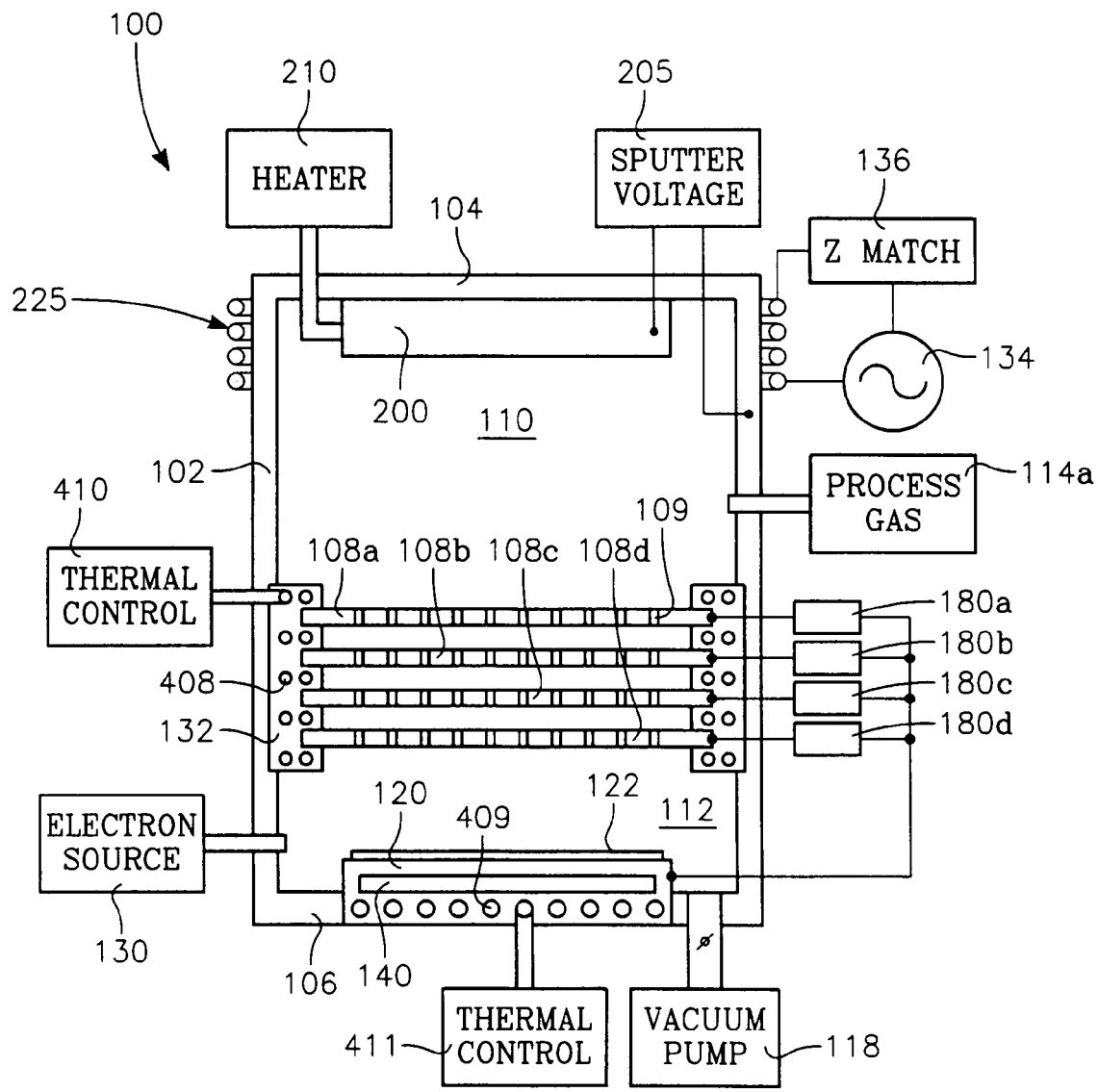
FIG. 19 illustrates a CVD reactor having an ion sputter source, multiple ion shower grids and an inductively coupled plasma source power applicator.

Performance of the reactor of FIG. 18 may be enhanced by providing a plasma source power applicator to ionize the gas and the silicon atoms sputtered from the target 200. In the case of a pure oxygen gas, this provides a plasma containing only silicon and oxygen. FIG. 19 illustrates a PVD reactor having the features of FIG. 18 and further having an inductively coupled plasma source power applicator consisting of a coil antenna 225 driven by an RF source power generator 230 through an impedance match circuit 235. In the implementation of FIG. 19, the coil antenna 225 is located along the chamber side wall 102 so that the target 200 does not shield the antenna 225 from the chamber interior. Alternatively, the target 200 may be a semiconductor material with a selected conductivity that permits inductively coupling through the target 200 at the frequency of the RF generator 134, so that the antenna may be located on the ceiling 104. As a further alternative, the coil antenna 225 may be located inside the reactor chamber below the target 200. Since the inductively coupled source power applicator can produce a relatively high density plasma, great advantage can be gained by driving the grid(s) 108 with a voltage attractive to ions in the plasma, as in the embodiment of FIG. 3. Specifically, the grid voltage (s) can be adjusted to narrow the angular distribution of ion trajectory about the vertical direction to enhance the filling of HAR openings in small geometry devices. FIG. 19 shows that instead of a single grid, multiple grids 108a through 108d may be used driven by respective grid voltage sources 180a through 180d. If only a single grid is present or if the multiple grids 108a-108d are used, they may be operated in the same manner as described above with reference to FIGS. 1-17.

Figure 20:
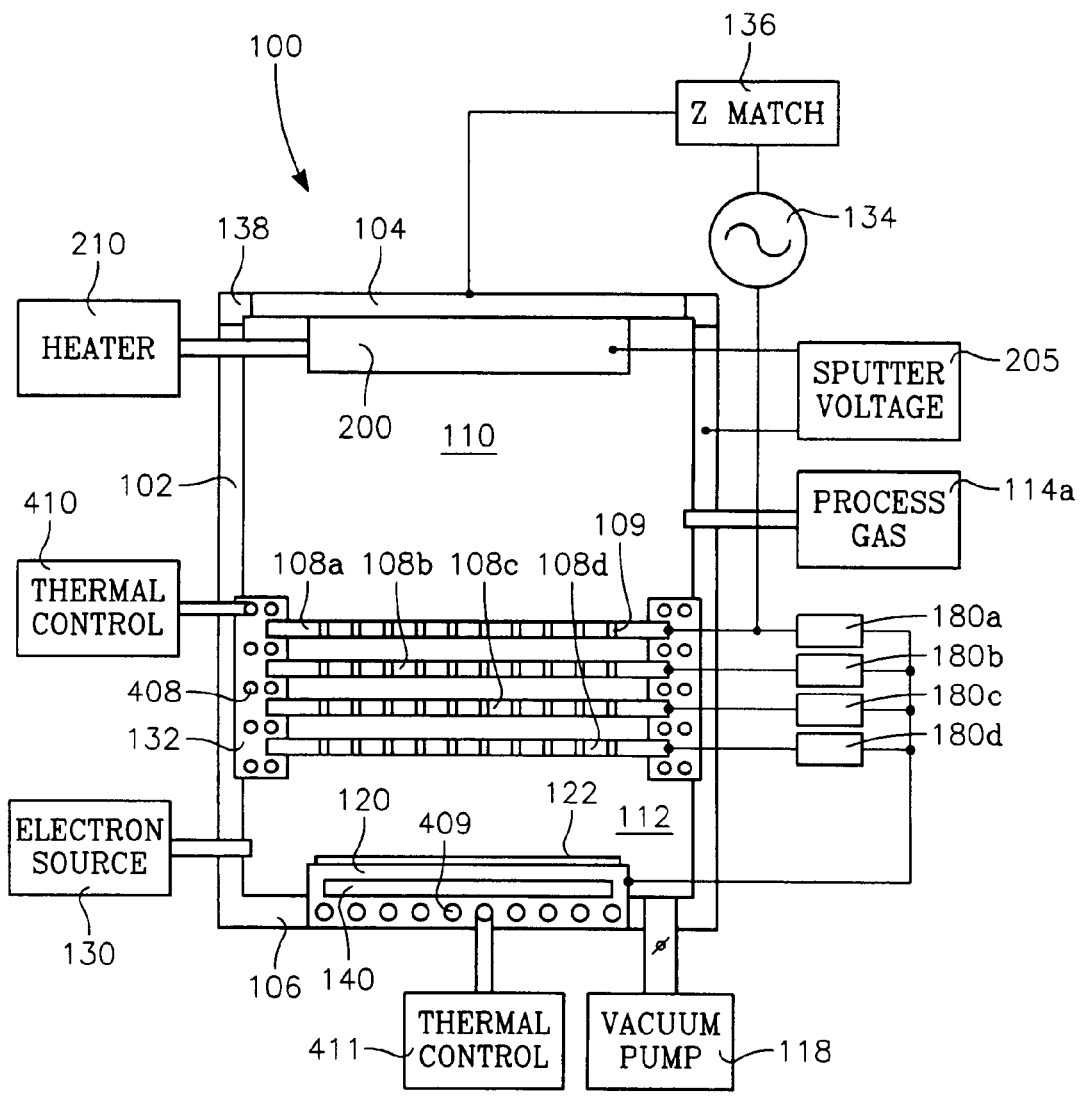
FIG. 20 illustrates a CVD reactor having an ion sputter source, multiple ion shower grids and a capacitively coupled plasma source power applicator.

FIG. 20 illustrates the combination of a reactive PVD reactor of the type illustrated in FIG. 18 further having multiple grids 108a-108d and a capacitively coupled plasma source power applicator. The capacitive source power applicator includes the ceiling 104 and the top grid 108a functioning as counter electrodes driven by the RF plasma source power generator 134 through the impedance match circuit 136.

Figure 21:
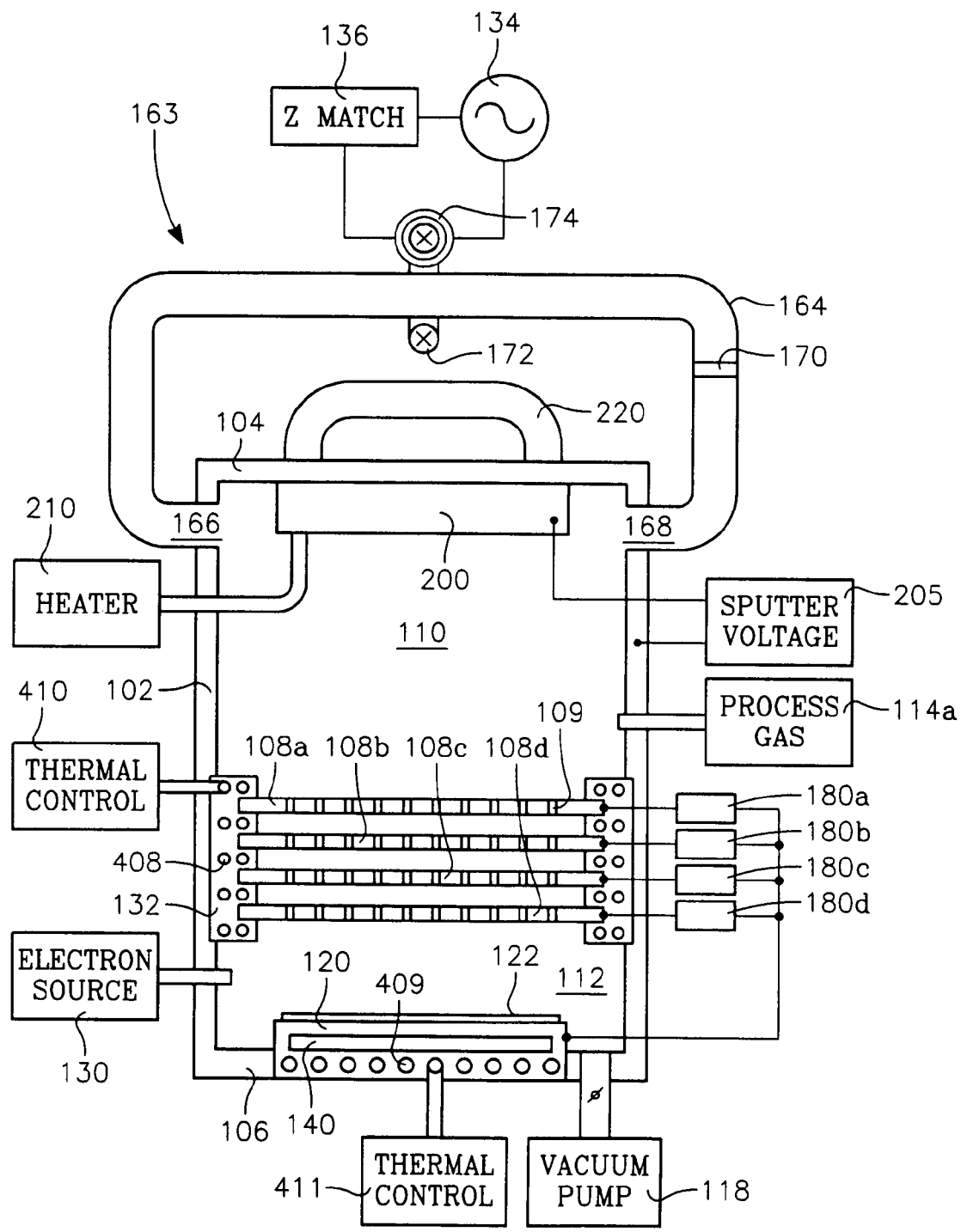
FIG. 21 illustrates a CVD reactor having an ion sputter source, multiple ion shower grids and a torroidal plasma source power applicator.

FIG. 21 illustrates the combination of a reactive PVD reactor of the type illustrated in FIG. 18 further having multiple grids 108a-108d and a torroidal plasma source power applicator 163. The torroidal plasma source power applicator consists of at least one reentrant hollow external conduit 164 connected to opposite sides of the upper chamber 110 at opposing openings or ports 166, 168. The conduit 164 can be conductive and includes a D.C. break filled by an insulating ring 170. The torroidal plasma source power applicator further includes apparatus for coupling RF power from the generator 134 into the external conduit. This RF coupling apparatus may be implemented, for example, as a ring-shaped magnetically permeable core 172 surrounding a small section of the conduit 164. A coil 174 wrapped around the core 172 is driven by the RF source power generator 134 through the impedance match circuit 136. The RF power coupled by the magnetic core 172 and the RF-driven coil 174 generates an oscillating plasma current circulating in a reentrant path that extends through the external conduit 164 and across the upper sub-chamber between the two ports 166, 168.

Figure 22:
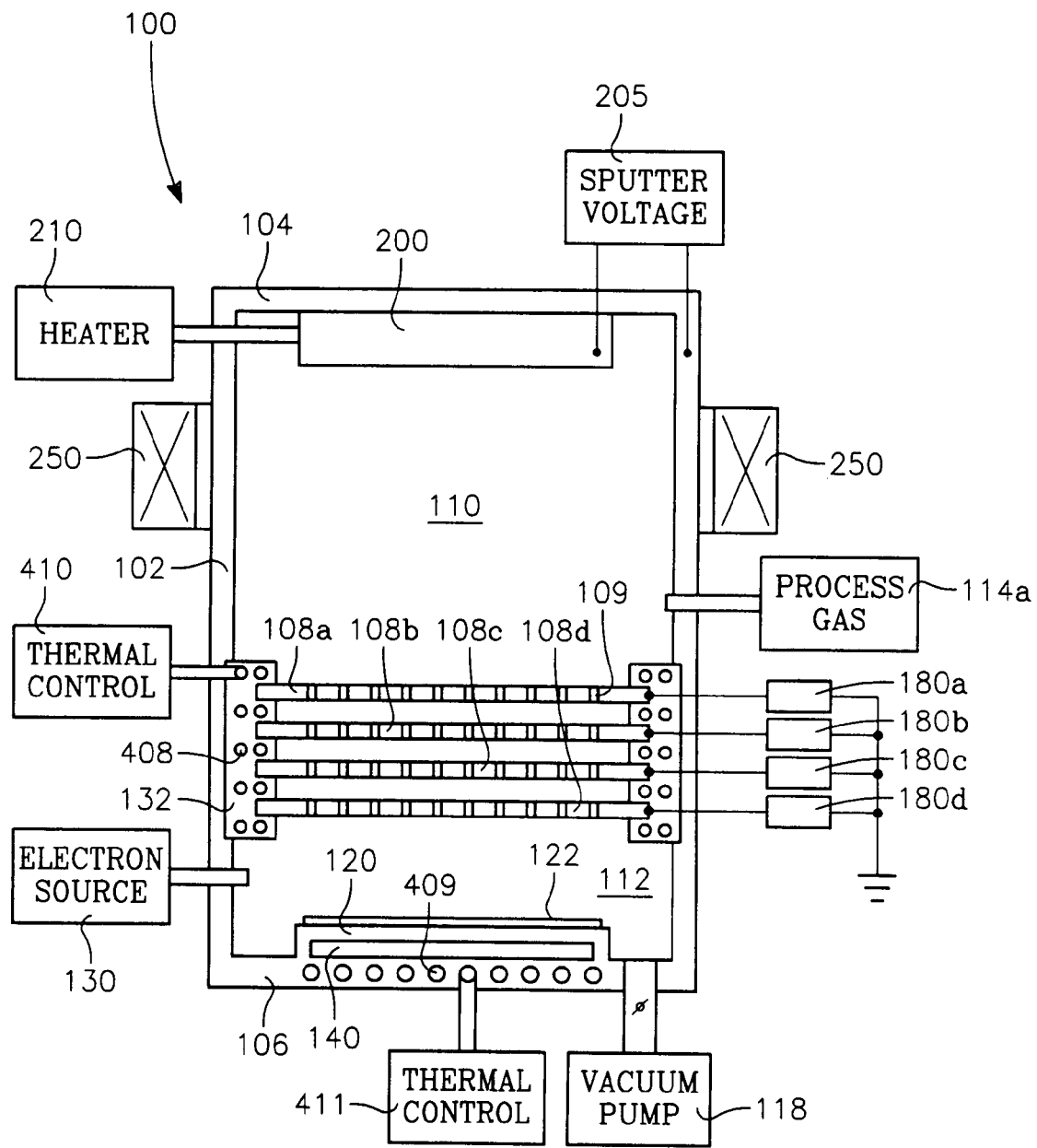
FIG. 22 illustrates a CVD reactor having an ion sputter source, multiple ion shower grids and a microwave plasma source power applicator.

FIG. 22 illustrates a PVD reactor of the type illustrated in FIG. 18 further having multiple grids 108a-108d and a microwave plasma source power applicator 250.

Figure 23:
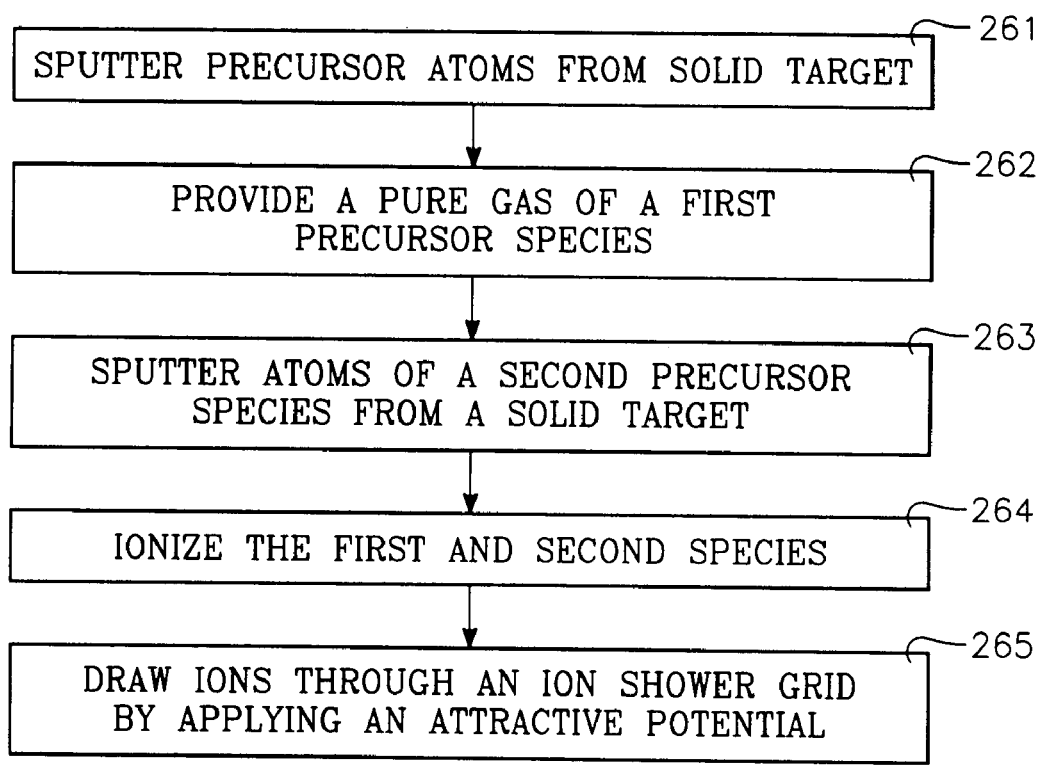
FIG. 23 depicts a process of which the reactors of FIGS. 19-22 are capable of performing.

In the PVD reactors of FIGS. 18-22, a chemical vapor deposition process is performed in accordance with the steps of FIG. 23, as follows: Furnish a pure gas of a first deposition precursor species, e.g., oxygen or nitrogen (block 261 of FIG. 23). Sputter atoms from a pure solid target 200 of a second deposition precursor species, e.g., silicon (block 262). Ionize the atoms of the first and second species (block 263). Produce a pressure drop across an ion shower grid 108 separating the plasma generation region 110 from the wafer 122. And, apply an attractive potential to the ion shower grid 108 to produce a collimated ion flux of the first and second species covering the area of the wafer 122 (block 264 of FIG. 23). Additional steps include increasing the attractive (ion acceleration) potential of the grid 108 until the angular distribution of ion trajectories at the wafer surface is sufficiently narrow to prevent pinch off in HAR openings (block 265). Or, the attractive grid potential is increased sufficiently to suppress at the wafer surface the population of thermal neutrals while promoting the population of ions and fast neutrals.

In the CVD reactors of FIGS. 1-17 and 19-22, the ion acceleration voltage on the grid 108 or multiple grids 108a-d was created by applying a large positive potential to the plasma and lesser potential(s) to the grid 108 or successive grids 180a-108d, the wafer 122 being at the minimum potential (ground). As a result the plasma chamber including the ceiling 102 and side wall 104 and any source power applicator are at such a high potential that they must be carefully isolated. In an alternative arrangement, the applied grid voltage is negative, the voltages being reversed. The plasma is placed at the lowest potential (neglecting the potential induced by the plasma source power applicator), and negative pulsed voltages are applied of progressively greater magnitudes starting from the grid 108 (or top grid 108a in multi-grid embodiments) and culminating at the greatest negative voltage at the wafer support pedestal 120. One advantage of this alternative arrangement is that that wafer support pedestal 120 is at the highest voltage and must be electrically isolated. (In contrast, in the above-described embodiments, in general the upper chamber 110 is at the highest potential and therefore must be electrically isolated.) A high voltage wafer pedestal can be provided as disclosed in U.S. patent application Ser. No. 10/646,458, filed Aug. 22, 2003, entitled PLASMA IMMERSION ION IMPLANTATION APPARATUS INCLUDING A PLASMA SOURCE HAVING LOW DISSOCIATION AND LOW MINIMUM PLASMA VOLTAGE by Kenneth S. Collins et al. and assigned to the present assignee.

Leaving the plasma at the minimum negative potential (e.g., ground) and maintaining the wafer support pedestal 120 at the greatest negative potential is particularly suitable for cases in which the plasma source power applicator imparts only a small voltage to the plasma. This is the case in FIG. 24 in which the plasma source power applicator is a torroidal plasma source, which can raise the plasma potential by as little as 100 Volts, for example, while still attaining an adequate plasma ion density. The torroidal plasma source power applicator 163 consists of at least one reentrant hollow external conduit 164 connected to opposite sides of the upper chamber 110 at opposing openings or ports 166, 168. The conduit 164 can be conductive and includes a D.C. break filled by an insulating ring 170. The torroidal plasma source power applicator further includes apparatus for coupling RF power from the generator 134 into the external conduit. This RF coupling apparatus may be implemented, for example, as a ring-shaped magnetically permeable core 172 surrounding a small section of the conduit 164. A coil 174 wrapped around the core 172 is driven by the RF source power generator 134 through the impedance match circuit 136. The RF power coupled by the magnetic core 172 and the RF-driven coil 174 generates an oscillating plasma current circulating in a reentrant path that extends through the external conduit 164 and across the upper sub-chamber between the two ports 166, 168.

Figure 24:
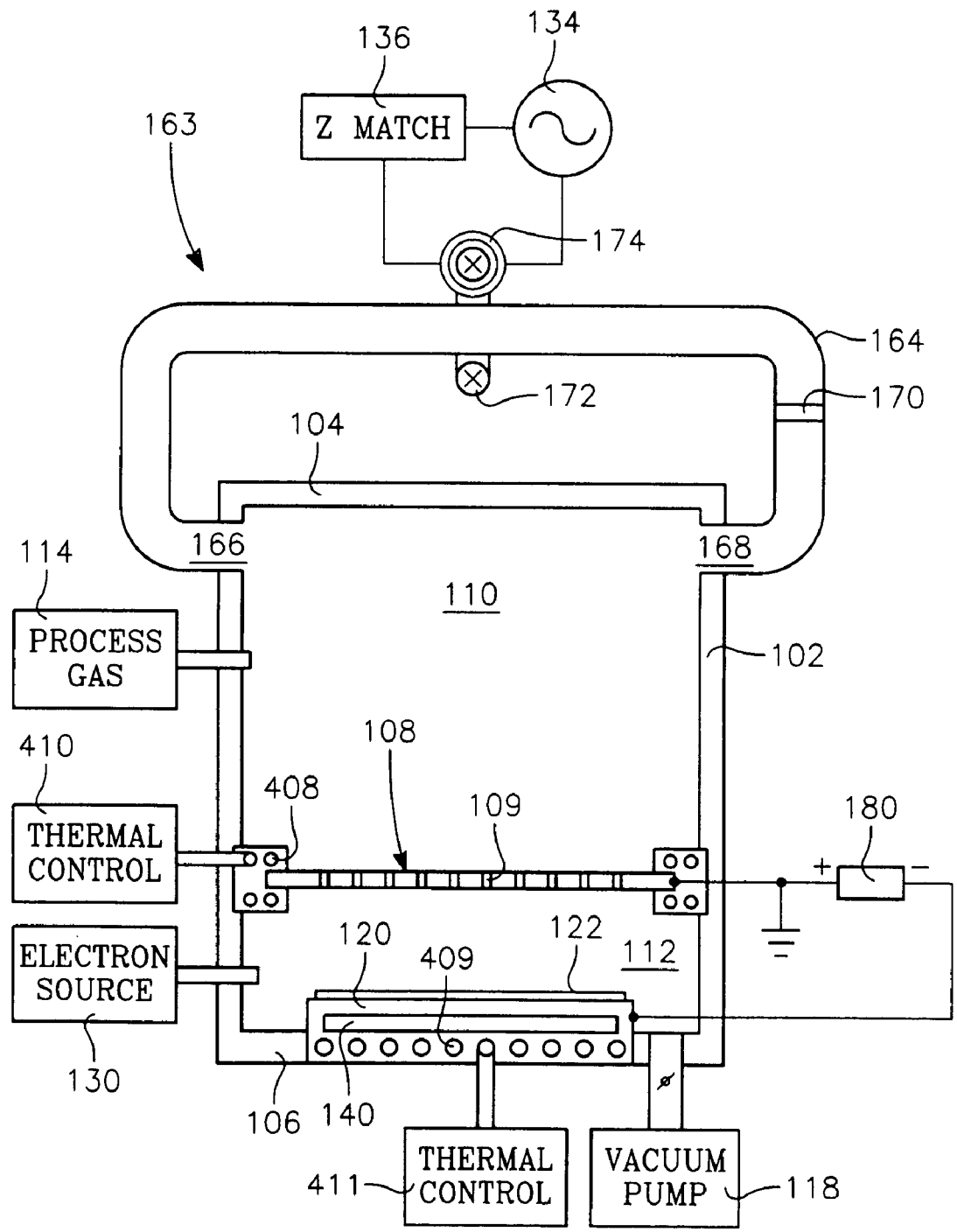
FIG. 24 depicts a CVD reactor with a torroidal plasma source and an ion shower grid driven in reverse mode.
Figure 25A:
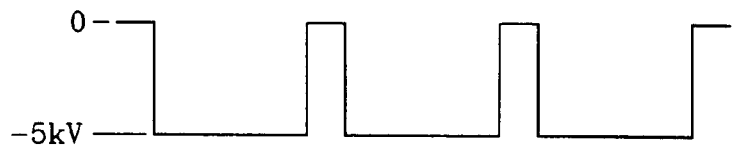
FIGS. 25A and 25B are contemporaneous time domain waveforms of an applied pulsed D.C. grid potential and the plasma potential, respectively, in the embodiment of FIG. 24.
Figure 25B:
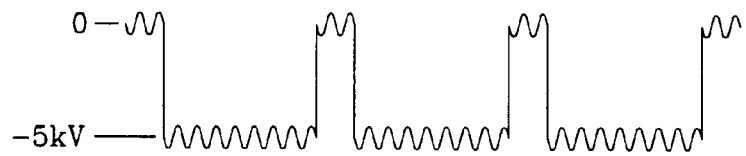

In the embodiment of FIG. 24, there is a single ion shower grid 108 and a single grid voltage supply 180. The grid 180 and the wafer pedestal 120 may be electrically insulated from one another and/or from the chamber surfaces such as the side wall 102 and/or the ceiling 104. FIG. 25A depicts the time domain waveform of the negative voltage D.C. pulses applied by the grid voltage supply 180 (e.g., 5 kV pulses). In the reactor of FIG. 24, the negative output of the grid voltage supply 180 is connected to the wafer support pedestal 120, while the opposite (return) terminal of the grid voltage supply 180 is connected to the grid 108. In this way, the plasma is at a very low voltage (e.g., 100 Volts RF centered at 0 Volts D.C.) while the wafer 122 is at a maximum negative voltage (e.g., −5 kV). FIG. 25B illustrates the resulting wafer-to-plasma potential which is a superposition of the 5 kV voltage of the grid voltage source 180 and the 100 V output of the RF source power generator 134.

Figure 26:
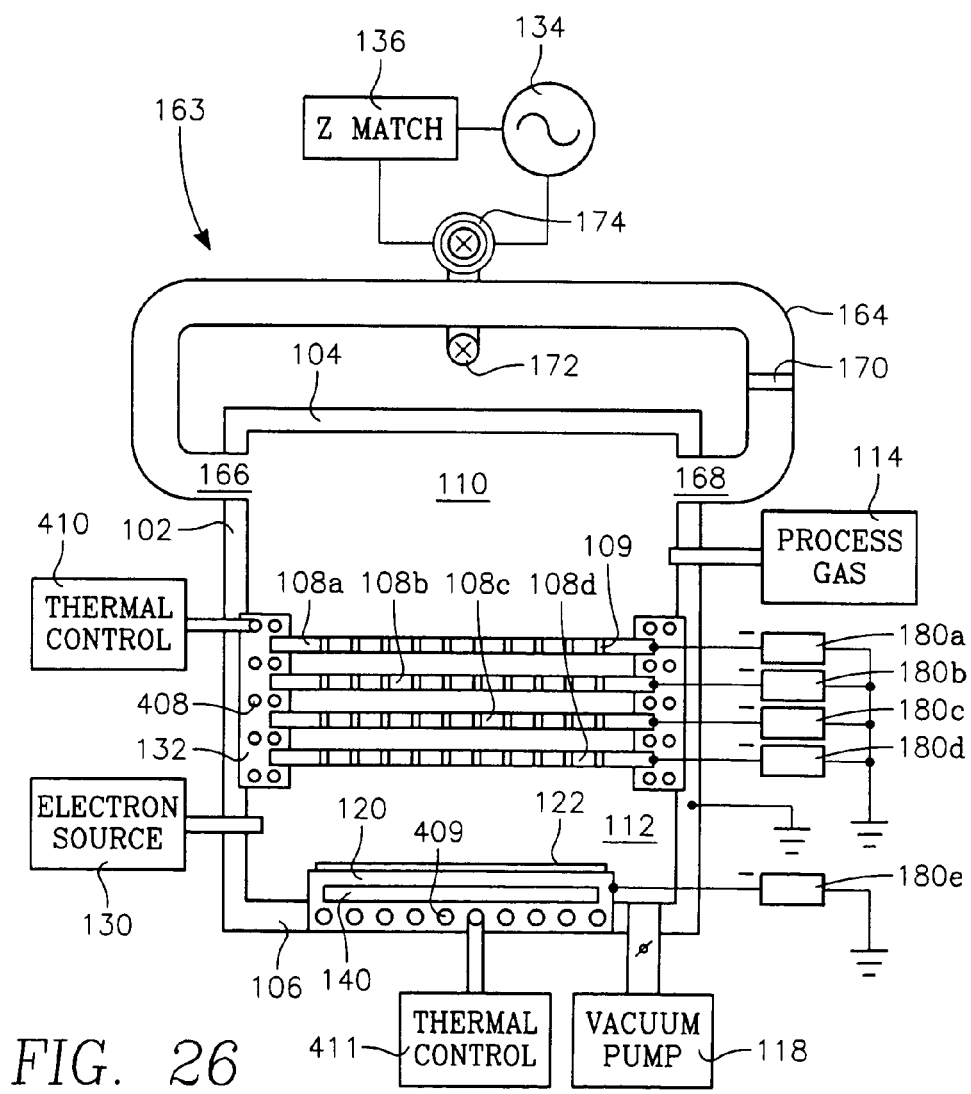
FIG. 26 depicts a CVD reactor with a torroidal plasma source and multiple ion shower grids driven in reverse mode.

FIG. 26 illustrates how the reactor of FIG. 24 may be modified by introducing multiple ion shower grids 108a through 108d and corresponding grid voltage supplies 180a through 180d. In addition, a voltage supply 180e drives the wafer support pedestal 120. In one implementation, each of the voltages sources 180a-180e has its negative output connected to the respective grid/pedestal and its return terminal connected to a common return, as indicated in FIG. 26. The reactor of FIG. 26 may be operated in the manner of FIGS. 12A through 12E so as to apply successively more attractive potentials from the top grid 108a to the bottom grid 108d, and applying the most attractive potential (i.e., the most negative) to the wafer support pedestal 120. The voltage sources 180a-180e may be referenced to the plasma by connecting their common return to an upper chamber surface 102 or 104. In another aspect, the reactor of FIG. 26 may be operated in a mode analogous to that of FIGS. 13A through 13E, in which voltages of alternate polarities are applied to the succession of grids 180a-180d so as to focus ions toward the centers of the grid orifices 109, except that in the embodiment of FIG. 26 the attractive voltages are negative in this mode.

Each voltage source 180a, 180b, 180c, 180d, 180e may either produce a pulsed D.C. voltage or an RF sinusoidal voltage. If an RF voltage is produced, then each voltage source can include an RF generator and an impedance match circuit.

Figure 27:
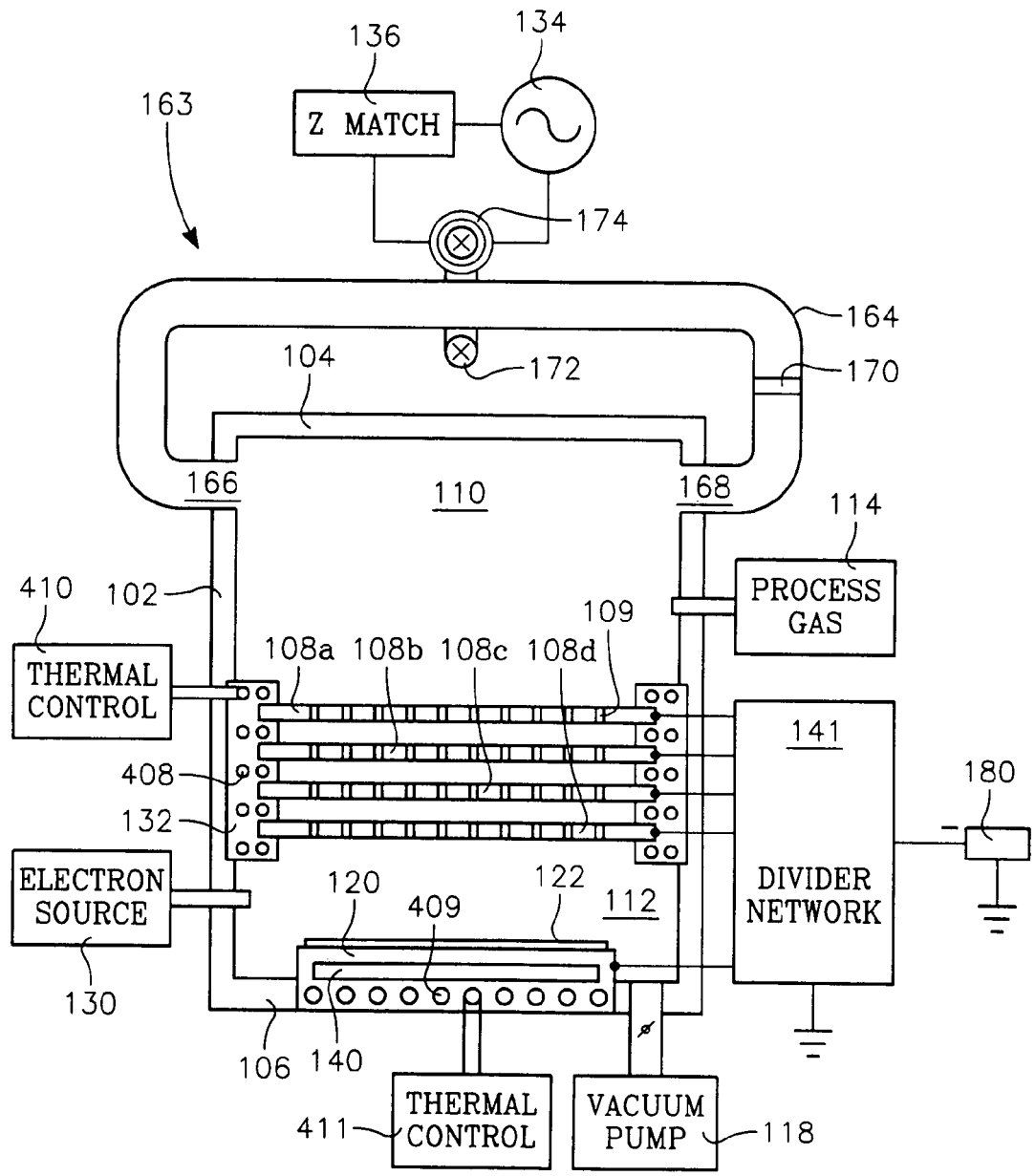
FIG. 27 depicts a CVD reactor with a torroidal plasma source and multiple ion shower grids driven in reverse mode using a single grid voltage source and a voltage divider with multiple outputs.

FIG. 27 illustrates how the multiple ion shower grids of FIG. 26 may be driven by a single voltage source through a voltage divider network 141 of the type described above with reference to FIGS. 5 and 6.

In the foregoing embodiments, the voltage applied to the wafer support pedestal 120, for example by the grid voltage supply 180 in the embodiment of FIG. 24 or by the grid voltage supply 180e in the embodiment of FIG. 26, may have an RF component in addition to a pulsed or pulsed D.C. component. The RF component aids in selecting or adjusting the ion energy distribution or may aid in discharging the wafer or avoiding excessive charge build-up on the wafer surface.

The spacing between adjacent orifices 109 in the grid 108 or in each multiple grid 108a-d determines the number of orifices the grid and therefore controls the gas conductance and the pressure drop, which is inversely proportional to the gas conductance. It also determines the thermal conductance across the diameter of the grid upon which the thermal controller 410 (FIG. 1) depends. By limiting the number of orifices 109 in the grid 108, the grid thermal conductance enhanced and the pressure drop between the sub-chambers 110, 112 is also enhanced. The pressure drop enhances the population of vertically traveling ions in the lower sub-chamber 112 by reducing the ion-neutral collision frequency and lengthening the ion-neutral mean free path length. The orifice length (aspect ratio) is determined by the grid thickness and should be limited to avoid excessive ion losses by recombination on the internal surfaces of the grid orifices 109. On the other hand, the length must be sufficient to promote a narrow distribution of vertical ion trajectories about the perpendicular relative to the wafer surface. There should be some divergence in the ion trajectory distribution to enable ions to traverse the orifice-to-orifice spacing in the grid 108 by the time they reach the wafer 122 for uniform deposition on the wafer surface. This is attained by a combination of limited orifice aspect ratio and sufficient grid-to-wafer gap length. A longer gap length is accommodated without creating excessive ion scattering in the lower sub-chamber 112 by imposing a sufficient pressure drop across the grid 108 (to keep the lower sub-chamber pressure very low so as to limit ion-neutral collisions.

Figure 28A:
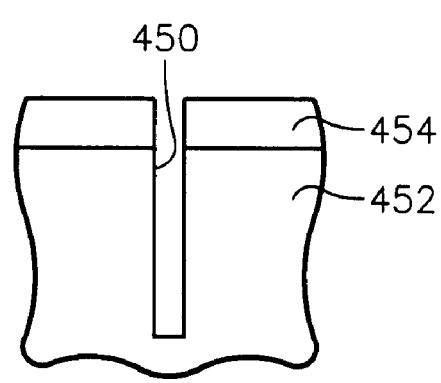
FIGS. 28A, 28B, 28C and 28D depict the CVD process carried out on a shallow isolation trench in accordance with the invention.
Figure 28B:
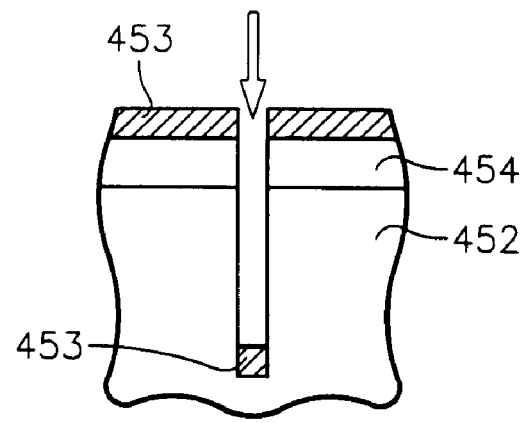
Figure 28C:
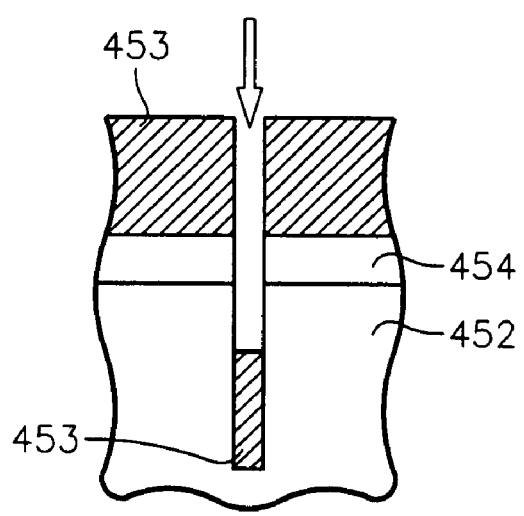
Figure 28D:
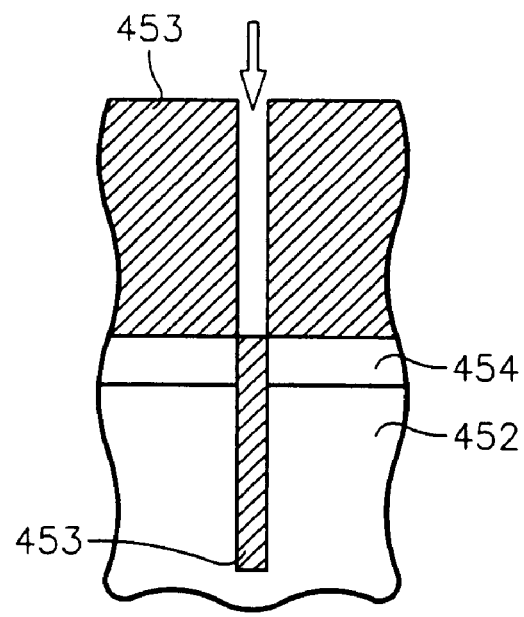

FIGS. 28A through 28D depict the filling of a shallow isolation trench in a semiconductor wafer by a CVD process performed by the reactor of any one of FIG. 1-17 or 19-26. The shallow isolation trench 450 (FIG. 28A) may be formed in a semiconductor substrate 452 and an overlying dielectric layer 454 (such as a field oxide layer). The trench 450 may have an aspect ratio as high as ten and may have a width on the order of only 65 nm or smaller. The extremely narrow distribution of ion trajectories about the vertical direction of which these reactors are capable enables nearly all of the ions incident within the diameter of the trench 450 to travel all of the way to the bottom of the trench 450 where they begin to fill the trench from the bottom up (FIG. 28B). The deposited material 453 is indicated by hatching. In FIG. 28C, the trench 450 is about half filled and in FIG. 28D the trench 450 is completely filled without any voids. In this stage of the wafer processing, there are no features present that can be distorted or diffused by high temperatures, such as doped source and drain regions in the substrate, for example, and therefore the deposited layer may be annealed if desired. Moreover, a higher ion flux and energy may be used without regard to plasma heating of the wafer. In fact, it may be beneficial to heat the wafer to an elevated temperature, for a higher quality deposited layer 453 in the trench 450. The wafer thermal controller 411 (FIG. 1) may be employed to elevate and control the wafer temperature for this purpose. For other applications, it may be beneficial to cool the wafer with the wafer pedestal thermal controller 411.

Figure 29:
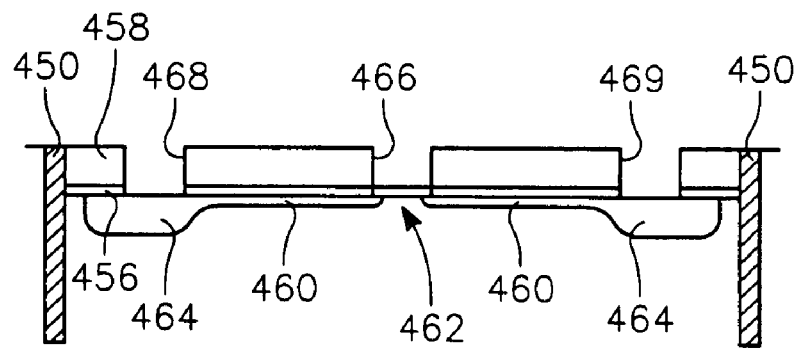
FIGS. 29, 30A and 30B depict a pre-metal CVD process.
Figure 30A:
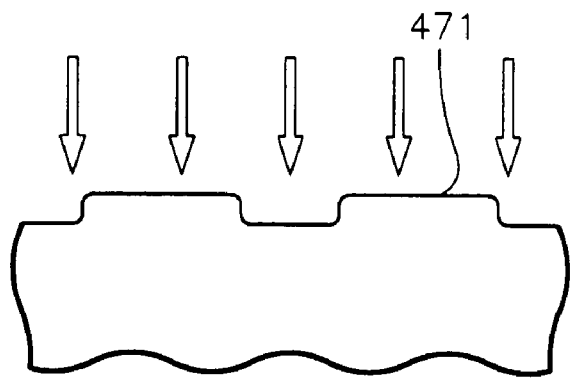
Figure 30B:
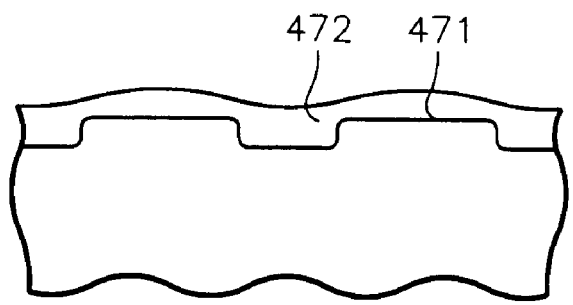

FIGS. 29, 30A and 30B illustrate changes in the semiconductor thin film surface during a pre-metal deposition process. FIG. 29 corresponds to the beginning of the pre-metal deposition process and depicts an enlarged view of the thin film structure of a metal oxide semiconductor field effect transistor (MOSFET) prior to the deposition of metal. The structure includes the substrate 452, the isolation trenches 450, a thin gate silicon dioxide layer 456, an overlying dielectric layer 458. In the surface of the substrate there are source and drain shallow extensions 460 facing one another across a channel region 462, and deep source and drain contacts 464 joined with the shallow source and drain extensions 460. A gate contact hole 466 is formed over the channel through the dielectric layers 456, 458 and source/drain contact holes 468,

469 are formed over the deep source/drain contacts 464 through the dielectric layers 456, 458.

FIG. 30A is a much wider view of the same wafer as FIG. 29 except that the small MOSFET structures are not clearly visible in this wider view. What FIG. 30A does show is the non-uniform nature of the top surface formed by the structural features of FIG. 29. The abrupt vertical transitions or mesas 471 on the surface make metal coverage very difficult. Therefore, a CVD process is performed to deposit a high quality dielectric layer over this structure having more gradual vertical transitions. The CVD process described above may be performed with any of the reactors of FIGS. 1-26 to produce a passivation layer 472 shown in FIG. 30B. The gate contact holes 466 and the source/drain contact holes 468, 469 of FIG. 29 are continued through the passivation layer 472 of FIG. 30B.

The reactor performance may be enhanced by reducing contamination during processing. This is accomplished by carrying out a pre-process chamber seasoning step before the production wafer 122 is inserted into the chamber. In this seasoning step, the interior chamber surfaces are coated with a thin anti-contamination layer consisting of a process-compatible material. Such a process-compatible material depends upon the particular process to be performed by the reactor, and may be silicon dioxide or silicon nitride, as two possible examples. This pre-process chamber seasoning step is carried out the using the plasma source power applicator provided in most of the foregoing embodiments. In carrying out the pre-process chamber seasoning step, a suitable precursor gas such as silane and oxygen or silane and nitrogen is introduced in to the chamber, and a plasma is struck and maintained by the plasma source power applicator for a sufficient amount of time and at a sufficient source power level/plasma density to coat the interior chamber surfaces with the anti-contamination coating to the desired thickness. The grid 108 or grids 108*a-d* may be energized to draw the plasma from the ion generation sub-chamber 110 into the process sub-chamber 112 to ensure the seasoning process is carried out in the entire chamber. The plasma source power applicator may be the capacitively coupled plasma source power applicator 134, 136 of FIG. 4, the inductively coupled plasma source power applicator 160 of FIG. 8, the torroidal plasma source 163 of FIG. 9A or the microwave plasma source power applicator 179 of FIG. 10, for example. Embodiments illustrated as including a plasma source power applicator include the embodiments of FIGS. 3, 4, 8-11, 14-17, 19-22 and 24-26. In addition, the embodiment of FIG. 1 combines the function of plasma source power and grid voltage in the voltage source 124, which may therefore be used to carry out the chamber pre-process seasoning step. In the embodiment of FIG. 18, which has no plasma source power applicator for the ion generation sub-chamber 110, the chamber pre-process seasoning step may be carried out using an external plasma source 101 which furnishes plasma ions or radicals either or both the ion generation sub-chamber 110 and the process sub-chamber 112. Such an external plasma source may also be provided in any of the other embodiments for the same purpose.

Reactor performance may be enhanced by carrying out a post-process chamber cleaning step after the production wafer 122 has been removed from the chamber. For those embodiments noted above having a plasma source power applicator, a cleaning pre-cursor gas, such as $NF_3$, is introduced by the process gas supply 114*a* or 114*b* and a plasma is struck and maintained for a sufficient time and at a sufficient plasma density to efficiently clean the interior chamber surfaces. This may include removal of the anti-contamination coating deposited in the chamber pre-process seasoning step. The grid 108 or grids 108*a-d* are energized to draw plasma into the process chamber 112 so that all chamber interior surfaces are adequately cleaned. This post-process chamber cleaning step may also be performed in any of the disclosed embodiments using the external plasma source 101 (shown in FIG. 18). The external plasma source 101 may furnish cleaning ions or cleaning radicals (such as ions or radicals derived from $NF_3$, to either or both the ion generation sub-chamber 110 and the process sub-chamber 112.

Description of at least some of the foregoing embodiments has been made with reference to a feature in which the grid 108 and wafer support pedestal 120 are driven with different voltages. For example, in the embodiment of FIG. 4, the voltage difference between the grid 108 and the wafer support pedestal 120 produces an attractive potential that accelerates ions emerging from the grid 108 into the process sub-chamber 112 toward the wafer support pedestal 120. However, in accordance with another feature, the same voltage drives both the wafer support pedestal 120 and the grid 108 (in the single grid embodiments of FIGS. 1-10) or the bottom grid 108*d* (in multi-grid embodiments of FIGS. 11-18, for example). The purpose of this feature is to apply no accelerating force to ions in the process sub-chamber 112, so that they only drift from the grid 108 (or bottom grid 108*d*) to the wafer 122. The drift velocity depends upon the voltage difference between the plasma in the ion generation sub-chamber 110 and the grid 108. This feature reduces ion beam divergence in the process sub-chamber 112.

In certain embodiments described above, such as the embodiments of FIGS. 24 and 26, power is applied directly to the wafer support pedestal 120. For example, the power source 180 establishes a voltage on the wafer 122 in the embodiment of FIG. 24, and the power source 180*e* establishes a voltage on the wafer 122 in the embodiment of FIG. 26. This power can include an RF component, and establishes a plasma bias voltage across the plasma sheath that exists over the surface of the wafer 122.

While the CVD process using a grid has been described with reference to both RF and D.C. grid voltages or acceleration voltages or bias voltages, if the layer deposited in the CVD process is an insulating or dielectric layer, then the problem of charge accumulation must be avoided or at least minimized. The charge up of the insulating layer may change the resultant ion energy at the wafer surface. Such charge up occurs when a D.C. or pulsed D.C. voltage is employed as the grid voltage or bias voltage or acceleration voltage. This problem is minimized or avoided by employing RF voltages for the grid voltage, the wafer bias voltage and/or the acceleration voltage.

Plasma Immersion Ion Implantation:

An ion shower grid plasma reactor of the type disclosed above with reference to FIGS. 1 through 27 may be employed to carry out plasma immersion ion implantation. In particular, the aspect ratio of the ion shower grid openings 109 ensures a collimated ion beam suitable for ion implantation, the ions having an angular distribution tightly confined about the direction perpendicular to the wafer surface. Also, the application of attractive voltage(s) to the grid 108 or grids 108*a* through 108*d* and to the wafer support pedestal 120 enables the ion beam to be accelerated to energies at which the incoming ions are implanted below the surface of the semiconductor wafer 122. The ion shower grid 108 or grids 108*a* through 108*d* controls ion trajectory distribution so that implantation direction can be more uniform than in conventional plasma immersion ion implantation processes. The reactors of FIGS.

1 through 27 may be employed to carry out plasma immersion ion implantation by providing the dopant species to be implanted as a component of the process gases furnished by at least one of the process gas supplies 114a, 114b. The potential applied to the grid must be a sufficiently high voltage to generate sufficient ion energies for ion implantation.

The embodiments of FIGS. 24 through 27 are particularly suitable for carrying out plasma immersion ion implantation. This is because the plasma in the ion generation sub-chamber 110 is at a potential of minimum magnitude (e.g., ground plus a small voltage induced by the plasma source power applicator), while grid 108 (FIG. 24) or grids 180a-108d (FIG. 26) are at attractive (negative) voltage(s) of greater magnitude(s), and the wafer support pedestal 120 is at the maximum attractive (negative) voltage. In this way, high voltage isolation need only be carried out for the wafer support pedestal 120, rather than for the entire upper sub-chamber 110. As will be described in this specification, a high voltage cathode can be employed as the wafer support pedestal 120, in order to permit the application of very high negative voltages to the wafer support pedestal without electrical discharge or breakdown.

Referring to FIG. 24, the single ion shower grid 108 is grounded and the voltage source 180 applies a very high negative voltage (e.g., up to tens of kilovolts) to the wafer support pedestal 120. The grid 108 provides a ground reference to the plasma in the upper ion generation sub-chamber 110, and the plasma potential oscillates around the ground reference (0 Volts) because of the plasma potential oscillations induced by the plasma source power generator 134. The electric field between the grid 108 and the wafer 122 is sufficient to accelerate the ions up to an energy at which the ions are implanted in the crystal lattice of the wafer 122. The torroidal plasma source power applicator 163 has the advantage of raising the plasma potential to only a very small RF voltage (e.g., 100 Volts). However, the torroidal source 163 of FIG. 24 may be replaced by the capacitively coupled plasma source power applicator 134, 136 of FIG. 3. Or, it may be replaced by the inductively coupled source power applicator 134, 136, 160 of FIG. 8 or by the microwave source power applicator 179 of FIG. 10.

Figure 4:
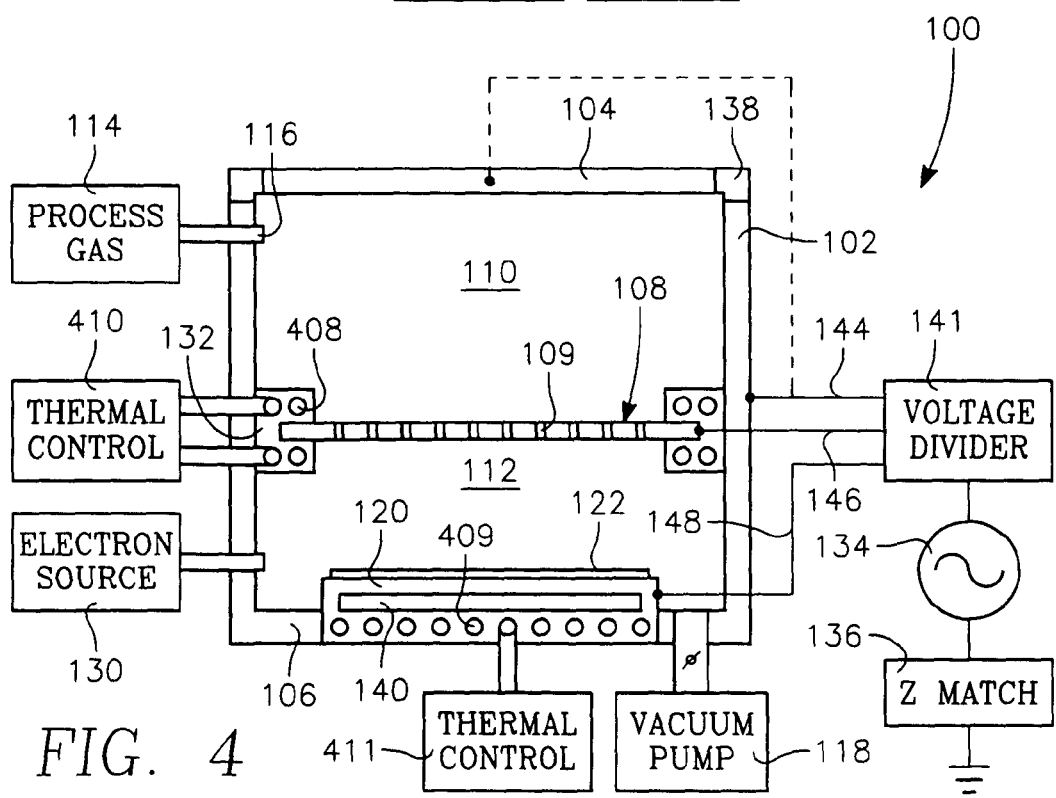
FIG. 4 illustrates a CVD reactor having a single ion shower grid, a capacitively coupled plasma source power applicator and a voltage divider for applying successive potentials from a potential source to the plasma, the ion shower grid and the wafer.
Figures 5, 6:
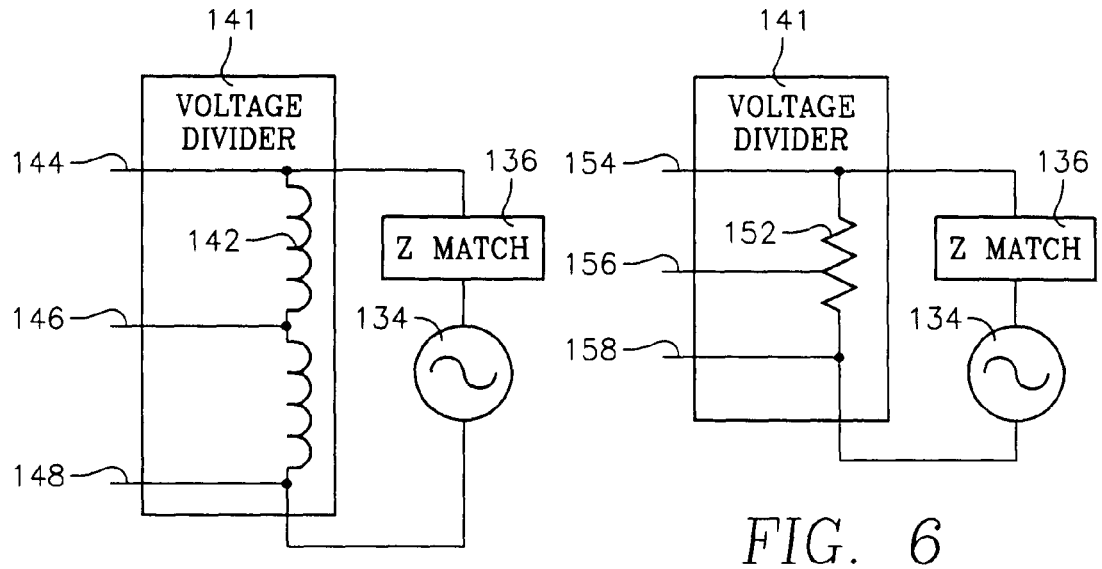
FIG. 5 illustrates one implementation of the voltage divider shown in FIG. 4.
FIG. 6 illustrates another implementation of the voltage divider shown in FIG. 4.

As another implementation of the reactor of FIG. 24, the voltage divider 141 of FIG. 4 may be substituted into the reactor of FIG. 24 to replace both the grid voltage supply 180 and the plasma source power applicator 163. The voltage divider 141 in such a case would apply plasma source power to the ceiling 104 of FIG. 24 (with the side wall 102 being the grounded reference), while applying successive attractive (negative) ion acceleration voltages to the ion shower grid 108 of FIG. 24 and to the wafer support pedestal 120 of FIG. 24.

Alternatively, the grid 108 may provide all of the ion acceleration to the velocity required to achieve the desired implantation depth profile. In such a case, the grid potential controls the depth profile, and no net voltage difference between the grid 108 and the workpiece 122 is required. The grid potential in this case is applied relative to a chamber surface in the ion generation region or relative to the potential of the plasma in the ion generation sub-chamber 110.

The process gas supply 114 may furnish to the ion generation sub-chamber 110 a process gas containing the species to be implanted, which may be a molecular species or an atomic element. In either case, the process gas may be a molecular compound of the species to be implanted, for example. If a metal species is to be implanted, then the process gas may be a gaseous metal compound or a metal organic compound, such as tri-methyl aluminum.

Similarly, in embodiments employing the sputter target 200, such as in FIGS. 20-22, the species to be implanted may be a metal, a dielectric or a semiconductor or a compound of such materials, so that the target 200 itself contains such a material or a compound thereof. In this case, the sputter target 200 can furnish to the ion generation sub-chamber 110 the species to be implanted in atomic or molecular form, depending upon the species. If the species to be implanted is a metal (such as Aluminum), then the sputter target 200 itself may be made of that metal.

In carrying out plasma immersion ion implantation in the reactor of FIG. 26, the plasma in the ion generation sub-chamber 110 is held near ground potential. The successive voltage sources 180a-180e apply successively greater negative voltages, so that the total attractive potential between the ion generation sub-chamber 110 and the wafer 122 is up to tens of kiloVolts, sufficient to cause the incoming ions to be implanted below the top surface of the wafer 122. The process gas supply 114 provides a process gas containing the species to be implanted as a component. These same results are obtained in the reactor of FIG. 27, in which the voltage divider 141 can provide the same voltages generated by the multiple voltage sources 180a-180e of FIG. 26.

The multiple grids 108a-108d of the embodiments of FIGS. 26 and 27 may provide all of the ion acceleration required to reach an ion energy distribution corresponding to the desired ion implantation depth profile. In such a case, no particular bias voltage need be applied to the wafer 122, and in one implementation the wafer bias and the voltage applied to the nearest (bottom) grid 108d may be the same. An ion extraction voltage may be applied to at least one of the multiple grids 108a-108d. If no ion acceleration is to occur between the bottom grid 108d and the wafer 122, then the potential applied to at least one of the grids 108a-d should be sufficient to achieve the desired ion implantation depth profile. This grid potential may be applied with reference to the plasma potential in the ion generation sub-chamber 110 or a chamber surface, such as a chamber surface in the ion generation sub-chamber 110.

The top grid 108a may have an ion extraction voltage that is more attractive to ions than the plasma potential of a plasma in the ion generation region. The next grid 108b may have an even greater ion extraction voltage, so that the two grids 108a, 108b perform successive accelerations of the ions sufficient to reach the ion energy required to realize the desired implantation depth profile in the workpiece 122. The penultimate grid 108c may have a deceleration potential applied to it. In this case, the ion extraction voltages of the first two grids 108a, 108b produce a high energy ion flux through the grids 108a, 108b that is far greater than that required to meet the desired implantation depth profile. The advantage is that a much higher ion current flux is achieved. The deceleration potential on the grid 108c reduces the ion energy to the level required to meet the desired implantation depth profile, while retaining the advantage of the very high ion flux achieved at the higher ion energy from which the ions are decelerated. Thus, a very high ion current and relatively short ion implant time is achieved.

In those cases in which the multiple grids 108a-108d are employed for either ion acceleration or ion deceleration, in and particular where several grids are so employed, and where the grid potentials are RF voltages for example of the same frequency, it may be desirable for the skilled worker to adjust the phase relationship between the RF voltages applied to successive grids to optimize the effect of the driven grids on the ion flux. Such a phase adjustment is made taking into account the distance between the grids, the ion velocity distribution at each grid and the frequency of the RF grid potentials.

In a further variation, if a flux of neutral particles containing the implantation species is to be provided, then the bottom grid 108*d* may have a neutralization potential applied to it, which may be a ground potential. In this case the openings or orifices 109 through the bottom grid 108*d* may have a greater aspect ratio for efficient neutralization of the ion flux.

In another variation, the multiple grids 108*a-d* may be used in plasma immersion ion implantation to focus the ion flux toward the openings 109 in the manner described above with reference to FIG. 13A by applying ion-repulsive potentials to alternate ones of the grids 108*a-d*.

Thus, the ion energy may be controlled by any one or a combination of voltages applied to the grids 108*a*-108*d* and/or the wafer 122. For example, a different voltage may be applied to each grid 108*a-d* and the wafer 122, with only one or some or all of these voltages contributing to the ion energy. Each voltage that contributes to the ion energy is referred to in this specification as an ion acceleration voltage. An ion acceleration voltage may be a pulsed RF voltage, a continuous RF voltage, a pulsed D.C. voltage or a continuous D.C. voltage. Such an ion acceleration voltage may be applied using as a reference a chamber surface (e.g., in the ion generation sub-chamber 110) or the plasma potential in the ion generation sub-chamber 110 or the wafer pedestal 120. In the latter case, a voltage difference between the grid 108 (or bottom grid 108*d*) and the wafer pedestal 120 may be an ion acceleration voltage. As employed in this specification, the term ion acceleration voltage is a general term that can refer to the wafer bias voltage on the wafer 122 or the grid potential applied to any one of the grids 108*a* through 108*d* or some combination thereof that controls the ion energy.

In the multiple grid embodiments of FIGS. 26 and 27, the plasma source power applicator is illustrated as a torroidal plasma source 163. However, in carrying out plasma immersion ion implantation in the embodiment of FIG. 26 (or 27), the torroidal plasma source power applicator 163 can be replaced the capacitively coupled source power applicator 134, 136 of FIG. 3 or by the inductively coupled plasma source power applicator 134, 136, 160 of FIG. 8 or by the microwave plasma source power applicator 179 of FIG. 10.

While the foregoing plasma immersion ion implantation reactor embodiments are particularly effective because the upper chamber 110 is at or near ground potential, plasma immersion ion implantation can be performed in the other regime in which the wafer support pedestal 120 is grounded and the upper chamber is at a maximum repulsive (positive) voltage. This maximum positive voltage would be on the order of up to tens of kV (e.g., a few hundred volts) to achieve ion energies capable of ion implantation in the wafer lattice. Therefore, the embodiments of FIGS. 1-22 could be employed to carry out plasma immersion ion implantation, provided that a very high positive voltage is applied to the plasma in the ion generation sub-chamber 110 while the wafer 122 is provided with a near ground potential.

In the single grid embodiments of FIGS. 1-10, the plasma in the ion generation sub-chamber 110 may be raised to the requisite potential by applying a high positive voltage (up to tens of kV, sufficient for ion implantation) to a conductive surface of the ion generation sub-chamber 110, such as the side wall 102, the ceiling 104 or the grid 108. For this purpose, it may be seen that the embodiments of FIGS. 3 and 4 may be made to function in the same manner. Specifically, in both FIGS. 3 and 4, voltages are applied to the ceiling 104, the side wall 102, the grid 108 and the wafer support pedestal 120. The voltage between the ceiling 104 and side wall 102 may be sufficient to provide plasma source power to the ion generation sub-chamber 110. Simultaneously, the voltages applied, in succession, to the ceiling 104, side wall 102, grid 108 and wafer support pedestal 120 may be in descending order from the highest positive voltage (at the ceiling 104) to ground (at the wafer support pedestal 120), to produce a net attractive electric field to extract ions from the plasma and accelerate them to the wafer 122 with sufficient energy for ion implantation in the wafer 122.

In the multiple grid embodiments of FIGS. 11-17, the grid voltages are referenced to the wafer pedestal 120, which may be grounded. The highest (positive) voltage is applied by the voltage source 180' to one of the interior surfaces of the ion generation chamber 110, such as the side wall 102, to raise the plasma potential to the highest ion-repulsive (positive) voltage (e.g., up to tens of kV for ion implantation). Alternatively, the voltage source 180' may be dispensed with, and instead the top grid 108*a* may be driven with the highest positive voltage (by the grid potential source 180*a*) to control the plasma potential. The successive voltages applied by the grid voltage sources 180*a*-180*d* may decrease in progressive fashion, establishing an attractive potential for ions passing through the grids 108*a*-108*d*, culminating in the maximum attractive (ground) potential of the wafer 122.

The ion flux and ion energy at the wafer surface can be influenced separately. This is because the rate at which ions are extracted through the single grid 108 (FIGS. 1-10) or through the multiple grids 108*a*-108*d* (FIGS. 11-17) depends upon the plasma-to-grid voltage, while the ion energy at the wafer surface depends upon the wafer voltage relative to the plasma potential in the ion generation sub-chamber 110. Therefore, in accordance with one method:

the ion flux is controlled by selecting the voltage of the grid 108 (or of the top grid 108*a*) relative to the plasma potential in the ion generation sub-chamber 110, while (b) the ion energy is set to a desired ion implant depth by adjusting the voltage applied to the wafer support pedestal 122 relative to the plasma potential in the ion generation sub-chamber 110 or (alternatively) relative to the grid potential of the single grid 108 (FIGS. 1-10) or of one of the multiple grids 108*a*-108*d* (FIGS. 11-17).

The multiple grid embodiments of FIGS. 11-17 have been described with respect to implementations in which different voltages are applied to different ones of the multiple grids 108*a*-108*d*. For example, in the mode of FIGS. 12A-12E, voltages are applied from the top to bottom grids of successively greater attraction to positive ions. In the mode of FIGS. 13A-13E, different voltages are applied to the multiple grids 108*a*-108*d* to create electric fields that focus the ion current toward the respective grid openings 109. However, the invention is not necessarily limited to such features. In fact, the same or similar voltage may be applied to each of the multiple grids 108*a*-108*d*.

In cases where the implanted species can be realized in the form of a solid target (e.g., where silicon is to be implanted), the species to be implanted can be provided in the form of a solid sputter target in the ion generation sub-chamber 110, in the manner of FIG. 21, for example. Such a solid sputter target can be added to any one of the plasma immersion ion implantation embodiments described above, including the embodiments of FIGS. 24-27. For example, each of the plasma immersion ion implantation embodiments described above may be modified by adding the solid silicon sputter target 200 of FIG. 21, connected to the sputter voltage source 205, with an ion confining magnet 220 overhead. The neutrals sputtered from the target 200 are ionized by the plasma source power applicator of the ion generation sub-chamber, the ions thus generated being accelerated through the ion shower grid 108 for implantation in the wafer 122. The sputter target 200 may be used instead of or with the process gas supply 114. The process gas supply 114 is, however, required to provide some gas to be ionized for sputtering the target 200. Such a solid sputter target 200 in a plasma immersion ion implantation reactor may be used in cases in which the plasma source power applicator of the ion generation sub-chamber 110 is an inductively coupled source as in FIG. 19, a capacitively coupled source as in FIG. 20, a torroidal plasma source as in FIG. 21 or a microwave source as in FIG. 22.

In each of the foregoing plasma immersion ion implantation embodiments, the gas supply 114 furnishes process gas containing a dopant impurity into the ion generation sub-chamber 110 via a system of gas injection ports that includes the injection port 116 shown in the drawing of FIG. 1. For example, if the wafer 122 is a crystalline silicon wafer a portion of which is to be implanted with a p-type conductivity dopant impurity, then the gas supply 114 may furnish $BF_3$ and/or $B_2H_6$ gas into the ion generation sub-chamber 110, where Boron is the dopant impurity species. Generally, the dopant-containing gas is a chemical consisting of the dopant impurity, such as boron (a p-type conductivity impurity in silicon) or phosphorus (an n-type conductivity impurity in silicon) and another species such as fluorine and/or hydrogen. Thus, fluorides and/or hydrides of boron, phosphorous or other dopant species such as arsenic, antimony, etc., can be dopant gases. In a plasma containing a fluoride and/or hydride of a dopant gas such as $BF_3$, there is a distribution of various ion species, such as $BF_2+$, $BF+$, $B+$, $F+$, $F-$ and others (such as inert additives). All types of species may be accelerated across the sheath and may implant into the wafer surface. The dopant atoms (e.g., boron or phosphorous atoms) typically dissociate from the other species atoms (e.g., fluorine or hydrogen atoms) upon impact with the wafer at sufficiently high energy. Although both the dopant ions and volatile species ions are accelerated into the wafer surface, some portion of the other species atoms tend to leave the wafer during the annealing process that follows the ion implantation step, leaving the dopant atoms implanted in the wafer.

The voltages applied to the single grid (FIGS. 1-10) and to the multiple grids 108a-108d (FIGS. 11-17) accelerate ions from the plasma across the plasma sheath and into the wafer surface, where they are lodged in generally interstitial sites in the wafer crystal structure. The ion energy, ion mass, ion flux density and total dose may be sufficient to amorphize (damage) the structure of the wafer. The mass and kinetic energy of the dopant (e.g., boron) ions at the wafer surface and the structure of the surface itself determine the depth of the dopant ions below the wafer surface. This is controlled by the magnitude of the ion acceleration voltage (which may be any one or a combination of voltages applied to any one or a combination of the grids 108a-108d or the wafer support pedestal 120). After the ion implantation process is carried out, the wafer is subjected to an anneal process that causes the implanted dopant atoms to move into substitutional atomic sites in the wafer crystal. The substrate surface may not be crystalline if it has been pre-amorphized prior to the plasma immersion ion implant process, or if the ion energy, ion mass, ion flux density and total dose of plasma immersion ion implant process itself is sufficient to amorphize the structure of the wafer. In such a case, the anneal process causes the amorphous (damaged) layer to re-crystallize with the incorporation and activation of implanted dopant. The conductance of the implanted region of the semiconductor is determined by the junction depth and the volume concentration of the activated implanted dopant species after the subsequent anneal process. If, for example, a p-type conductivity dopant such as boron is implanted into a silicon crystal which has been previously doped with an n-type dopant impurity, then a p-n junction is formed along the boundaries of the newly implanted p-type conductivity region, the depth of the p-n junction being the activated implanted depth of the p-type dopant impurities after anneal. The junction depth is determined by the voltage on the wafer relative to the plasma potential (and by the anneal process), which is controlled by the voltage source 180 (e.g., FIGS. 1, 24) or 180a-180d (e.g., FIG. 11, 26). The dopant concentration in the implanted region is determined by the dopant ion flux ("dose") at the wafer surface during implantation and the duration of the ion flux. The dopant ion flux is determined by the plasma ion density in the ion generation sub-chamber 110, which is controlled by the RF plasma source power generator 134. This arrangement enables independent control of the time of implant, the conductivity of the implanted region and the junction depth. Generally, the control parameters such as the power output levels of the grid voltage sources 180 and the RF source power generator 134 are chosen to minimize the implant time while meeting the target values for conductivity and junction depth. For more direct control of ion energy, the bias generator may have "voltage" rather than "power" as its output control variable.

Figure 31A:
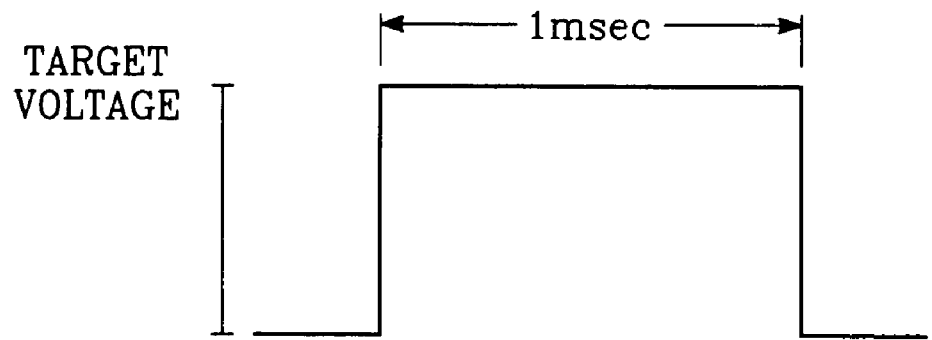
FIGS. 31A, 31B and 31C illustrate, respectively, an applied pulsed D.C. bias voltage, the corresponding sheath voltage behavior and an applied RF bias voltage.
Figure 31B:
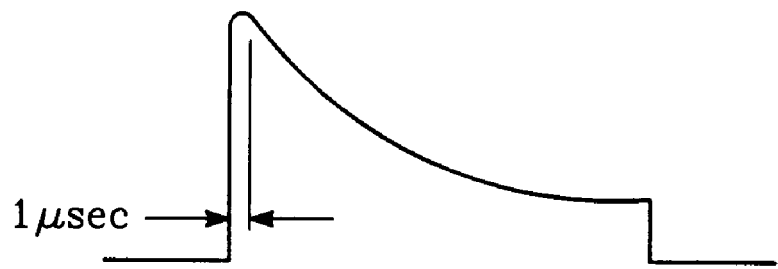
Figure 31C:
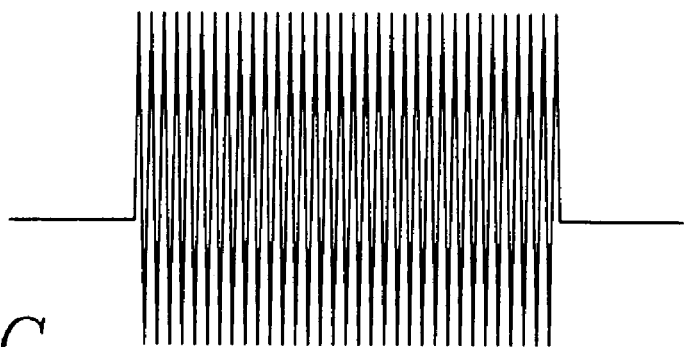

An advantage of using an RF voltage as the ion acceleration voltage (applied to any one or a combination of the grid 108, or grids 108a-d or wafer pedestal 120) instead of a D.C. voltage is that an RF voltage is more efficient (and therefore more productive) for ion implantation, provided the RF frequency is suitably chosen. This is illustrated in FIGS. 31A, 31B and 31C for the particular case in which an ion acceleration voltage is applied to the wafer pedestal 120. FIG. 31A illustrates a one-millisecond D.C. pulse applied to the wafer in conventional practice, while FIG. 31B illustrates the resulting ion energy at the wafer surface. The D.C. pulse voltage of FIG. 31A is near the target ion acceleration voltage at which ions become substitutional upon annealing at the desired implant junction depth. FIG. 31B shows how the ion energy decays from the initial value corresponding to the voltage of the pulse of FIG. 31A, due to resistive-capacitive effects at the wafer surface. As a result, only about the first micro-second (or less) of the one-millisecond D.C. pulse of FIG. 31A is actually useful, because it is only this micro-second portion of the pulse that produces ion energies capable of implanting ions that become substitutional (during annealing) at the desired junction depth. The initial (one microsecond) period of the D.C. pulse may be referred to as the RC time. During the remaining portion of the D.C. pulse, ions fail to attain sufficient energy to reach the desired depth or to become substitutional upon annealing, and may fail to penetrate the wafer surface so as to accumulate in a deposited film that resists further implantation. This problem cannot be solved by increasing the pulse voltage, since this would produce a large number of ions that would be implanted deeper than the desired junction depth. Thus, ions are implanted down to the desired junction depth during only about a tenth of a percent of the time. This increases the time required to reach the target implant density at the desired junction depth. The resulting spread in energy also reduces the abruptness of the junction. In contrast, each RF cycle in a 1 millisecond burst of a 1 MHz RF ion acceleration voltage illustrated in FIG. 31C has an RF cycle time not exceeding the so-called RC time of FIG. 31B. As a result, resistive-capacitive effects encountered with a pulsed D.C. ion acceleration voltage are generally avoided with an RF ion acceleration voltage of a sufficient frequency.

Therefore, ions are implanted down to the desired junction depth during a far greater percentage of the time of the 1 MHz RF ion acceleration voltage of FIG. 31C. This reduces the amount of time required to reach a target implant density at the desired junction depth. Thus, the use of an RF ion acceleration voltage results in far greater efficiency and productivity than a D.C. pulse voltage, depending upon the choice of RF frequency.

The frequency of the RF ion acceleration is chosen to satisfy the following criteria: The RF ion acceleration frequency must be sufficiently high to have a negligible voltage drop across the pedestal (cathode) dielectric layers) and minimize sensitivity to dielectric films on the backside or front side of the wafer and minimize sensitivity to chamber wall surface conditions or deposition of plasma by-products. Moreover, the frequency must be sufficiently high to have a cycle time not significantly exceeding the initial period (e.g., one micro-second) before resistive-capacitive (RC) effects reduce ion energy more than 2% below the target energy, as discussed immediately above. Furthermore, the RF ion acceleration frequency must be sufficiently high to couple across insulating capacitances such as films on the wafer surface, dielectric layers on the wafer support pedestal, coatings on the chamber walls, or deposited films on the chamber walls. (An advantage of RF coupling of the ion acceleration voltage to the wafer is that such coupling does not rely upon ohmic contact and is less affected by changes or variations in the surface conditions existing between the wafer and the support pedestal.) However, the RF ion acceleration frequency should be sufficiently low so as to not generate significant plasma ions and electrons (leaving that task to the plasma source power applicator). More importantly, the RF ion acceleration frequency should be sufficiently low for the ions to respond to the oscillations of the electric field in the plasma sheath overlying the wafer surface. The considerations underlying this last requirement are now discussed with reference to FIGS. 32A through 32D.

Figure 32A:
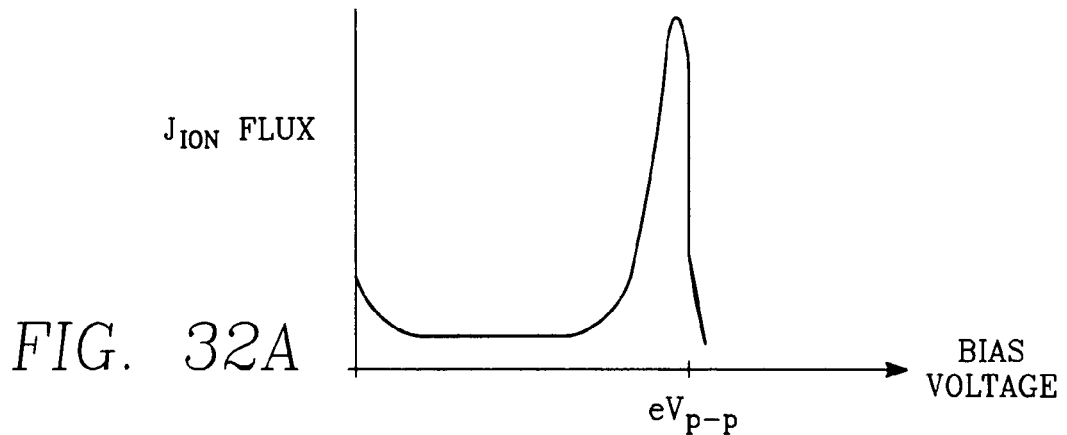
FIGS. 32A, 32B, 32C and 32D illustrate, respectively, an energy distribution of ion flux, a cycle of applied RF bias voltage, ion saturation current as a function of D.C. bias voltage, and energy distribution of ion flux for different frequencies of RF bias voltage.
Figure 32B:
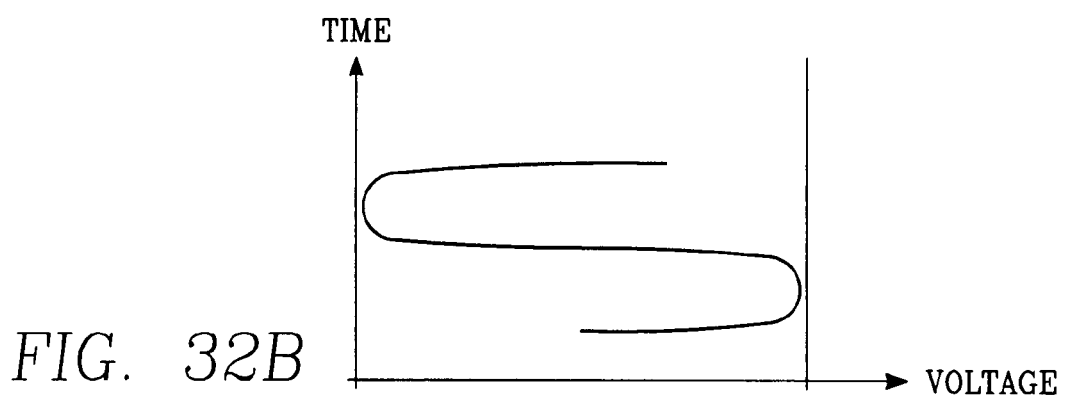
Figure 32C:
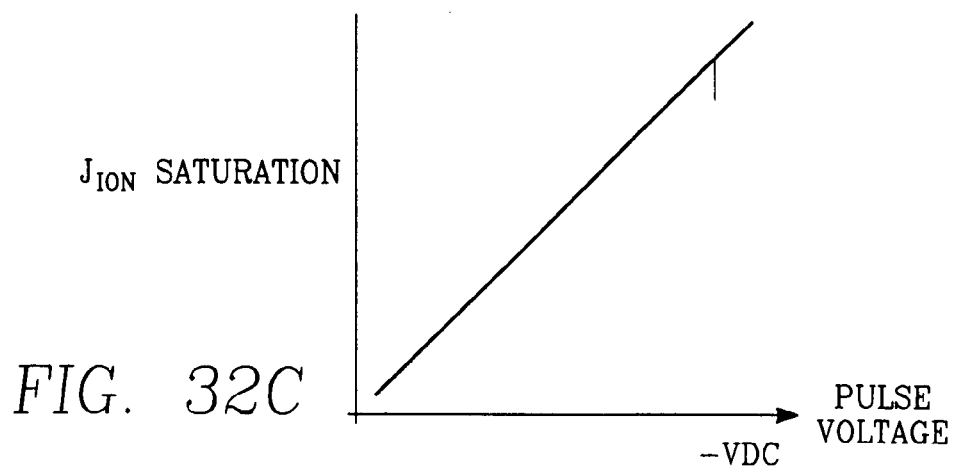
Figure 32D:
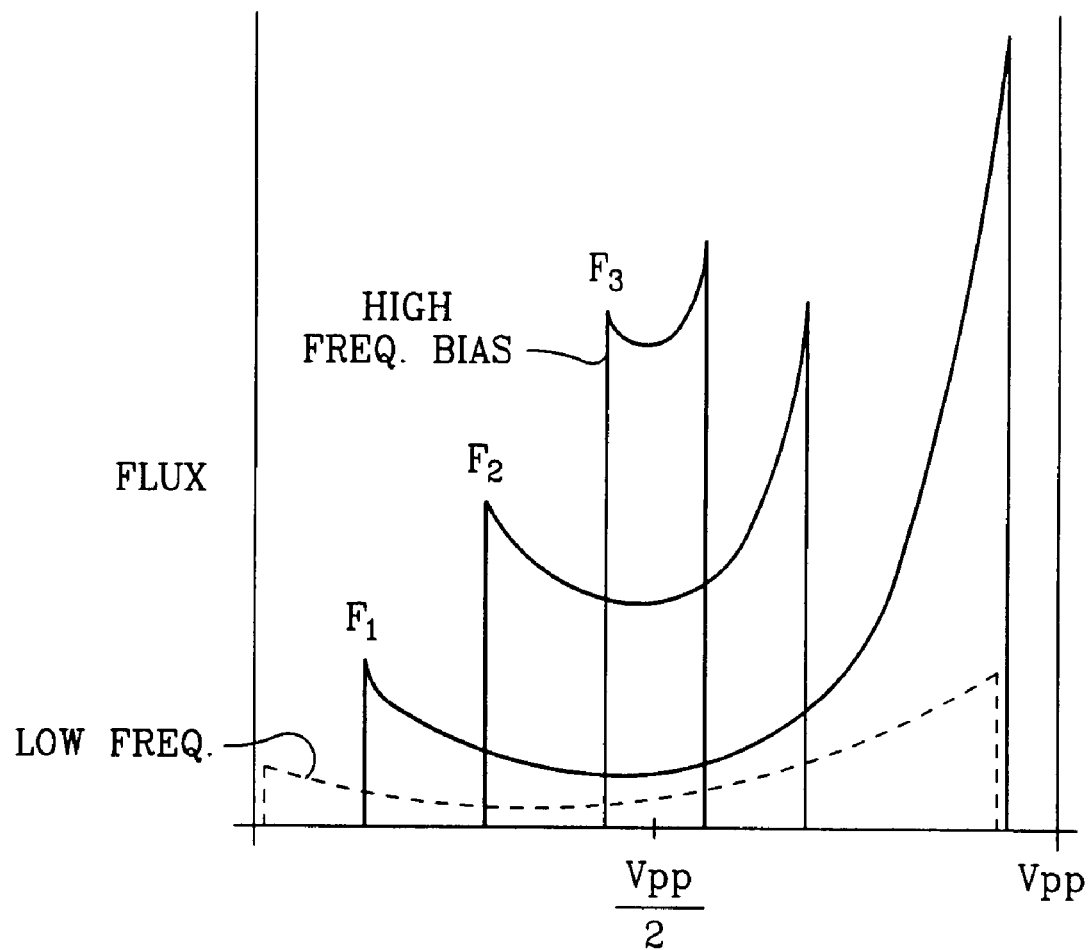

FIG. 32A illustrates the plasma ion saturation current at the wafer surface as a function of D.C. ion acceleration voltage applied to the wafer, the current being greatest (skewed toward) the higher voltage region. FIG. 32B illustrates the oscillation of the RF voltage of FIG. 32C. The asymmetry of the ion saturation current illustrated in FIG. 32A causes the ion energy distribution created by the RF ion acceleration voltage of FIG. 32B to be skewed in like manner toward the higher energy region, as illustrated in FIG. 32C. The ion energy distribution is concentrated most around an energy corresponding to the peak-to-peak voltage of the RF ion acceleration on the wafer. But this is true only if the RF ion acceleration frequency is sufficiently low for ions to follow the oscillations of the electric field in the plasma sheath. This frequency is generally a low frequency around 100 kHz to 3 MHz, but depends on sheath thickness and charge-to-mass ratio of the ion. Sheath thickness is a function of plasma electron density at the sheath edge and sheath voltage. Referring to FIG. 32D, as this frequency is increased from the low frequency (denoted F1 in FIG. 32D) to a medium frequency (denoted F2 in FIG. 32D) and finally to a high frequency such as 13 MHz (denoted F3 in FIG. 32D), the ability of the ions to follow the plasma sheath electric field oscillation is diminished, so that the energy distribution is narrower. At the HF frequency (F3) of FIG. 32D, the ions do not follow the sheath electric field oscillations, and instead achieve an energy corresponding to the average voltage of the RF ion acceleration voltage, i.e., about half the RF ion acceleration peak-to-peak voltage. As a result, the ion energy is cut in half as the RF ion acceleration frequency increases to an HF frequency (for a constant RF ion acceleration voltage). Furthermore, at the medium frequency, we have found that the plasma behavior is unstable in that it changes between the low frequency behavior (at which the ions have an energy corresponding to the peak-to-peak RF ion acceleration voltage) and the high frequency behavior (at which the ions have an energy corresponding to about half the peak-to-peak RF ion acceleration voltage) depending on the ion transit frequency (the reciprocal of the time it takes an average ion of a particular charge-to-mass ratio to cross a plasma sheath of a particular thickness, which depends on the plasma electron density just outside the sheath in the plasma and the voltage across the sheath). Therefore, by maintaining the RF ion acceleration frequency at a frequency that is sufficiently low (corresponding to the frequency F1 of FIG. 32D) for the ions to follow the plasma sheath electric field oscillations, the RF ion acceleration peak-to-peak voltage required to meet a particular ion implant depth requirement is reduced by a factor of nearly two, relative to behavior at a medium frequency (F2) or a high frequency (F3). This is a significant advantage because such a reduction in the required RF ion acceleration voltage (e.g., by a factor of two) greatly reduces the risk of high voltage arcing in the wafer support pedestal and the risk of damaging thin film structures on the wafer. This is particularly important because in at least a particular plasma immersion ion implantation source described later in this specification, ion energies match those obtained in a conventional ion beam implanter, provided the plasma RF ion acceleration voltage is twice the acceleration voltage of the conventional ion beam implanter. Thus, at a high frequency plasma RF ion acceleration voltage, where ion energies tend to be half those obtained at low frequency, the required plasma RF ion acceleration voltage is four times the acceleration voltage of the conventional ion beam implanter for a given ion energy level. Therefore, it is important in a plasma immersion ion implantation reactor to exploit the advantages of a low frequency RF ion acceleration voltage, to avoid the necessity of excessive RF ion acceleration voltages.

Good results are therefore attained by restricting the RF ion acceleration power frequency to a low frequency range between 10 kHz and 10 MHz. Better results are obtained by limiting the RF ion acceleration power frequency to a narrower range of 50 kHz to 5 MHz. The best results are obtained in the even narrower ion acceleration power frequency range of 100 kHz to 3 MHz. We have found optimum results at about 2 MHz plus or minus 5%.

Both the RF source power generator 134 and the grid/pedestal voltage source 180 (or voltage sources 180a-180e) may apply continuous RF power. However, either or both of the generators 134, 180 may be operated in burst modes controlled by a controller (such as the 8075 of FIG. 38 that will be described later in this specification). Operation will now be described. The RF signals produced by each of the generators 134, 180 may be pulse modulated to produce continuous wave (CW) RF power in bursts lasting, for example, one millisecond with a repetition rate on the order of 0.5 kHz, for example. Either one or both of the generators/voltage sources 134, 180 may be operated in this manner. If both are operated in such a burst mode simultaneously, then they may be operated in a push-pull mode, or in an in-synchronism mode, or in a symmetrical mode or in a non-symmetrical mode, as will now be described.

Figure 33A:
FIGS. 33A and 33B illustrate the temporal relationship between the power output waveforms of the source power generator and the bias power generator in a push-pull mode.
Figure 33B:

A push-pull mode is illustrated in the contemporaneous time domain waveforms of FIGS. 33A and 33B, illustrating the power waveforms of the respective generators 134, 180, in which the bursts of RF energy from the two generators 134, 180 occur during alternate time windows. FIGS. 33A and 33B illustrate the RF power waveforms of the generators 134, 180, respectively, or vice versa.

Figure 33C:
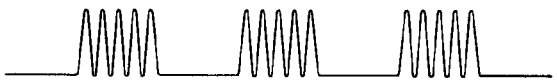
FIGS. 33C and 33D illustrate the temporal relationship between the power output waveforms of the source power generator and the bias power generator in an in-synchronism mode.
Figure 33D:
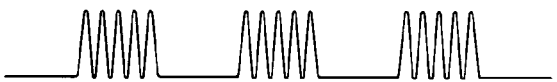

An in-synchronism mode is illustrated in the contemporaneous time domain waveforms of FIGS. 33C and 33D, in which the bursts of RF energy from the two generators 134, 180 are simultaneous. They may not be necessarily in phase, however, particularly where the two generators 134, 180 produce different RF frequencies. For example, the RF plasma source power generator 134 may have a frequency of about 13 MHz while the grid/pedestal voltage source(s) 180 may have an RF component with a frequency of about 2 MHz. FIGS. 33C and 33D illustrate the RF power waveforms of the generators 134, 180, respectively, or vice versa.

Figure 33E:
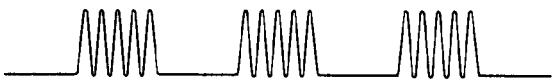
FIGS. 33E and 33F illustrate the temporal relationship between the power output waveforms of the source power generator and the bias power generator in a symmetric mode.
Figure 33F:
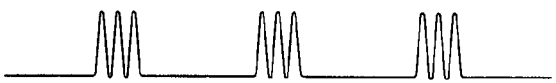

In the foregoing examples, the pulse widths and pulse repetition rates of the two generators 134, 180 may be at least nearly the same. However, if they are different, then the temporal relationship between the bursts of the two generators 134, 180 must be selected. In the example of the contemporaneous time domain waveforms of FIGS. 33E and 33F, one of the generators 134, 180 produces shorter RF bursts illustrated in FIG. 33F while the other produces longer RF bursts illustrated in FIG. 33E. In this example, the bursts of the two generators 134, 180 are symmetrically arranged, with the shorter bursts of FIG. 33F centered with respect to the corresponding longer bursts of FIG. 33E. FIGS. 33E and 33F illustrate the RF power waveforms of the generators 134, 180, respectively, or vice versa.

Figure 33G:
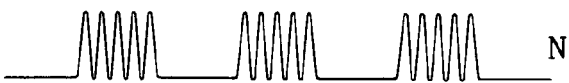
FIGS. 33G and 33H illustrate the temporal relationship between the power output waveforms of the source power generator and the bias power generator in a non-symmetric mode.
Figure 33H:

In another example, illustrated in the contemporaneous time domain waveforms of FIGS. 33G and 33H, the shorter bursts (FIG. 33H) are not centered relative to the corresponding longer bursts (FIG. 33G), so that they are asymmetrically arranged. Specifically, in this example the shorter RF bursts of FIG. 33H coincide with the later portions of corresponding ones of the long bursts of FIG. 33G. Alternatively, as indicated in dashed line in FIG. 33H, the short RF bursts of FIG. 33H may instead coincide with the earlier portions of corresponding ones of the long RF bursts of FIG. 33G. FIGS. 33G and 33H illustrate the RF power waveforms of the generators 134, 180, respectively, or vice versa.

The plasma immersion ion implantation reactor of FIG. 3 has a capacitive source power applicator. In order to enhance plasma generation, the frequency of the plasma RF source power generator 134 is relatively high, for example within the very high frequency (VHF) range or 30 MHz and above.

The lower frequency of the RF component of the grid/pedestal voltage source(s) 180 (or 180a-180d) is less than 10 MHz while the higher frequency of the RF plasma source power generator 134 is greater than 10 MHz. More preferably, the lower frequency is less than 5 MHz while the higher frequency is greater than 15 MHz. Even better results are obtained with the lower frequency being less than 3 MHz and the higher frequency exceeding 30 MHz or even 50 MHz. In some cases the source power frequency may be as high as 160 MHz or over 200 MHz.

The plasma immersion ion implantation inductively coupled reactor of FIG. 8 or 15 has distinct advantages, including (a) the capability of a large ion flux/high plasma ion density, (b) independently controlled ion energy, and (c) low minimum ion energy (plasma potential).

The dopant gases furnished by the gas supply 114 contain a species that is either a donor (N-type) or acceptor (P-type) impurity when substituted into the semiconductor crystal structure of the wafer 122. For example, if the wafer is a silicon crystal, then an N-type dopant impurity may be arsenic or phosphorous, for example, while a P-type dopant impurity may be boron, for example. The dopant gas furnished by the gas supply 114 is a chemical combination of the dopant impurity with another species, such as fluorine for example. For example, if a P-type conductivity region is to be formed by ion implantation, then the dopant gas may be a combination of boron and fluorine, such as $BF_3$, for example. Or, for example, the dopant gas be a hydride, such as $B_2H_6$. Phosphorous doping may be accomplished using a fluoride such as $PF_3$ or $PF_5$ or a hydride such as $PH_3$. Arsenic doping may be accomplished using a fluoride such as $AsF_5$ or a hydride such as $AsH_3$.

Process gas from the gas supply 114 may be introduced into the chamber by a gas distribution plate or showerhead incorporated in the ceiling 104 or from another gas inlet location. However, the plasma immersion ion implantation reactor is greatly simplified by using a small number of process gas injectors 116 in the ceiling 102 or in the side wall 104 or elsewhere, such as in the base of the chamber (not shown) coupled to the dopant gas supply, rather than a showerhead. The gas injectors or diffusers 116 may be joined in a ring on the side wall 102.

Figure 34:
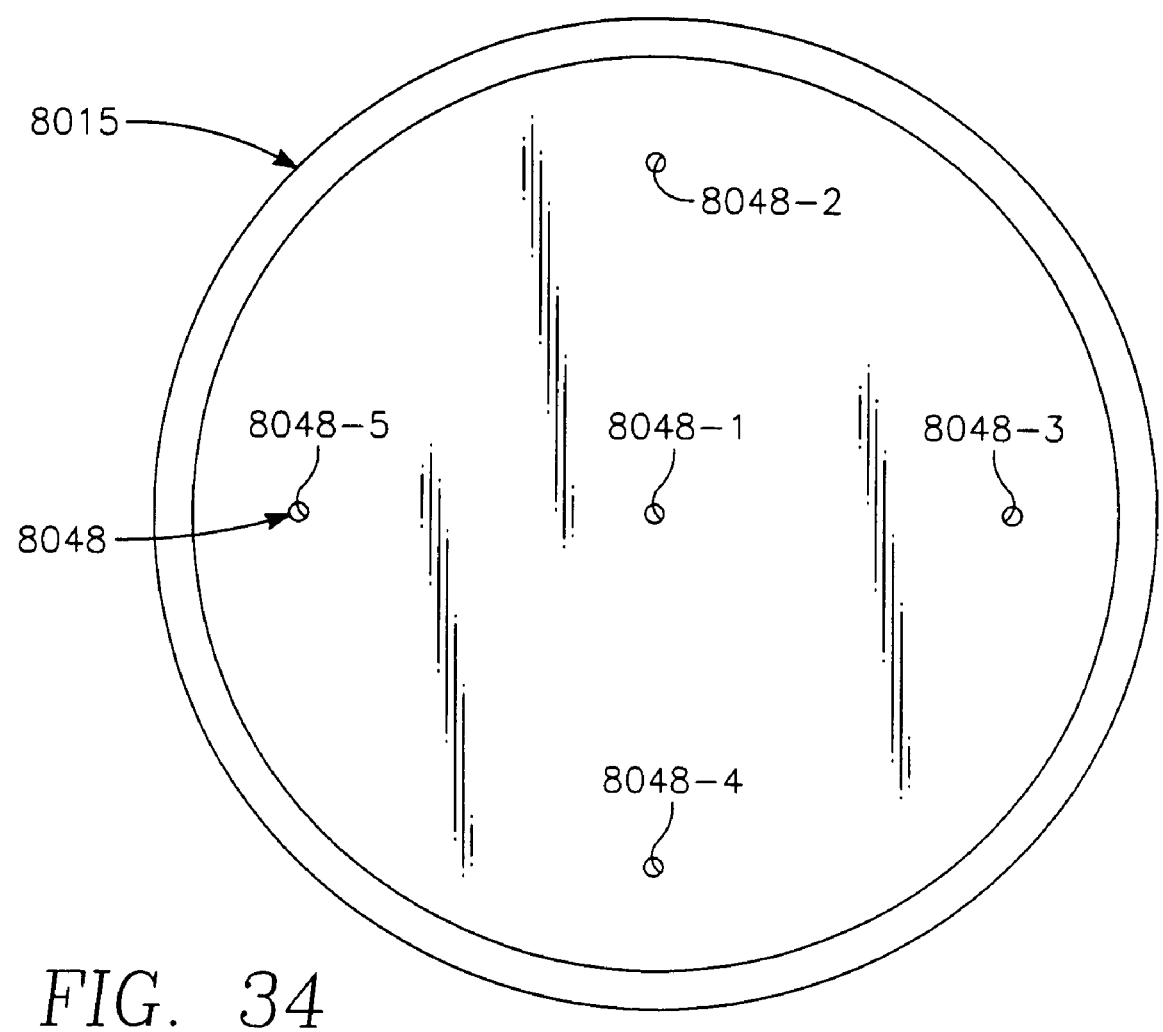
FIG. 34 illustrates an interior surface of a reactor chamber ceiling.
Figure 35:
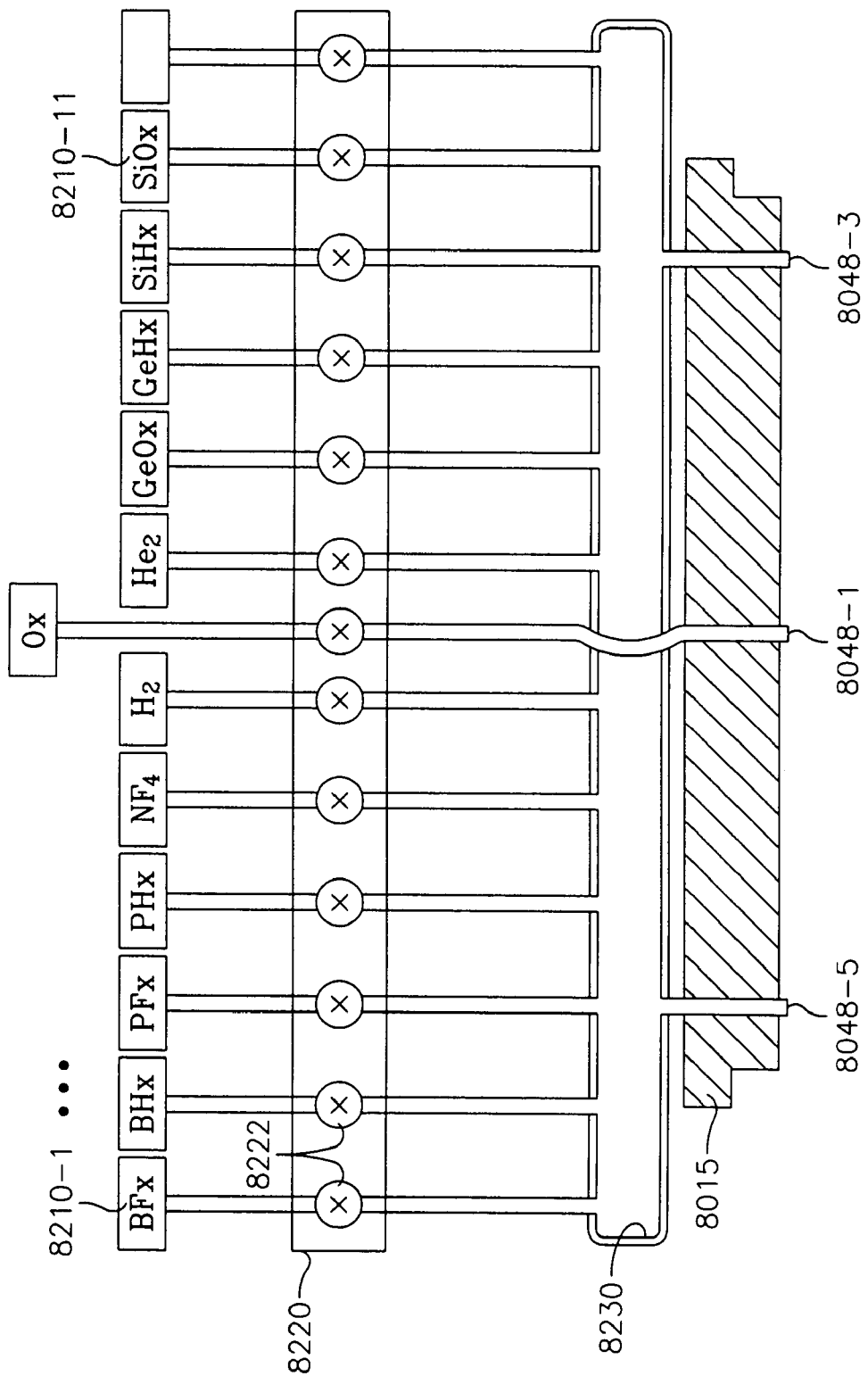
FIG. 35 illustrates a gas distribution panel.

FIG. 34 is a plan view of the interior surface of the ceiling 104, showing one arrangement of gas injection orifices 8048, in which there is one central orifice 8048-1 in the center of the ceiling 104 and four radially outer orifices 8048-2 through 8048-5 uniformly spaced at an outer radius. FIG. 35 illustrates how the dopant gas supply may be implemented as a gas distribution panel 8045. The gas distribution panel or supply 8045 of FIG. 35 has separate gas reservoirs 8210-1 through 8210-11 containing different dopant-containing gases including fluorides of boron, hydrides of boron, fluorides of phosphorous and hydrides of phosphorous. In addition, there are gas reservoirs for other gases used in co-implantation (hydrogen and helium), material enhancement (nitrogen, oxygen, hydrogen, helium), surface passivation or co-implantation (fluorides of silicon or germanium or carbon). In addition, the center orifice 8048-1 may be coupled to a reservoir oxygen gas, for use in photoresist removal and/or chamber cleaning. A control panel 8220 includes valves 8222 controlling gas flow from the respective reservoirs 8210 to the gas injection orifices. Preferably, the gases are mixed at or near the orifices, although a gas manifold 8230 may be provided to distribute the selected gases among the outer gas injection orifices 8048-2 through 8048-5. Alternatively, process gas may be injected at one or more locations in the sidewall 102, using the nozzles 116 of FIG. 1 or diffusers. FIG. 1 shows gas injectors 116 located around the chamber sidewalls 102 which inject gas radially inward. Gas may be injected parallel to the ceiling and/or wafer, or may be injected with some component toward ceiling and/or wafer. For some applications, it is advantageous to utilize multiple separate gas plenums, each with its own nozzle array. This can permit the use of chemistries which should not be combined except under vacuum, or may permit having several gas zones for neutral uniformity tuning. For this purpose, referring to FIG. 1, a first ring joins a first set of side wall injectors 116a and serves as a first plenum, while a second ring joins a second separate set of side wall injectors 116b and serves as a second plenum. The two rings or plenums 116a, 116b are supplied by separate respective sets of valves 8222 of the gas panel of FIG. 35.

Figure 36:
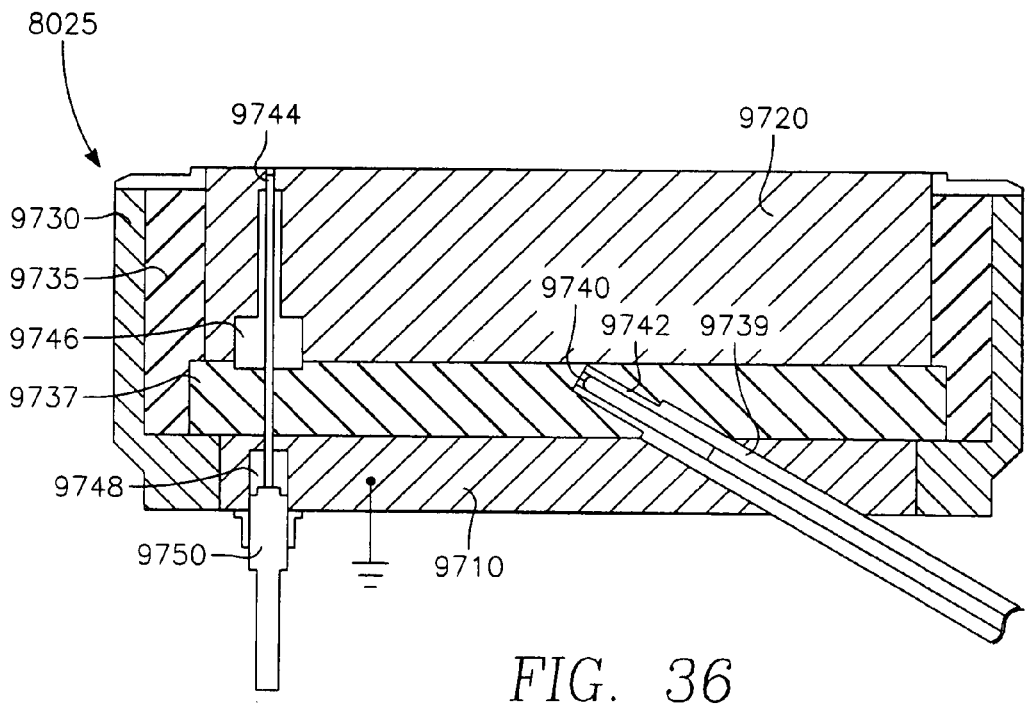
FIG. 36 is a cross-sectional side view of a high voltage wafer support pedestal.
Figure 37:
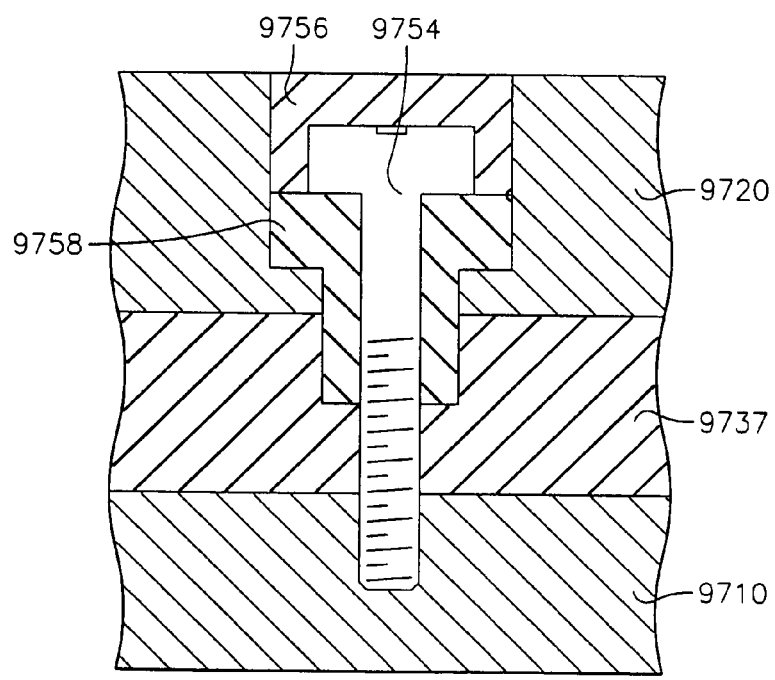
FIG. 37 is an enlarged cross-sectional view of the wafer support pedestal of FIG. 36 illustrating a fastener therein.

Depending upon the desired junction depth, the RF ion acceleration voltage applied to the wafer support pedestal 120 may be relatively small (e.g., 500 volts or less, down to about 10 volts) for a shallow junction or relatively large (e.g., 5,000 volts) for a deep junction. Some applications may require an RF ion acceleration voltage of over 10,000 volts. Such large voltages can cause arcing within the wafer support pedestal 120. Such arcing distorts process conditions in the reactor. In order to enable the wafer support pedestal 120 to withstand ion acceleration voltages as high a 10,000 volts, for example, without arcing, voids within the wafer support pedestal 120 are filled with a dielectric filler material having a high breakdown voltage, such as Rexolite®, a product manufactured by C-Lec Plastics, Inc. As illustrated in FIG. 36, the wafer support pedestal 120 can be replaced by a high voltage cathode 8025 consisting of a grounded aluminum base plate 9710, an aluminum electrostatic chuck plate 9720 and a cylindrical side wall 9730. Dielectric filler material 9735 fills voids between the side wall 9730 and the electrostatic chuck plate 9720. Dielectric filler material 9737 fills voids between the electrostatic chuck plate 9720 and the base plate 9710. A coaxial RF conductor 9739 carrying the RF ion acceleration power from the generator 180*e* (not shown in FIG. 36) is terminated in a narrow cylindrical conductive center plug 9740 that fits tightly within a matching conductive receptacle 9742 of the electrostatic chuck plate 9720. A wafer lift pin 9744 (one of three) extends through the cathode or pedestal 8025. The lift pin 9744 is tightly held within the electrostatic chuck plate 9720 by a surrounding blanket 9746 of the dielectric filler material. A void 9748 that accommodates a guide 9750 of the lift pin 9744 is located entirely within the base plate 9710 so as to minimize the risk of arcing within the void 9748. Referring to FIG. 37, bolt 9754 (one of several) holding the base plate 9710 and the electrostatic chuck plate 9720 together is completely encapsulated to eliminate any voids around the bolt 9754, with dielectric layers 9756, 9758 surrounding exposed portions of the bolt 9754. The foregoing features have been found to enable the wafer support pedestal to withstand an RF ion acceleration voltage of over 10,000 volts without experiencing arcing.

Figure 38:
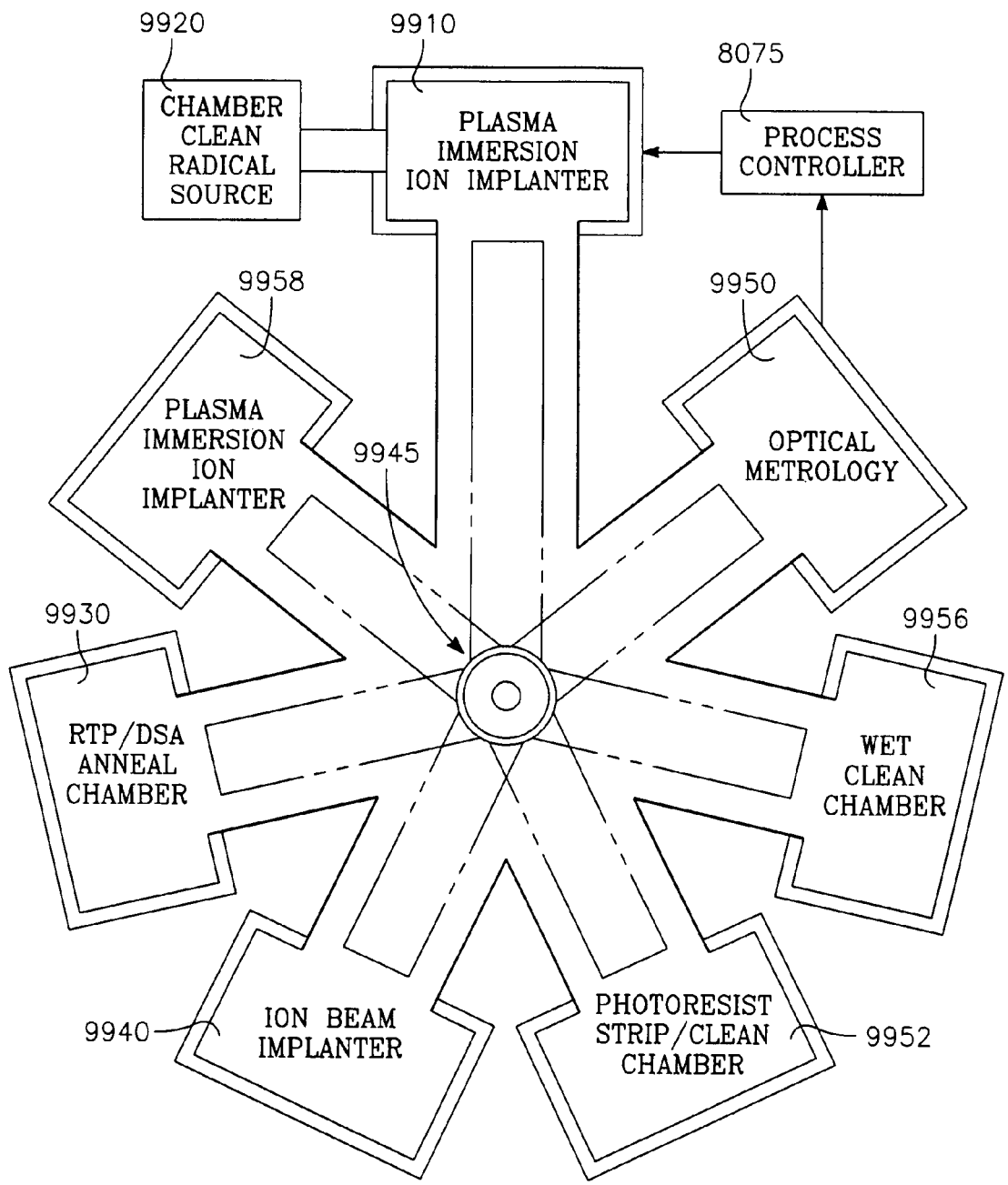
FIG. 38 is a block diagram illustrating an ion implantation processing system including a plasma immersion ion implantation reactor.

FIG. 38 illustrates an ion implantation system including a plasma immersion ion implantation reactor 9910 of the type disclosed above with reference to FIGS. 1-27. An independent source 9920 of chamber-cleaning radicals or gases (such as fluorine-containing gases or fluorine-containing radicals like $NF_3$ and/or other cleaning gases such as hydrogen-containing gases (e.g., $H_2$ or compounds of hydrogen) to produce hydrogen-containing radicals or oxygen-containing gases (e.g., $O_2$) is coupled to the implant reactor 9910 for use during chamber cleaning operations. A post-implant anneal chamber 9930 and an ion beam implanter 9940 are also included in the system of FIG. 38. In addition, an optical metrology chamber 9950 may also be included. Furthermore, a photoresist pyrolization chamber 9952 may be included in the system for removal of the photoresist mask subsequently after implant and prior to anneal. Alternatively, this may be accomplished within the plasma immersion implantation reactor 9910 using the RF plasma source power and optional ion acceleration power with oxygen gas, and/or by using the independent self-cleaning source with oxygen gas.

The system of FIG. 38 may also include a wet clean chamber 9956 for carrying out wafer cleaning. The wet clean chamber 9956 may employ such well known wet cleaning species as HF, for example. The wet clean chamber 9956 may be employed for pre-implantation or post-implantation cleaning of the wafer. The pre-implantation cleaning use of the wet clean chamber 9956 may be for removing a thin native oxide that can accumulate on the wafer between processing operations. The post-implantation cleaning use of the wet clean chamber 9956 may be for removing photoresist from the wafer in lieu of the photoresist strip chamber 9952. The system of FIG. 38 may further include a second, (third, fourth or more) plasma immersion ion implantation reactor 9958 of the same type as the reactor plasma immersion ion implantation (PIII) reactor 9910. In one example, the first PIII reactor 9910 may be configured to ion implant a first species while the second PIII reactor 9958 may be configured to implant a second species, so that a single PIII reactor need not be re-configured to implant the two species in each wafer. Furthermore, the first and second species may be dopant impurities for opposite semiconductor conductivity types (e.g., boron and phosphorus), in which case the second PIII reactor 9958 may be employed in lieu of the beam implantation tool 9940. Or, two N-type dopants (phosphorous and arsenic) may be implanted in addition to a P-type dopant (boron), in which case boron implantation is carried out by the first PIII reactor 9910, arsenic implantation is carried out in the ion beam tool 9940 and phosphorus implantation is carried out in the second PIII reactor 9958, for example. In another example, the 2 (or more) PIII reactors may be configured to implant the same species so as to increase the throughput of the system.

A wafer transfer robotic handler 9945 transfers wafers between the plasma ion implant reactor 9910, the anneal chamber 9930, the ion beam implanter 9940, the photoresist pyrolization chamber 9952, the optical metrology chamber 9950, the wet clean chamber 9956 and the second PIII reactor 9958. If the entire system of FIG. 38 is provided on a single tool or frame, the handler 9945 is a part of that tool and is supported on the same frame. However, if some of the components of the system of FIG. 38 are on separate tools located in separate places in a factory, then the handler 9945 is comprised of individual handlers within each tool or frame and a factory interface that transports wafers between tools within the factory, in the well-known manner. Thus, some or all of the components of the system of FIG. 38 may be provided on a single tool with its own wafer handler 9945. Alternatively, some or all of the components of the system of FIG. 38 may be provided on respective tools, in which case the wafer handler 9945 includes the factory interface.

The process controller 8075 can receive measurements of a previously implanted wafer from the optical metrology chamber 9950, and adjust the implant process in the plasma implant reactor 9910 for later wafers. The process controller 8075 can use established data mining techniques for process correction and control. The inclusion of the ion beam implanter 9940 permits the system to perform all of the ion implantation steps required in semiconductor fabrication, including implantation of light elements (such as boron or phosphorous) by the plasma ion implant reactor 9910 and implantation of heavier elements (such as arsenic) by the ion beam implanter 9940. The system of FIG. 38 may be simplified. For example, a first version consists of only the chamber cleaning radical source 9920, the PIII reactor 9910 and the process controller 8075. A second version includes the foregoing elements of the first version and, in addition, the optical metrology tool 9950. A third version includes the foregoing elements of the second version and, in addition, the ion beam implanter 9940 and/or the second PIII reactor 9958. A fourth version includes the foregoing elements of the third version and, in addition, the anneal chamber 9930.

During ion implantation, some plasma by-products may deposit as films on the wafer surface during ion implantation. This is particularly true in cases where the implantation process is carried out at a very low ion energy (low ion acceleration voltage) and particularly with a dopant gas consisting of a hydride of the dopant species (e.g., a hydride of boron or a hydride of phosphorous). In order to further reduce unwanted depositions that normally occur with hydride dopants (e.g., $B_2H_6$, $PH_3$), one aspect of the process is to add hydrogen and/or helium to the dopant gas to eliminate the deposition on the surface of the wafer.

Reduction of metal contamination of ion implantation processes is achieved by first depositing a passivation layer on all chamber surfaces prior to performing the ion implantation process. The passivation layer may be a silicon-containing layer such as silicon dioxide, silicon nitride, silicon, silicon carbide, silicon hydride, silicon fluoride, boron or phosphorous or arsenic doped silicon, boron or phosphorous or arsenic doped silicon carbide, boron or phosphorous or arsenic doped silicon oxide. Alternatively, the passivation may be a fluorocarbon or hydrocarbon or hydrofluorocarbon film. Compounds of germanium may also be used for passivation. Alternatively, the passivation layer may be a dopant-containing layer such as boron, phosphorous, arsenic or antimony formed by decomposition of a compound of the dopant precursor gas, such as $BF_3$, $B_2H_6$, $PF_3$, $PF_5$, $PH_3$, $AsF_3$, of $AsH_3$. It may be advantageous to form a passivation layer with a source gas or source gas mixture using gas(es) similar to that or those that are to be used in the subsequent plasma immersion implantation process step. (This may reduce unwanted etching of the passivation layer by the subsequent implant process step.) Alternatively, it may be advantageous to combine the fluoride and the hydride of a particular gas to minimize the fluorine and/or hydrogen incorporated in the passivation layer, for example, $BF_3+B_2H_6$, $PH_3+PF_3$, $AsF_3+AsH_3$, $SiF_4+SiH_4$, or $GeF_4+GeH_4$.

Figure 39:
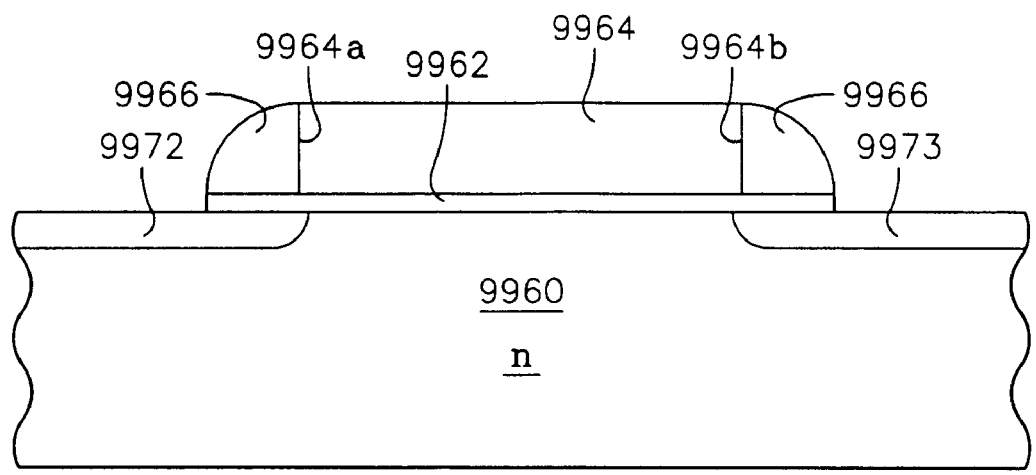
FIG. 39 is a cross-sectional view of the surface of a wafer during ion implantation of source and drain contacts and of the polysilicon gate of a transistor.
Figure 40:
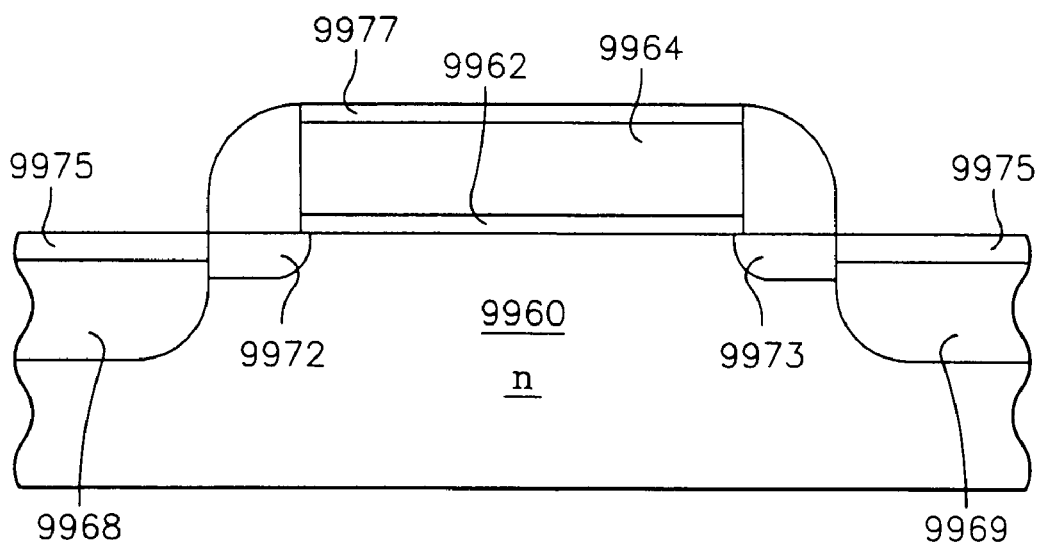
FIG. 40 is a cross-sectional view of the surface of a wafer during ion implantation of the source and drain extensions of a transistor.

Working Ion Implantation Examples:

A principal application of a PIII reactor is the formation of PN junctions in semiconductor crystals. FIGS. 39 and 40 illustrate different stages in the deposition of dopant impurities in the fabrication of a P-channel metal oxide semiconductor field effect transistor (MOSFET). Referring first to FIG. 39, a region 9960 of a semiconductor (e.g., silicon) wafer may be doped with an N-type conductivity impurity, such as arsenic or phosphorus, the region 9960 being labeled "n" in the drawing of FIG. 39 to denote its conductivity type. A very thin silicon dioxide layer 9962 is deposited on the surface of the wafer including over n-type region 9960. A polycrystalline silicon gate 9964 is formed over the thin oxide layer 9962 from a blanket polysilicon layer that has been doped with boron in the PIII reactor. After formation of the gate 9964, p-type dopant is implanted in the PIII reactor to form source and drain extensions 9972 and 9973. Spacer layers 9966 of a dielectric material such as silicon dioxide and/or silicon nitride (for example) are formed along two opposite vertical sides 9964a, 9964b of the gate 9964. Using the PIII reactor of the type disclosed with reference to any one of FIGS. 1-27 with a process gas consisting of BF3 or B2H6 (for example), boron is implanted over the entire N-type region 9960. The spacer layers mask their underlying regions from the boron, so that P-type conductivity source and drain contact regions 9968, 9969 are formed on either side of the gate 9964, as shown in FIG. 40. This step is carried out with a boron-containing species energy in the range of 2 to 10 kVpp ion acceleration voltage (e.g., applied by one or a combination of the voltage sources 180a-e of FIG. 26, for example). Typically, the RF ion acceleration voltage on the wafer pedestal 8025 is twice the desired boron energy. The implantation is carried out for a sufficient time and at a sufficient ion flux or ion density to achieve a surface concentration of boron exceeding $5 \times 10^{15}$ atoms per square centimeter. The concentration of boron in the gate 9964 is then increased to $1 \times 10^{16}$ atoms per square centimeter by masking the source and drain contacts 9968, 9969 (by depositing a layer of photoresist thereover, for example) and carrying out a further (supplementary) implantation step of boron until the concentration of boron in the gate 9964 reaches the desired level ($1 \times 10^{16}$ atoms/cubic centimeter). The source and drain contacts 9968, 9969 are not raised to the higher dopant concentration (as is the gate 9964) because the higher dopant concentration may be incompatible with formation of a metal silicide layer (during a later step) over each contact 9968, 9969. However, the gate 9964 must be raised to this higher dopant concentration level in order to reduce carrier depletion in the gate 9964 near the interface between the gate 9964 and the thin silicon dioxide layer 9962. Such carrier depletion in the gate would impede the switching speed of the transistor. The dopant profile in the gate must be highly abrupt in order attain a high dopant concentration in the gate 9964 near the thin oxide layer 9962 without implanting dopant into the underlying thin oxide layer 9962 or into the source-to-drain channel underlying the thin oxide layer 9962. Another measure that can be taken to further enhance gate performance and device speed is to raise the dielectric constant of the thin silicon dioxide layer 9962 by implanting nitrogen in the thin silicon dioxide layer 9962 so that (upon annealing) nitrogen atoms replace oxygen atoms in the layer 9962, as will be described later in this specification. A further measure for enhancing gate performance is conformal implanting in which dopant ions that have been deflected from their vertical trajectory by collisions in the plasma sheath over the wafer surface are able to implant into the vertical side walls of the gate 9964. This further increases the dopant concentration in the gate 9964 near the interface with the thin oxide layer 9962, and provide a more uniform and isotropic dopant distribution within the gate. A yet further measure for enhancing gate performance for gates of N-channel devices implanted with arsenic is to implant phosphorus during the supplementary implant step using the PIII reactor. The phosphorus is lighter than arsenic and so diffuses more readily throughout the semiconductor crystal, to provide less abrupt junction profile in the source drain contact areas.

The depth of the ion implantation of the source and drain contacts 9968, 9969 may be in the range of 400 to 800 Å. If the gate 9964 is thinner than that, then the gate 9964 must be implanted in a separate implantation step to a lesser depth to avoid implanting any dopant in the thin oxide layer 9962 below the gate 9964. In order to avoid depletion in the region of the gate 9964 adjacent the thin oxide layer 9962, the implantation of the gate must extend as close to the gate/oxide interface as possible without entering the thin oxide layer 9962. Therefore, the implant profile of the gate must have the highest possible abruptness (e.g., 3 nm/decade or less) and a higher dopant dose (i.e., $1 \times 10^{16}$ atoms/cm$^2$)

Referring now to FIG. 40, source and drain extensions 9972, 9973 are typically formed before depositing and forming the spacer layers 9966 of FIG. 39. The extensions layers are formed by carrying out a more shallow and light implant of boron over the entire region 9960. Typically, the junction depth of the source and drain extensions is only about 100 to 300 Angstroms and the implant dose is less than $5 \times 10^{15}$ atoms/square centimeter. This implant step, therefore, has little effect on the dopant profiles in the gate 9964 or in the source and drain contacts 9968, 9969, so that these areas need not be masked during the implantation of the source and drain extensions 9972, 9973. However, if masking is desired, then it may be carried out with photoresist. The source and drain extensions are implanted at an equivalent boron energy of 0.5 kV, requiring a 1.0 kVpp RF ion acceleration voltage.

Metal silicide contact layers 9975 are formed on the source and drain contacts 9968, 9969, and a metal silicide contact layer 9977 is formed on the gate 9964.

The same structures illustrated in FIGS. 39 and 40 are formed in the fabrication of an N-channel MOSFET. However, the region 9960 is initially doped with a P-type conductivity such as boron and is therefore a P-type conductivity region. And, the implantation of the gate 9964 and of the source and drain contacts 9968, 9969 (illustrated in FIG. 39) is carried out in a beam implanter (rather than in a PIII reactor) with an N-type conductivity impurity dopant such as arsenic. Furthermore, the supplementary implantation of the gate 9964 that raises its dopant dose concentration to $1 \times 10^{16}$ atoms/cm$^2$ is carried out in the PIII reactor with phosphorus (rather than arsenic) using a phosphorus-containing process gas. Phosphorus is preferred for this latter implantation step because it diffuses more uniformly than arsenic, and therefore enhances the quality of the N-type dopant profile in the gates 9964 of the N-channel devices. The ion beam voltage is in the range of 15-30 kV for the arsenic implant step (simultaneous implanting of the N-channel source and drain contacts 9968, 9969 and of the N-channel gates 9964), and is applied for a sufficient time to reach a dopant surface concentration exceeding $5 \times 10^{15}$ atoms per cubic centimeter. The supplementary gate implant of phosphorus is carried out at an ion beam voltage in the range of only 2-5 kV for a sufficient time to raise the dopant surface concentration in the N-channel gates to $1 \times 10^{16}$ atoms/cubic cm.

The implantation steps involving phosphorus and boron are advantageously carried out in the PIII reactor rather than an ion beam implanter because the ion energies of these light elements are so low that ion flux in a beam implanter would be very low and the implant times would be inordinately high (e.g., half and hour per wafer). In the PIII reactor, the source power can be 800 Watts at 13.56 MHz (with the 200 kHz offset between the two torroidal plasma currents as described above), the implant step being carried out for only 5 to 40 seconds per wafer.

The sequence of ion implantation steps depicted in FIGS. 39 and 40 may be modified, in that the light shallow source and drain extension implant step of FIG. 40 may be carried out before or after formation of the spacer layer 9966 and subsequent heavy implantation of the contacts 9968, 9969 and gate 9964. When extension implants are done after the spacer layer 9966 is formed, the spacer layer 9966 must be removed before the extension implants are performed.

Figure 41:
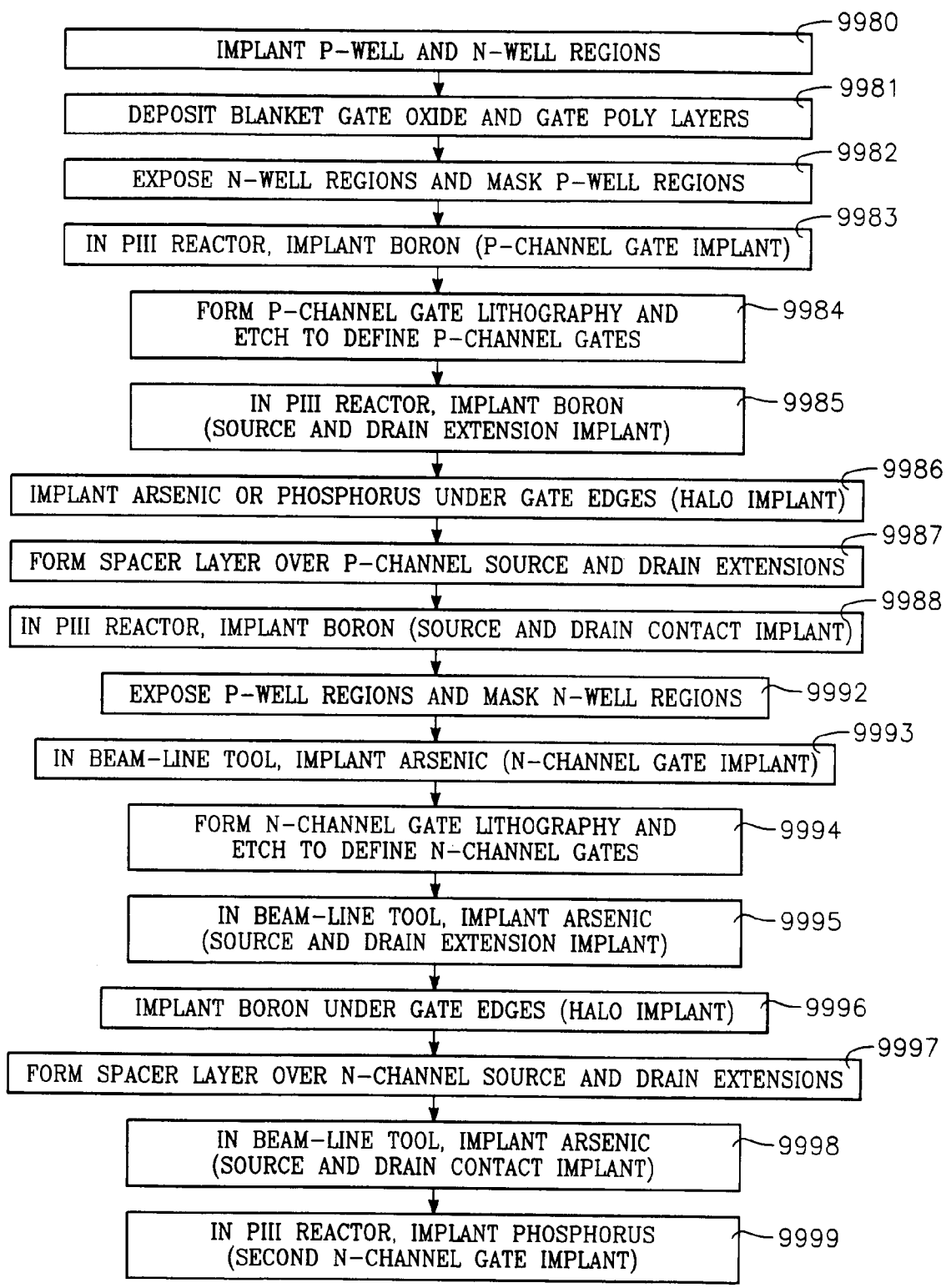
FIG. 41 is a flow diagram illustrating an ion implantation process carried out using the reactor of FIG. 36.

One example of a process for fabricating complementary MOSFETS (CMOS FETs) is illustrated in FIG. 41. In the first step (block 9980), the P-well and N-well regions of the CMOS device are implanted in separate steps. Then, a blanket thin gate oxide layer and an overlying blanket polysilicon gate layer are formed over the entire wafer (block 9981 of FIG. 41). The P-well regions are masked and the N-well regions are left exposed (block 9982). The portions of the polysilicon gate layer lying in the N-well regions are then implanted with boron in a PIII reactor (block 9983). The P-channel gates (9964 in FIG. 39) are then photolithographically defined and etched, to expose portions of the silicon wafer (block 9984). Source and drain extensions 9972, 9973 of FIG. 39 self-aligned with the gate 9964 are then formed by ion implantation of boron using the PIII reactor (block 9985). A so-called "halo" implant step is then performed to implant an N-type dopant under the edges of each P-channel gate 9964 (block 9986). This is done by implanting arsenic using an ion beam tilted at about 30 degrees from a vertical direction relative to the wafer surface and rotating the wafer. Alternatively, this step may be accomplished by implanting phosphorus in the PIII reactor using a chamber pressure and bias voltage conducive to a large sheath thickness to promote collisions in the sheath that divert the boron ions from a vertical trajectory. Then, the spacer layers 9986 are formed over the source drain extensions 9972, 9973 (block 9987) and boron is then implanted at a higher energy to form the deep source drain contacts 9969 (block 9988), resulting in the structure of FIG. 40. The reverse of step 9982 is then performed by masking the N-well regions (i.e., the P-channel devices) and exposing the P-well regions (block 9992). Thereafter steps 9993 through 9998 are performed that correspond to steps 9983 through 9988 that have already been described, except that they are carried out in the P-well regions rather than in the N-well regions, the dopant is Arsenic rather than Boron, and a beam line ion implanter is employed rather than a PIII reactor. And, for the N-channel device halo implant of block 9996 (corresponding to the P-channel device halo implant of block 9986 described above), the dopant is a P-type dopant such as boron. In the case of the N-channel devices implanted in steps 9993 through 9998, a further implant step is performed, namely a supplemental implant step (block 9999) to increase the dose in the polysilicon gate as discussed above in this specification. In the supplemental implantation step of block 9999, phosphorus is the N-type dopant impurity and is implanted using a PIII reactor rather than a beam implanter (although a beam implanter could be employed instead).

As noted above, the process may be reversed so that the gate 9964 and source and drain contacts 9968, 9969 are implanted before the source and drain extensions 9972, 9973.

After all ion implantations have been carried out, the wafer is subjected to an annealing process such as spike annealing using rapid thermal processing (RTP) and/or the dynamic surface annealing (DSA) process discussed earlier in this specification. Such an annealing process causes the implanted dopant ions, most of which came to rest in interstitial locations in the crystal lattice, to move to atomic sites, i.e., be substituted for silicon atoms originally occupying those sites. More than one annealing step can be used to form the pmos and nmos devices and these steps can be inserted in the process flow as appropriate from activation and diffusion point of view.

The foregoing ion implantation processes involving the lighter atomic elements (e.g., boron and phosphorus) are carried out using a PIII reactor in the modes described previously. For example, the bias power frequency is selected to maximize ion energy while simultaneously providing low impedance coupling across dielectric layers. How this is accomplished is described above in this specification.

The ion implantation processes described above are enhanced by other processes. Specifically, in order to prevent channeling and in order to enhance the fraction of implanted ions that become substitutional upon annealing, the semiconductor wafer crystal may be subjected to an ion bombardment process that partially amorphizes the crystal by creating crystal defects. The ions employed should be compatible with the wafer material, and may be formed in the PIII reactor in a plasma generated from one or more of the following gases: silicon fluoride, silicon hydride, germanium fluoride, germanium hydride, Xenon, Argon, or carbon fluoride (ie. tetrafluoromethane, octafluorocyclobutane, etc) or carbon hydride (ie. methane, acetylene, etc) or carbon hydride/fluoride (ie. tetrafluoroethane, difluoroethylene, etc) gases. One advantage of the PIII reactor is that its implant processes are not mass selective (unlike an ion beam implanter). Therefore, during ion implantation of a dopant impurity such boron, any other element may also be implanted simultaneously, regardless of ion mass in the PIII reactor. Therefore, unlike an ion beam implanter, the PIII reactor is capable of simultaneously implanting a dopant impurity while carrying out an amorphizing process. This may be accomplished using a BF3 gas (to provide the dopant ions) mixed with an SiF4 gas (to provided the amorphizing bombardment ion species). Such a simultaneous ion implantation process is referred to as a co-implant process. The amorphization process may also be carried out sequentially with the doping process. In addition to amorphization, simultaneous implants of dopant and non-dopant atoms such as Fluorine, Germanium, Carbon or other elements are done to change the chemistry of the Silicon wafer. This change in chemistry can help in increasing dopant activation and reducing dopant diffusion.

Another process that can be carried out in the PIII reactor is a surface enhancement process in which certain ions are implanted in order to replace other elements in the crystal. One example of such a surface enhancement process is nitrodization. In this process, the dielectric constant of the thin silicon dioxide layer 9962 is increased (in order to increase device speed) by replacing a significant fraction of the oxygen atoms in the silicon dioxide film with nitrogen atoms. This is accomplished in the PIII reactor by generating a plasma from a nitrogen-containing gas, such as ammonia, and implanting the nitrogen atoms into the silicon dioxide layer 9962. This step may be performed at any time, including before, during and/or after the implantation of the dopant impurity species. If the nitrodization process is performed at least partially simultaneously with the dopant ion implant step, then the nitrodization process is a co-implant process. Since the ion implantation process of the PIII reactor is not mass selective, the co-implant process may be carried out with any suitable species without requiring that it atomic weight be the same as or related to the atomic weight of the dopant implant species. Thus, for example, the dopant species, boron, and the surface enhancement species, nitrogen, have quite different atomic weights, and yet they are implanted simultaneously in the PIII reactor. Typically nitrodization is performed without implanting dopant atoms.

A further process related to ion implantation is surface passivation. In this process, the interior surfaces of the reactor chamber, including the walls and ceiling, are coated with a silicon-containing passivation material (such as silicon dioxide or silicon nitride or silicon hydride) prior to the introduction of a production wafer. The passivation layer prevents the plasma from interacting with or sputtering any metal surfaces within the plasma reactor. The deposition the passivation layer is carried out by igniting a plasma within the reactor from a silicon containing gas such as silane mixed with oxygen, for example.

Upon completion of the ion implantation process, the passivation layer is removed, using a suitable etchant gas such as NF3 which may be combined with a suitable ion bombardment gas source such as argon oxygen, or hydrogen. During this cleaning step, the chamber surfaces may be heated to 60 degrees C. or higher to enhance the cleaning process. A new passivation layer is deposited before the next ion implantation step.

Alternatively, a new passivation layer may be deposited before implanting a sequence of wafers, and following the processing of the sequence, the passivation layer and other depositions may be removed using a cleaning gas.

Figure 42:
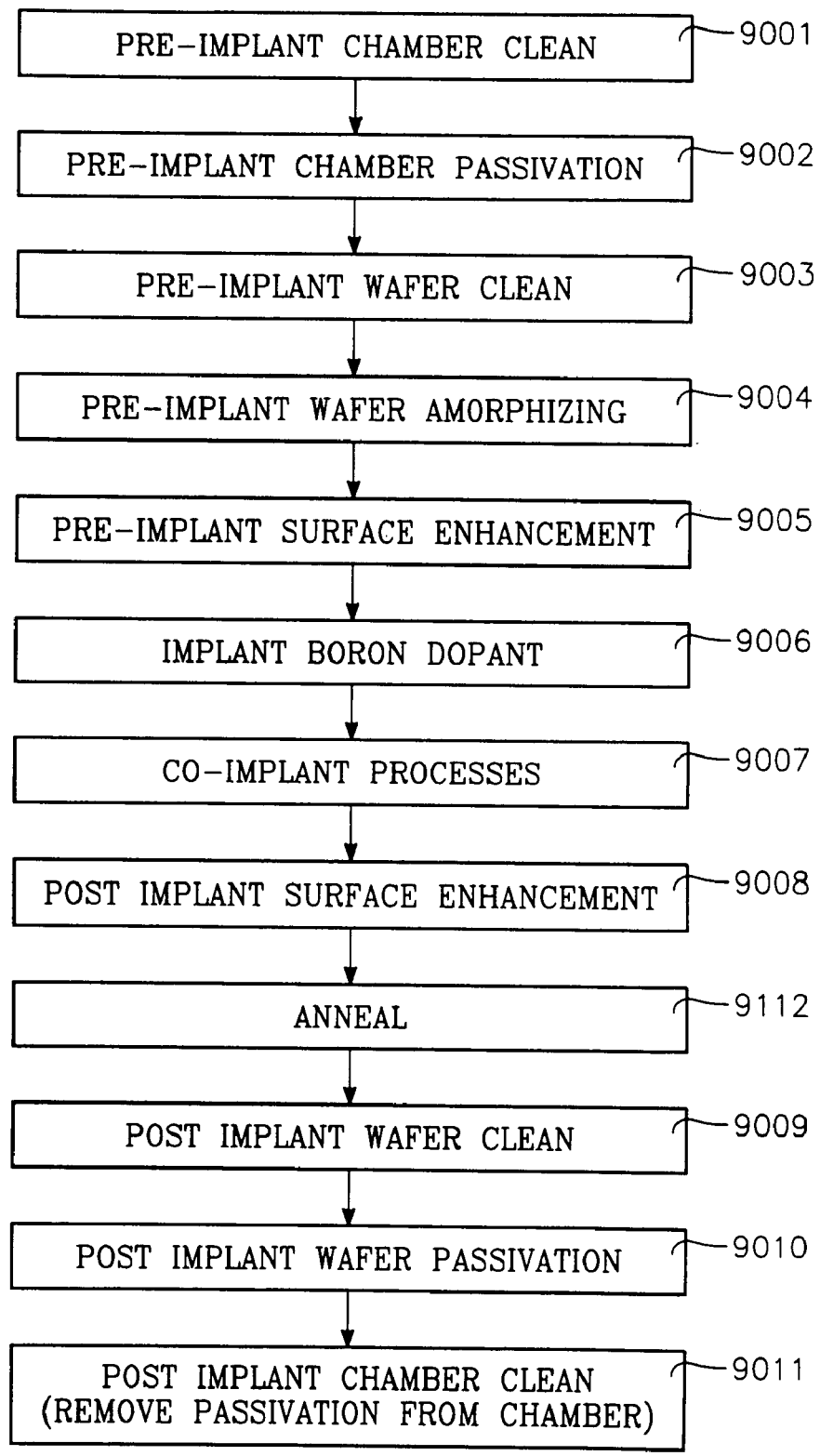
FIG. 42 is a flow diagram illustrating a sequence of possible pre-implant, ion implant and possible post implant processes carried in the system of FIG. 38.

FIG. 42 is a flow diagram showing the different options of combining the foregoing ion implantation-related processes with the dopant implantation processes of FIG. 41. A first step is cleaning the chamber to remove contamination or to remove a previously deposited passivation layer (block 9001 of FIG. 42). Next, a passivation layer of silicon dioxide, for example, is deposited over the interior surfaces of the chamber (block 9002) prior to the introduction of the wafer to be processed. Next, the wafer is introduced into the PIII reactor chamber and may be subjected to a cleaning or etching process to remove thin oxidation layers that may have accumulated on the exposed semiconductor surfaces in the brief interim since the wafer was last processed (block 9003). A pre-implant wafer amorphizing process may be carried out (block 9004) by ion-bombarding exposed surfaces of the wafer with silicon ions, for example. A pre-implant surface enhancement process may also be carried out (block 9005) by implanting a species such as nitrogen into silicon dioxide films. The dopant implantation process may then be carried out (block 9006). This step is an individual one of the boron or phosphorus implant steps illustrated in the general process flow diagram of FIG. 41. During the dopant implant process of block 9006, other ions in addition to the dopant ions may be implanted simultaneously in a co-implant process (block 9007). Such a co-implant process (9007) may be an amorphizing process, a light etch process that prevents accumulation of plasma by-products on the wafer surface, enhancing dopant activation and reducing dopant diffusion, or surface enhancement process. After completion of the dopant ion implant process (9006) and any co-implant process (9007), various post implant processes may be carried out. Such post implant processes may include a surface enhancement process (block 9008). Upon completion of all implant steps (including the step of block 9008), an implant anneal process is carried out (block 9012) after removing any photo-resist mask layers on the wafer in the preceding wafer clean step of block 9009. This anneal process can be a dynamic surface anneal in which a laser beam (or several laser beams) are scanned across the wafer surface to locally heat the surface to nearly melting temperature (about 1300 degrees C.) or to melting temperature, each local area being heated for an extremely short period of time (e.g., on the order of nanoseconds to tens of milliseconds). Other post implant processes carried out after the anneal step of block 9112 may include a wafer cleaning process (block 9009) to remove layers of plasma by-products deposited during the ion implantation process, deposition of a temporary passivation coating on the wafer to stabilize the wafer surface (block 9010) and a chamber cleaning process (block 9011), carried out after removal of the wafer from the PIII reactor chamber, for removing a previously deposited passivation layer from the chamber interior surfaces.

While the invention has been described in detail by specific reference to preferred embodiments, it is understood that variations and modifications thereof may be made without departing from the true spirit and scope of the invention.

What is claimed is:

1. A plasma immersion ion implantation process for implanting a selected species at a desired ion implantation depth profile in a workpiece, comprising:

providing a reactor chamber with an ion shower grid that divides said chamber into an upper ion generation region and a lower process region, said ion shower grid having plural elongate orifices oriented in a non-parallel direction relative to a surface plane of said ion shower grid;

placing a workpiece in said process region;

furnishing said selected species into said ion generation region;

evacuating said process region;

applying plasma source power to generate a plasma of said selected species in said ion generation region, and applying a grid potential to said ion shower grid to create a flux of ions from the plasma through said grid and into said process region;

applying an RF bias voltage to said workpiece, said RF bias voltage corresponding to said desired ion implantation profile, whereby to implant said ions into said workpiece at a depth below a surface of the workpiece according to said ion implantation depth profile; and adjusting ion energy at said workpiece surface by adjusting the frequency of said RF bias voltage.

2. The process of claim 1 wherein the step of evacuating is carried out at an evacuation rate sufficient to maintain an ion-neutral mean collision distance in said process region in excess of a multiple of a distance between said workpiece and said ion shower grid.

3. The process of claim 1 wherein the steps of (a) applying plasma source power and (b) applying a grid potential are comprised in a single step of applying a potential between said ion shower grid and said ion generation region.

4. The process of claim 3 wherein the step of applying a grid potential between said grid and said ion generation region comprises applying a potential between said grid and a wall of said ion generation region.

5. The process of claim 1 further comprising controlling the temperature of said ion shower grid.

6. The process of claim 5 wherein the step of controlling the temperature of said ion shower grid comprises pumping a thermal transfer fluid through fluid flow passages thermally coupled to said ion shower grid and controlling the temperature of said thermal transfer fluid.

7. A plasma immersion ion implantation process for implanting a selected species at a desired ion implantation depth profile in a workpiece, comprising:

providing a reactor chamber with an ion shower grid that divides said chamber into an upper ion generation region and a lower process region, said ion shower grid having plural elongate orifices oriented in a non-parallel direction relative to a surface plane of said ion shower grid;

placing a workpiece in said process region;

furnishing said selected species into said ion generation region;

evacuating said process region;

applying plasma source power to generate a plasma of said selected species in said ion generation region, and applying a grid potential to said ion shower grid to create a flux of ions from the plasma through said grid and into said process region;

applying an RF bias voltage to said workpiece, said RF bias voltage corresponding to said desired ion implantation profile, whereby to implant said ions into said workpiece at a depth below a surface of the workpiece according to said ion implantation depth profile; and providing neutralization electrons in the vicinity of said workpiece by generating a flow of electrons from an electron gun toward said workpiece surface.

8. A plasma immersion ion implantation process for implanting a selected species at a desired ion implantation depth profile in a workpiece, comprising:

providing a reactor chamber with an ion shower grid that divides said chamber into an upper ion generation region and a lower process region, said ion shower grid having plural elongate orifices oriented in a non-parallel direction relative to a surface plane of said ion shower grid;

placing a workpiece in said process region;

furnishing said selected species into said ion generation region;

evacuating said process region;

applying plasma source power to generate a plasma of said selected species in said ion generation region, and applying a grid potential to said ion shower grid to create a flux of ions from the plasma through said grid and into said process region;

applying an RF bias voltage to said workpiece, said RF bias voltage corresponding to said desired ion implantation profile, whereby to implant said ions into said workpiece at a depth below a surface of the workpiece according to said ion implantation depth profile; and providing neutralization electrons in the vicinity of said workpiece by injecting an electron-donor gas into said process region and near said workpiece.

9. A plasma immersion ion implantation process for implanting a selected species at a desired ion implantation depth profile in a workpiece, comprising:

providing a reactor chamber with an ion shower grid that divides said chamber into an upper ion generation region and a lower process region, said ion shower grid having plural elongate orifices oriented in a non-parallel direction relative to a surface plane of said ion shower grid;

placing a workpiece in said process region;

furnishing said selected species into said ion generation region;

evacuating said process region;

applying plasma source power to generate a plasma of said selected species in said ion generation region, and applying a grid potential to said ion shower grid to create a flux of ions from the plasma through said grid and into said process region;

applying an RF bias voltage to said workpiece, said RF bias voltage corresponding to said desired ion implantation profile, whereby to implant said ions into said workpiece at a depth below a surface of the workpiece according to said ion implantation depth profile; and wherein the step of applying plasma source power comprises generating a torroidal plasma current in said ion generation region through an external reentrant conduit coupled across said ion generation region, and the step of applying said grid potential comprises applying a grid potential between said plasma and said ion shower grid.

10. The process of claim 9 wherein the step of applying a grid potential between said plasma and said ion shower grid comprises applying a potential from a grid potential source between a chamber surface of said ion generation region and said ion shower grid.

11. The process of claim 9 wherein said bias voltage is such that said grid and said workpiece have successively greater attractive potentials for ions.

12. The process of claim 9 wherein said plasma source power comprises RF power and said grid potential comprises at least one of: (a) a pulsed D.C. voltage, (b) an RF voltage, (c) a D.C. voltage, (d) a pulsed RF voltage.

13. The process of claim 12 wherein said grid potential comprises a mixture of at least two of (a) a pulsed D.C. voltage, (b) an RF voltage, (c) a D.C. voltage, (d) a pulsed RF voltage.

14. The process of claim 1 further the following steps carried out prior to the step of placing a workpiece in said process region:

depositing a layer of a process-compatible material on reactor chamber interior surfaces.

15. The process of claim 14 wherein the step of depositing a layer of a process-compatible material comprises:

introducing a process gas comprising a precursor of said process-compatible material into said ion generation region;

applying plasma source power into said ion generation region.

16. The process of claim 15 further comprising applying an ion extraction potential to said grid.

17. The process of claim 14 wherein the step of depositing a layer of a process-compatible material comprises furnishing into at least one of said ion generation and process regions ions or radicals of said process-compatible material from a plasma source external of said chamber.

18. The process of claim 1 wherein the step of applying a grid potential comprises holding the potential of said plasma at a reference potential and applying a negative voltage to said ion shower grid relative to said reference potential.

19. The process of claim 18 wherein said reference potential is ground.

20. The method of claim 1 wherein said bias voltage comprises an RF bias voltage having a bias frequency that is sufficiently low for ions in a plasma sheath near said workpiece to follow electric field oscillations across said sheath at said bias frequency and that is sufficiently high so that RF voltage drops across dielectric layers on said workpiece do not exceed a predetermined fraction of the RF bias voltage applied to said workpiece support.

21. The method of claim 1 wherein said bias voltage has a bias frequency between 10 kHz and 10 MHz.

22. The method of claim 1 wherein said bias voltage has a bias frequency between 50 kHz and 5 MHz.

23. The method of claim 1 wherein said bias power or voltage has a bias frequency between 100 kHz and 3 MHz.

24. The method of claim 1 wherein said bias voltage has a bias frequency of about 2 MHz to within about 5%.

25. The method of claim 1 wherein said workpiece comprises a semiconductor material, and said selected species is a dopant impurity that promotes one of a p-type or n-type conductivity in said semiconductor material, and wherein said desired depth profile corresponds to a desired p-n junction depth, whereby said bias voltage affects said junction depth.

26. The method of claim 25 wherein said selected species comprises a chemical combination of said dopant impurity and another element.

27. The method of claim 26 wherein said selected species comprises a fluoride of said dopant impurity.

28. The method of claim 26 wherein said selected species comprises a hydride of said dopant impurity.

29. The method of claim 26 wherein said selected species further comprises a co-implant ion bombardment element which removes from a top surface of said workpiece a material that tends to accumulate during implantation of said dopant impurity.

30. The method of claim 1 wherein said workpiece comprises a semiconductor crystal which is to be implanted with a dopant impurity element, and wherein said selected species comprises a pre-implant ion bombardment species that creates damage in said semiconductor crystal.

31. The method of claim 1 wherein said workpiece comprises a dielectric thin film, and wherein said selected species comprises a surface-enhancement species which enhances a characteristic of said dielectric thin film layer upon implantation and substitution.

32. The method of claim 31 wherein said characteristic is the electrical behavior of said dielectric thin film.

33. The method of claim 31 wherein said dielectric thin film comprises an oxide of a semiconductor element, and said selected species comprises a non-oxygen element to be substituted for oxygen atoms in said dielectric thin film.

34. The method of claim 1 wherein the step of furnishing said selected species is preceded by:
introducing a passivation gas containing a passivation layer-forming species;
generating from said passivation gas a plasma;
attracting passivation layer-forming species from said plasma to said workpiece by applying bias voltage to said workpiece support, to form a passivation layer on said workpiece.

35. The method of claim 34 wherein said passivation gas comprises one of: (a) a hydride, (b) a fluoride, (c) an oxide of a semiconductor element.

36. The method of claim 1 wherein the step of placing said workpiece on said workpiece support is preceded by:
introducing a passivation process gas containing passivation-forming chemical species;
generating from said passivation gas a plasma;
attracting passivation layer-forming species from said plasma to interior surfaces of said reactor chamber, to form a passivation layer on said interior surfaces.

37. The method of claim 36 wherein said passivation gas comprises one of a hydride, a fluoride or an oxide of a semiconductor element.

38. The method of claim 36 wherein said passivation gas comprises a chemical species containing carbon and fluorine.

39. The method of claim 36 wherein the step of generating a plasma from said passivation gas is followed by:
removing said workpiece from said reactor chamber;
introducing a passivation layer-removing gas into said chamber;
generating a plasma from said passivation layer-removing gas, so as to remove said passivation layer from said interior surfaces of said chamber.

40. The method of claim 39 further comprising heating said interior surfaces of said reactor chamber during the removal of said passivation layer.

41. The method of claim 40 wherein said passivation layer-removing gas comprises a fluorine-containing gas.

42. The method of claim 1 wherein the step of generating a plasma is followed by:
heating said workpiece to a temperature sufficiently high to cause atoms of said selected species implanted in said workpiece to be substituted into atomic sites in a crystal lattice of said workpiece.

43. The method of claim 29 wherein said selected species is a hydride of said dopant species and said ion bombardment element comprises one of Helium, Hydrogen, a fluoride of a semiconductor element, or SiF4.

44. The method of claim 39 wherein said passivation layer-removing gas comprises NF3.

45. The method of claim 25 wherein said semiconductor material is silicon and said dopant impurity is boron.

46. The method of claim 25 wherein said semiconductor element is silicon and said dopant impurity is phosphorus.

47. The method of claim 25 wherein said semiconductor element comprises one of silicon or germanium.

48. The method of claim 1 wherein:
said workpiece comprises plural dielectric gates formed over an underlying layer having horizontal and non-horizontal surfaces;
the step of applying bias voltage comprises selecting a level of said bias voltage promotive of a sufficiently collisional plasma sheath over said workpiece to produce a significant fraction of ions impacting said workpiece at trajectories other than orthogonal to said whereby to implant ions in said horizontal and non-horizontal surfaces of said workpiece.

49. The method of claim 25 wherein said workpiece comprises a crystal lattice and wherein the step of generating a plasma is preceded by:
introducing into said chamber an amorphizing gas comprising an ion bombardment species;

generating a plasma from said amorphizing gas;
applying bias voltage to said workpiece support to attract ions of said ion bombardment species toward said workpiece whereby said ions cause damage in said crystal lattice.

50. The method of claim 49 wherein said ion bombardment species comprises a semiconductive species.

51. The method of claim 50 wherein said ion bombardment species comprises one of silicon or germanium.

52. The method of claim 26 wherein said selected species further comprises an ion bombardment species for co-implantation with said dopant impurity in said workpiece.

53. The method of claim 52 wherein ions of said ion bombardment species are implanted in said workpiece to cause crystal lattice damage for amorphizing said workpiece during implantation of said dopant impurity in said workpiece.

54. The method of claim 53 wherein said ion bombardment species comprises a semiconductor species.

55. The method of claim 54 wherein said semiconductor species comprises one of silicon or germanium.

56. The method of claim 1 further comprising pulse modulating said bias voltage.

57. The method of claim 56 further comprising pulse modulating said source power.

58. The method of claim 57 further comprising maintaining a relation between the pulse modulating of said bias voltage and the pulse modulating of said source power that is one of:
    (a) push-pull;
    (b) in-synchronism;
    (c) symmetrical;
    (d) non-symmetrical.

59. The method of claim 1 wherein the step of applying said bias voltage comprises applying a single burst of said bias voltage to said workpiece.

60. The method of claim 59 wherein said single burst has a duration corresponding to a desired implant dosage.

61. The method of claim 1 further comprising distributing ion flux across said workpiece by translating said grid and said workpiece relative to one another in a direction parallel to the plane of said workpiece.

62. The process of claim 1, further comprising the following steps carried out after the implanting of said selected species with said desired depth profile:
    removing said workpiece from said chamber;
    cleaning the reactor chamber interior surfaces.

63. The process of claim 62 wherein the step of cleaning the reactor interior chamber surfaces comprises:
    introducing a process gas comprising an etchant species into said ion generation region;
    applying plasma source power into said ion generation region and applying an ion extraction potential to said grid.

64. The process of claim 62 wherein the step of cleaning the reactor interior surfaces comprises:
    furnishing into at least one of said ion generation and process regions ions or radicals of an etchant species.

65. The process of claim 1 wherein the step of furnishing said selected species comprises injecting a process gas containing said selected species into said ion generation region.

66. The process of claim 65 wherein said process gas comprises one of:
    (a) a gaseous metal compound;
    (b) a metal organic compound.

67. The process of claim 1 wherein the step of furnishing said selected species comprises producing a metal vapor in said ion generation region.

* * * * *